United States Patent
Lee et al.

(10) Patent No.: US 12,021,027 B2
(45) Date of Patent: Jun. 25, 2024

(54) INTEGRATED CIRCUIT DEVICE HAVING PARALLEL CONDUCTIVE LINES WITH BULGING END PORTION(S) AND METHOD OF MANUFACTURING THE SAME

(71) Applicant: Samsung Electronics Co., Ltd., Suwon-si (KR)

(72) Inventors: Euibok Lee, Seoul (KR); Wandon Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 157 days.

(21) Appl. No.: 17/515,954

(22) Filed: Nov. 1, 2021

(65) Prior Publication Data

US 2022/0367336 A1    Nov. 17, 2022

(30) Foreign Application Priority Data

May 13, 2021   (KR) ........................ 10-2021-0062158

(51) Int. Cl.
*H01L 23/528*   (2006.01)
*H01L 21/311*   (2006.01)
*H01L 21/768*   (2006.01)

(52) U.S. Cl.
CPC ...... *H01L 23/528* (2013.01); *H01L 21/31144* (2013.01); *H01L 21/76802* (2013.01); *H01L 21/76877* (2013.01)

(58) Field of Classification Search
CPC ......... H01L 21/31144; H01L 21/76802; H01L 21/76877; H01L 23/5283; H01L 21/76816; H01L 21/0337; H01L 21/76838; H01L 27/0207; H01L 27/0611; H01L 21/768

See application file for complete search history.

(56) References Cited

U.S. PATENT DOCUMENTS

| | | | |
|---|---|---|---|
| 9,368,349 B2 | 6/2016 | Huang et al. | |
| 9,581,900 B2 | 2/2017 | Shieh et al. | |
| 10,109,486 B2 | 10/2018 | Huang et al. | |
| 10,366,917 B2 | 7/2019 | Zhu et al. | |
| 10,529,569 B2 | 1/2020 | Burns et al. | |
| 10,784,119 B2 | 9/2020 | Srivastava et al. | |
| 10,872,777 B2 | 12/2020 | Pan et al. | |
| 10,923,402 B2 | 2/2021 | Seo et al. | |
| 2020/0218146 A1 | 7/2020 | An et al. | |
| 2021/0082746 A1* | 3/2021 | Arnold | H01L 21/76897 |

* cited by examiner

*Primary Examiner* — Benjamin P Sandvik
*Assistant Examiner* — John Patrick Cornely
(74) *Attorney, Agent, or Firm* — Harness, Dickey & Pierce, P.L.C.

(57) ABSTRACT

An integrated circuit (IC) device includes a first conductive line in a closed curve defining a local area on a substrate. The first conductive line has a first end portion and a second end portion. A second conductive line is outside the local area. The second conductive line has a linear line portion along the closed curve and a bulging end portion along the closed curve. The bulging end portion protrudes from the linear line portion toward the first end portion of the first conductive line in the second lateral direction and protrudes further than the first end portion to the outside of the local area. A method of manufacturing an IC device includes forming a first reference pattern having a mandrel hole. A reference spacer is formed inside the mandrel hole. A second reference pattern is formed. The second reference pattern has a shift hole.

19 Claims, 67 Drawing Sheets

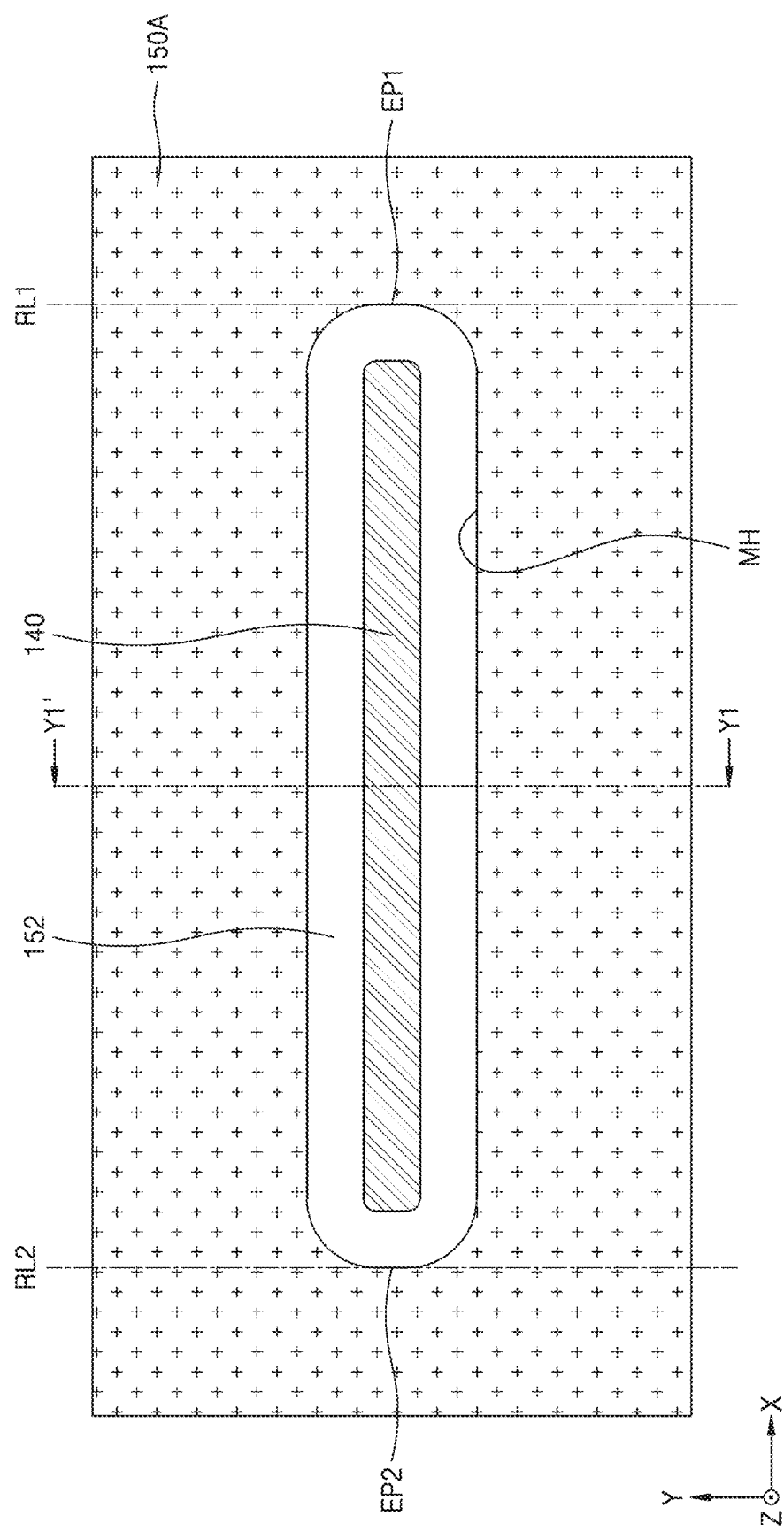

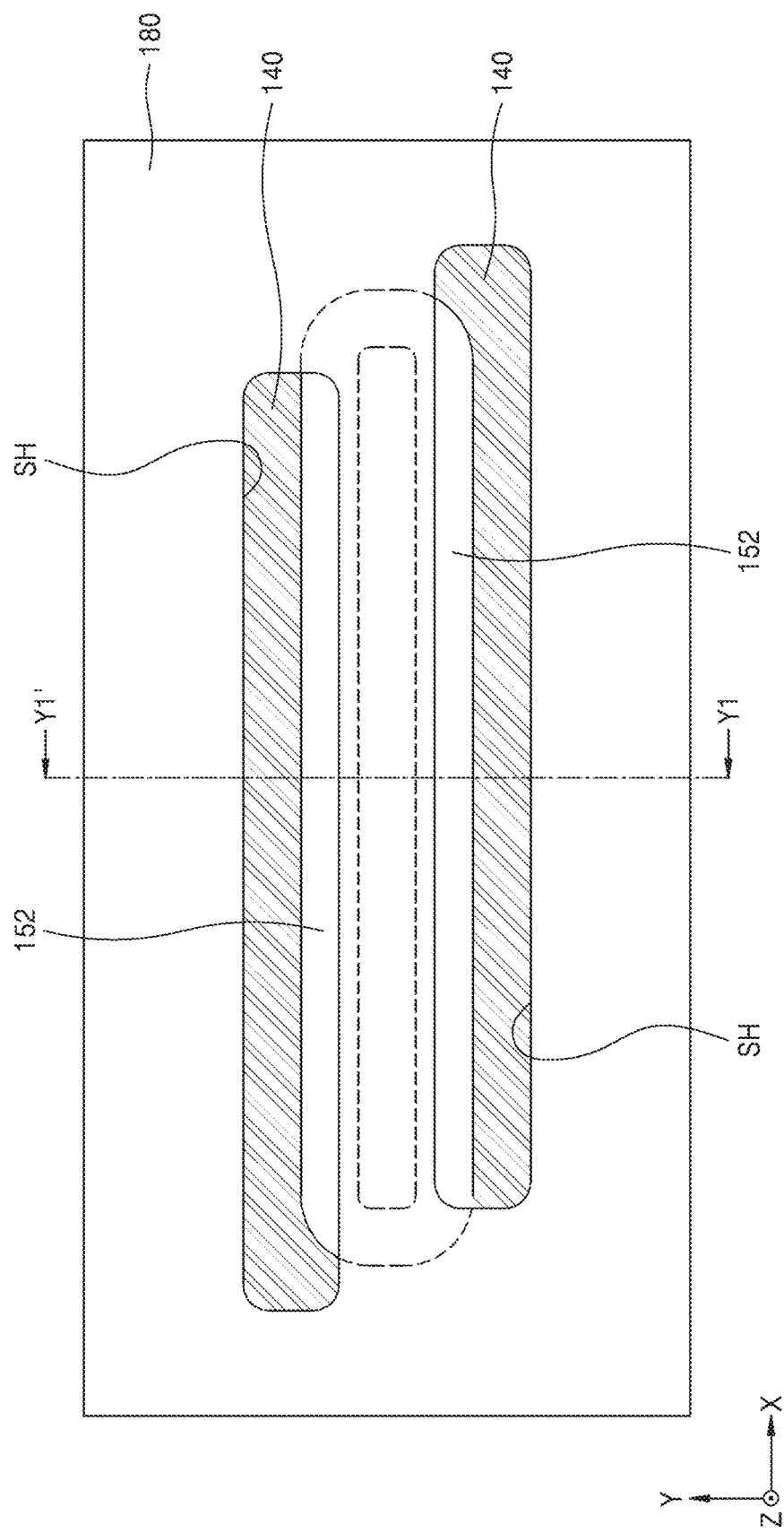

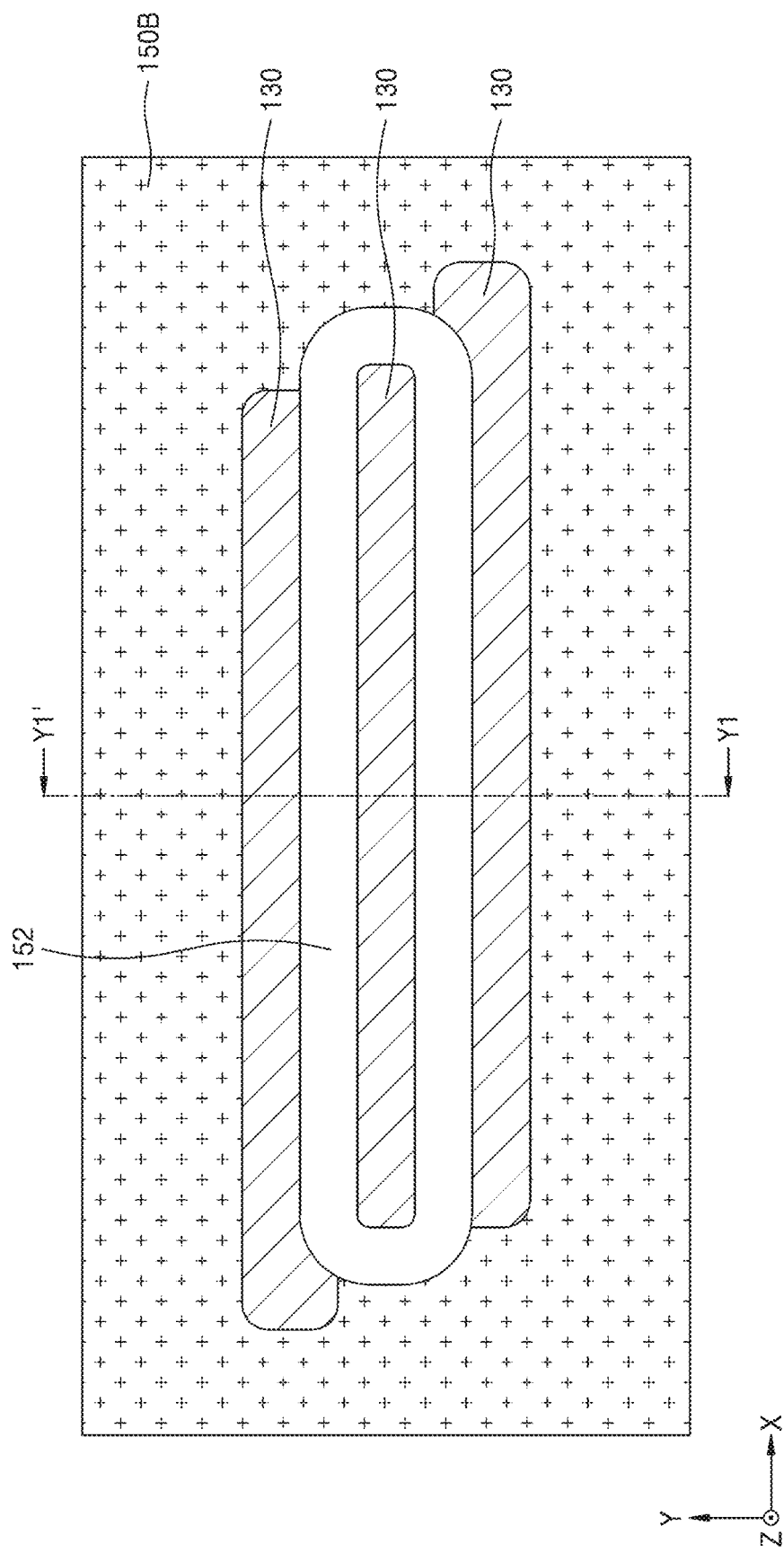

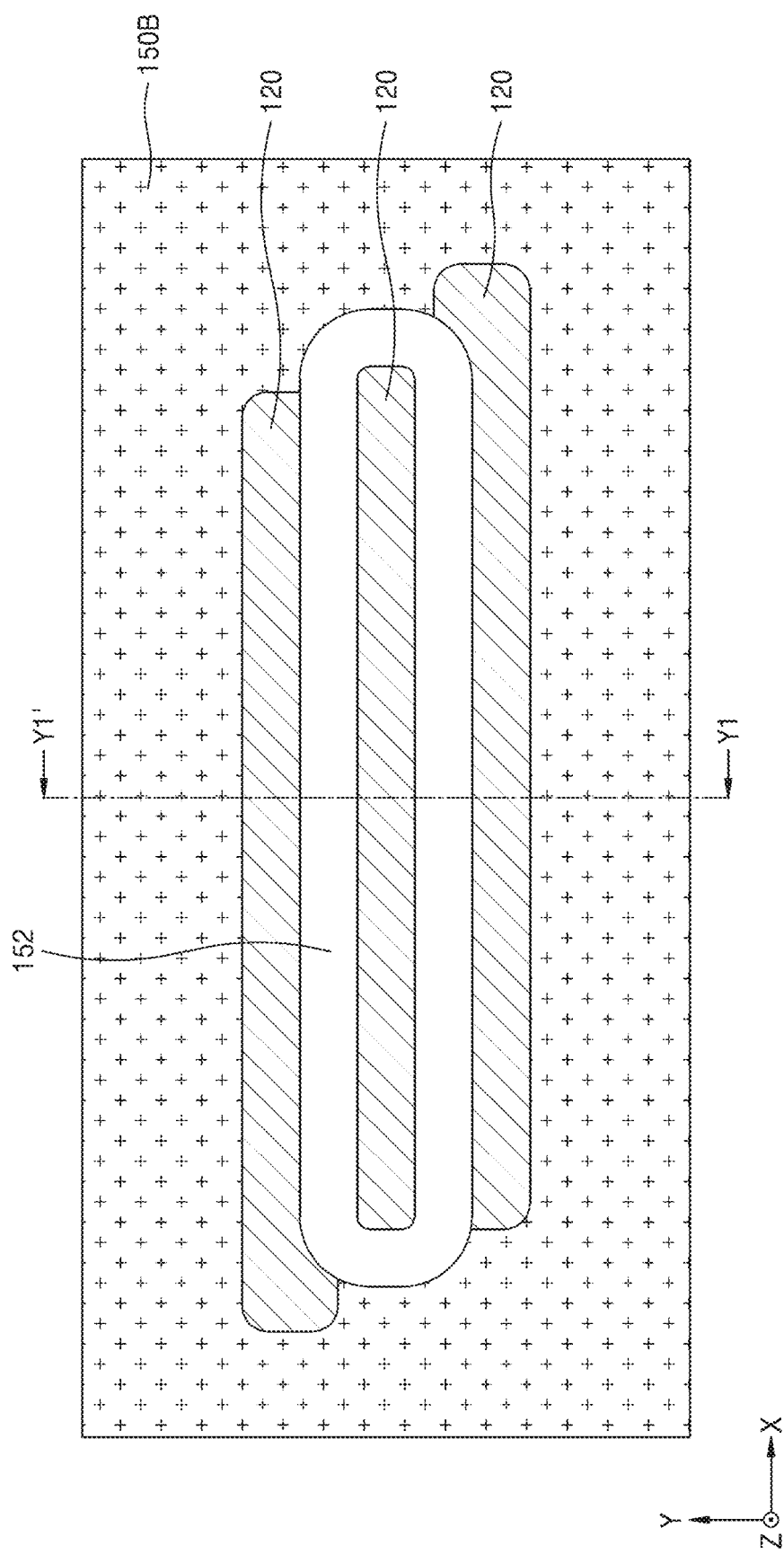

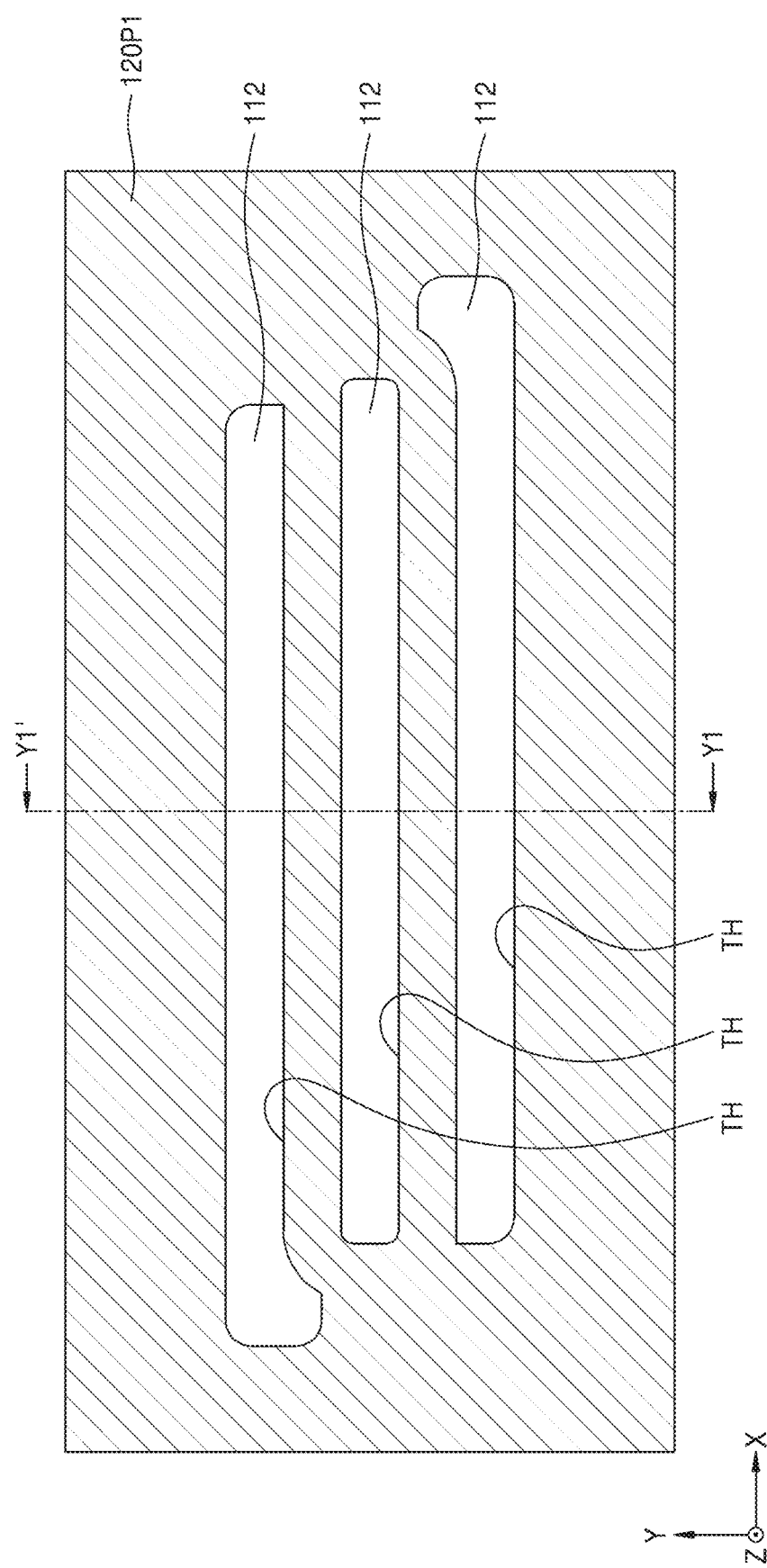

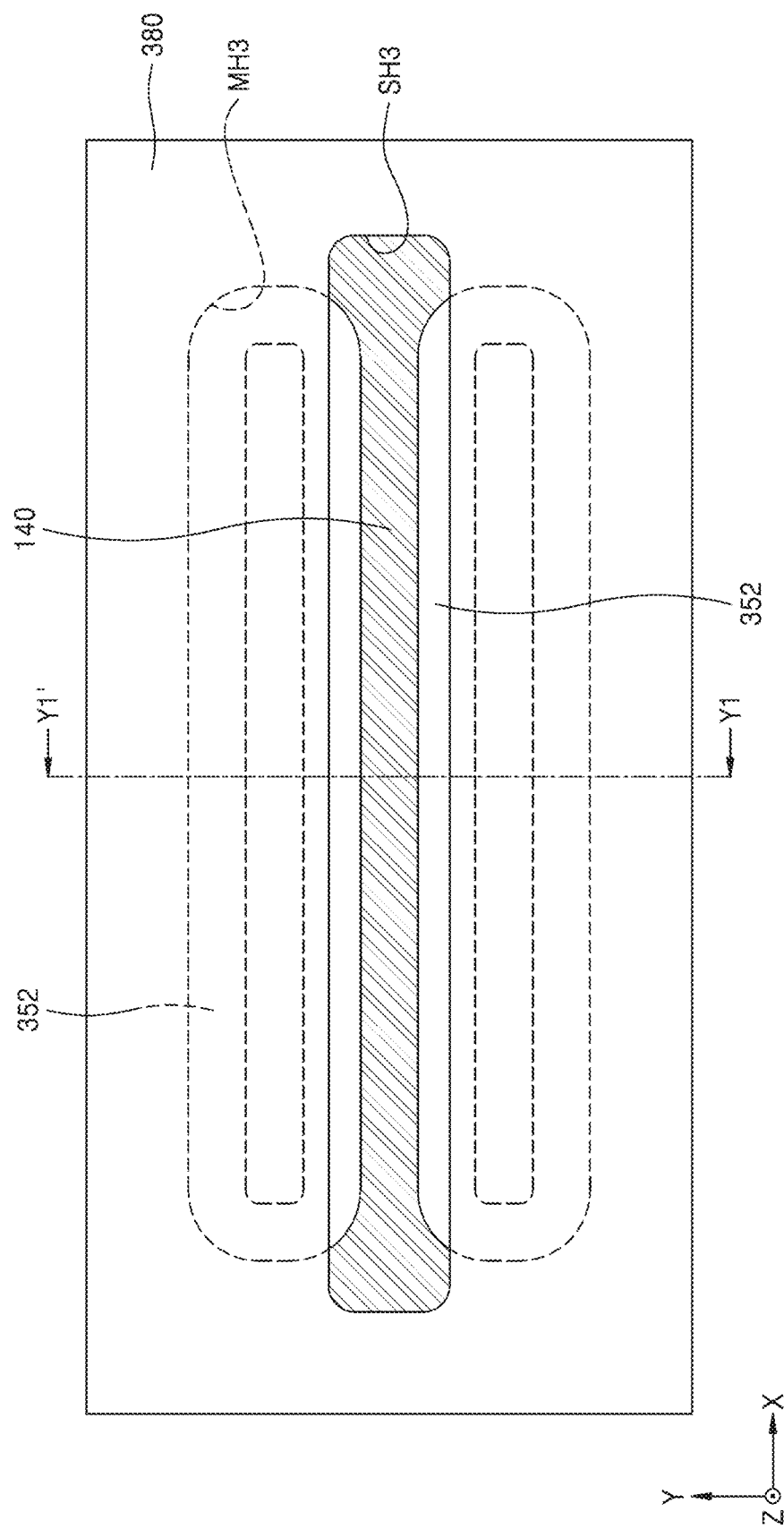

INTEGRATED CIRCUIT DEVICE HAVING PARALLEL CONDUCTIVE LINES WITH BULGING END PORTION(S) AND METHOD OF MANUFACTURING THE SAME

CROSS-REFERENCE TO RELATED APPLICATION

This application is based on and claims priority under 35 U.S.C. § 119 to Korean Patent Application No. 10-2021-0062158, filed on May 13, 2021, in the Korean Intellectual Property Office, the disclosure of which is incorporated by reference herein in its entirety.

BACKGROUND

Inventive concepts relate to an integrated circuit (IC) device and/or a method of manufacturing the same, and more particularly, an IC device including a plurality of conductive lines parallel to each other and/or a method of manufacturing the same.

To manufacture/fabricate highly scaled and/or highly integrated semiconductor devices, it may be necessary or desirable to develop a technique of forming repeating fine conductive lines having a fine width at a fine pitch, to develop an IC device having conductive lines formed by applying the technique, and/or to develop a method of manufacturing/fabricating the IC device.

SUMMARY

Inventive concepts provide an integrated circuit (IC) device including conductive lines, which have a fine width and are arranged parallel to each other at a fine pitch.

Alternatively or additionally, inventive concepts also provides a method of manufacturing an IC device, by which conductive lines having a fine width may be formed parallel to each other at a fine pitch.

According to some example embodiments of inventive concepts, there is provided an IC device including a first conductive line in a local area on a substrate. The first conductive line extends along a first lateral direction in a position apart from a closed curve by an insulation distance, the closed curve defining the local area. The first conductive line includes a first end portion and a second end portion, which are opposite to each other in the first lateral direction. A second conductive line extends parallel to the first conductive line along the first lateral direction outside the local area. The second conductive line faces the first conductive line with the insulation distance between the first conductive line and the second conductive line in a second lateral direction that is perpendicular to the first lateral direction. The second conductive line includes a linear line portion and a bulging end portion. The linear line portion has a first sidewall extending in a straight line along the closed curve. The bulging end portion has a second sidewall extending in a curve along the closed curve. The bulging end portion protrudes from the linear line portion toward the first end portion of the first conductive line in the second lateral direction. The bulging end portion of the second conductive line protrudes further than the first end portion of the first conductive line to the outside of the local area in the first lateral direction.

According to some example embodiments of inventive concepts, there is provided an IC device including a first conductive line in a first local area on a substrate. The first conductive line is apart by a first insulation distance from a first closed curve defining the first local area. The first conductive line extends in a first lateral direction. A second conductive line is in a second local area apart from the first local area on the substrate. The second conductive line is apart by a second insulation distance from a second closed curve defining the second local area. The second conductive line extends long in the first lateral direction. A third conductive line is between the first conductive line and the second conductive line. The third conductive line includes a linear line portion and a bulging end portion. The linear line portion includes a first sidewall extending in a straight line along the first closed curve and a second sidewall extending in a straight line along the second closed curve. The bulging end portion has a third sidewall extending in a curve along at least one of the first closed curve and the second closed curve from the linear line portion. The bulging end portion protrudes from the linear line portion toward an end portion of at least one of the first conductive line and the second conductive line in a second lateral direction. The second lateral direction is perpendicular to the first lateral direction. In the first lateral direction, the bulging end portion of the third conductive line protrudes further than the first conductive line and the second conductive line to the outside of each of the first local area and the second local area.

According to some example embodiments of inventive concepts, there is provided an IC device including a first conductive line on a substrate and in a local area. The first conductive line extends along a first lateral direction in a position apart by an insulation distance from a closed curve defining the local area. A second conductive line extends parallel to the first conductive line along the first lateral direction outside the local area. The second conductive line faces the first conductive line with the insulation distance therebetween in a second lateral direction that is perpendicular to the first lateral direction. The second conductive line includes a linear line portion, a first bulging end portion, and a second bulging end portion. The linear line portion has a first sidewall extending in a straight line along the closed curve. The first bulging end portion and the second bulging end portion protrude in opposite directions to each other from the linear line portion in the first lateral direction. At least one of the first bulging end portion and the second bulging end portion has a second sidewall extending in a curve along the closed curve, protrudes from the linear line portion toward an end portion of the first conductive line in the second lateral direction, and protrudes further than the end portion of the first conductive line to the outside of the local area in the first lateral direction.

According to some example embodiments of inventive concepts, there is provided a method of manufacturing an IC device. The method includes forming a target layer on a substrate. A reference layer is formed on the target layer. The reference layer is patterned to form a first reference pattern. The first reference pattern extends in a first lateral direction. The first reference pattern includes a mandrel hole having a first end portion with an end is at a first point on a straight line that follows the first lateral direction. A reference spacer is formed inside the mandrel hole. The reference spacer has an inner sidewall in contact with a sidewall of the first reference pattern. One moving point is selected from a first moving point, a second moving point, and a third moving point. The first moving point is forward in the first lateral direction from a reference line extending in a second lateral direction through the first point. The second lateral direction is perpendicular to the first lateral direction. The second moving point passes through the reference line, and the third moving point is backward in the first lateral direction from the reference line. The first reference pattern is patterned to form a second reference pattern. The second reference pattern extends parallel to the mandrel hole in the first lateral direction. The second reference pattern has a second end portion extending to the selected moving point and has a shift hole exposing the inner sidewall of the reference spacer.

According to some example embodiments of inventive concepts, there is provided a method of manufacturing an IC device. The method includes forming a target layer on a substrate. A reference layer is formed on the target layer. The reference layer is patterned to form a first reference pattern. The first reference pattern extends long in a first lateral direction. The first reference pattern defines a mandrel hole having a first end portion with an end at a first point on a straight line that follows the first lateral direction. A reference spacer is formed inside the mandrel hole. The reference spacer has an inner sidewall in contact with a sidewall of the first reference pattern. One moving point is selected from a first moving point and a second moving point. The first moving point is forward in the first lateral direction from a reference line extending in a second lateral direction through the first point. The second lateral direction is perpendicular to the first lateral direction. The second moving point passes through the reference line. The first reference pattern is patterned to form a second reference pattern. The second reference pattern extends parallel to the mandrel hole in the first lateral direction. The second reference pattern has a second end portion extending to the selected moving point and has a shift hole exposing the inner sidewall of the reference spacer. By etching the target layer using the reference spacer and the second reference pattern as an etch mask, a target pattern having a plurality of target openings is formed. A plurality of conductive lines are formed to fill the plurality of target openings. The plurality of conductive lines extend parallel to each other in the first lateral direction. The plurality of conductive lines include a first conductive line and a second conductive line. The first conductive line has one end portion and the other end portion, which are opposite to each other in the first lateral direction. The second conductive line includes a linear line portion and a first bulging end portion. The linear line portion extends in a straight line in the first lateral direction. The first bulging end portion extends from the linear line portion in the first lateral direction and protrudes toward the one end portion of the first conductive line in the second lateral direction. The first bulging end portion protrudes further than the one end portion of the first conductive line in the first lateral direction.

According to some example embodiments of inventive concepts, there is provided a method of manufacturing an IC device. The method includes forming a target layer on a substrate. A reference layer is formed on the target layer. A first photoresist pattern having a first opening is formed on the reference layer. By etching the reference layer using the first photoresist pattern as an etch mask, a first reference pattern having a mandrel hole corresponding to the first opening is formed. A reference spacer is formed inside the mandrel hole. The reference spacer has an inner sidewall in contact with a sidewall of the first reference pattern. A second photoresist pattern is formed on the first reference pattern and the reference spacer. The second photoresist pattern has a second opening vertically overlapping a portion of each of the first reference pattern and the reference spacer. By etching a portion of the first reference pattern using the second photoresist pattern as an etch mask, a second reference pattern is formed from the first reference pattern. The second reference pattern has a shift hole exposing the inner sidewall of the reference spacer. By etching the target layer using the reference spacer and the second reference pattern as an etch mask, a target pattern having a plurality of target openings is formed. A plurality of conductive lines are formed inside the plurality of target openings. The plurality of conductive lines include a first conductive line extending long in a first lateral direction. A second conductive line extends parallel to the first conductive line in the first lateral direction. The second conductive line faces the first conductive line with an insulation distance therebetween in a second lateral direction. The second lateral direction is perpendicular to the first lateral direction. The second conductive line includes a linear line portion and a bulging end portion. The linear line portion extends in a straight line in the first lateral direction. The bulging end portion has a sidewall that extends in a curve and protrudes from the linear line portion toward one end portion of the first conductive line in the second lateral direction.

BRIEF DESCRIPTION OF THE DRAWINGS

Some example embodiments of inventive concepts will be more clearly understood from the following detailed description taken in conjunction with the accompanying drawings in which:

FIGS. 13A, 14A, 15A, 16A, 17A, 18A, 19A, 20A, 21A, and 22A are plan views of an IC device during a process of manufacturing the IC device, according to some example embodiments;

FIGS. 27A, 28A, 29A, 30A, 31A, and 32A are plan views an IC device during a process sequence of a method of manufacturing the IC device, according to some example embodiments;

Figure 34A:
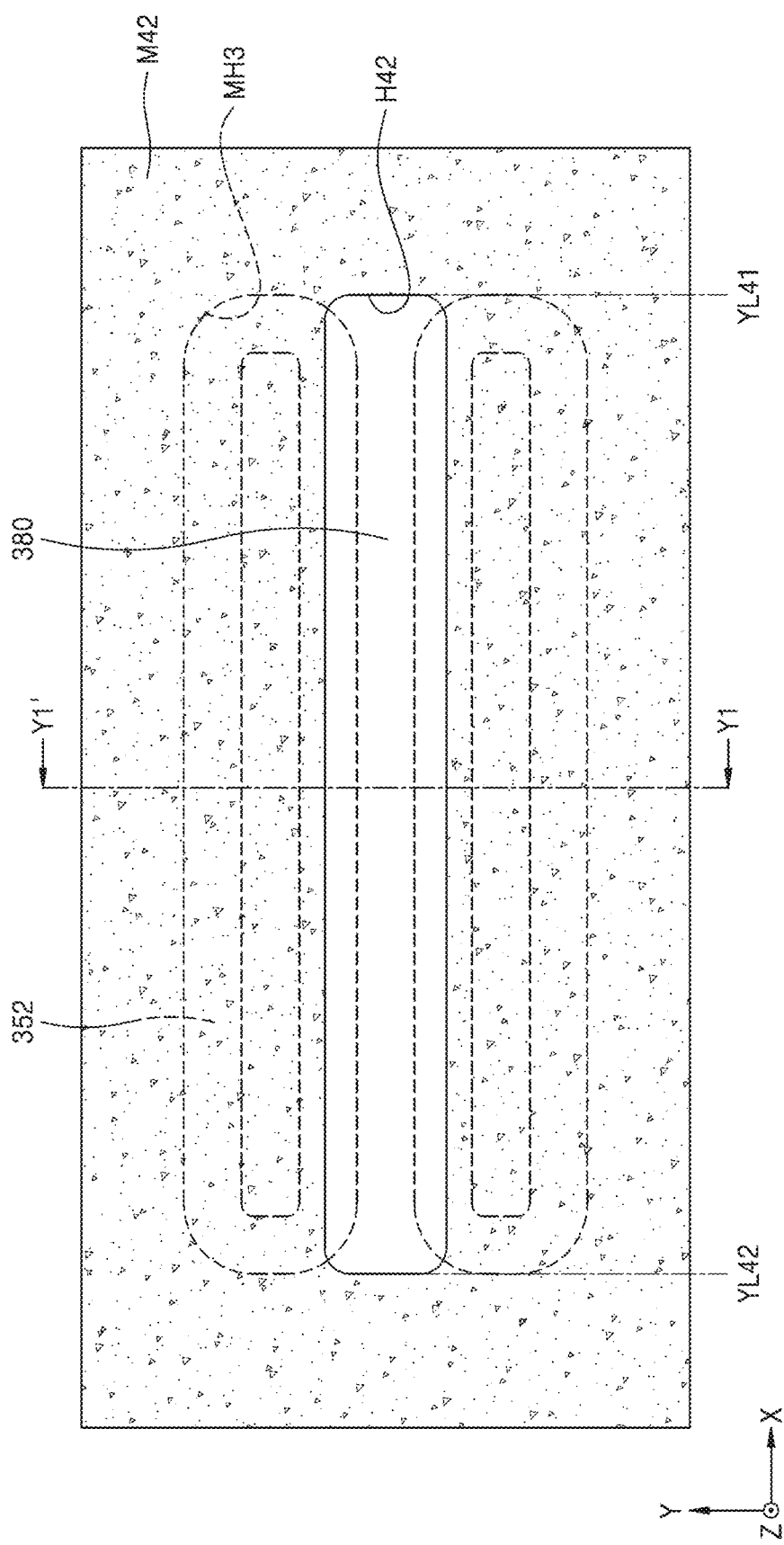
FIGS. 34A and 35A are plan views of an IC device during a process sequence of a method of manufacturing the IC device, according to some example embodiments; FIGS.
Figure 34B:
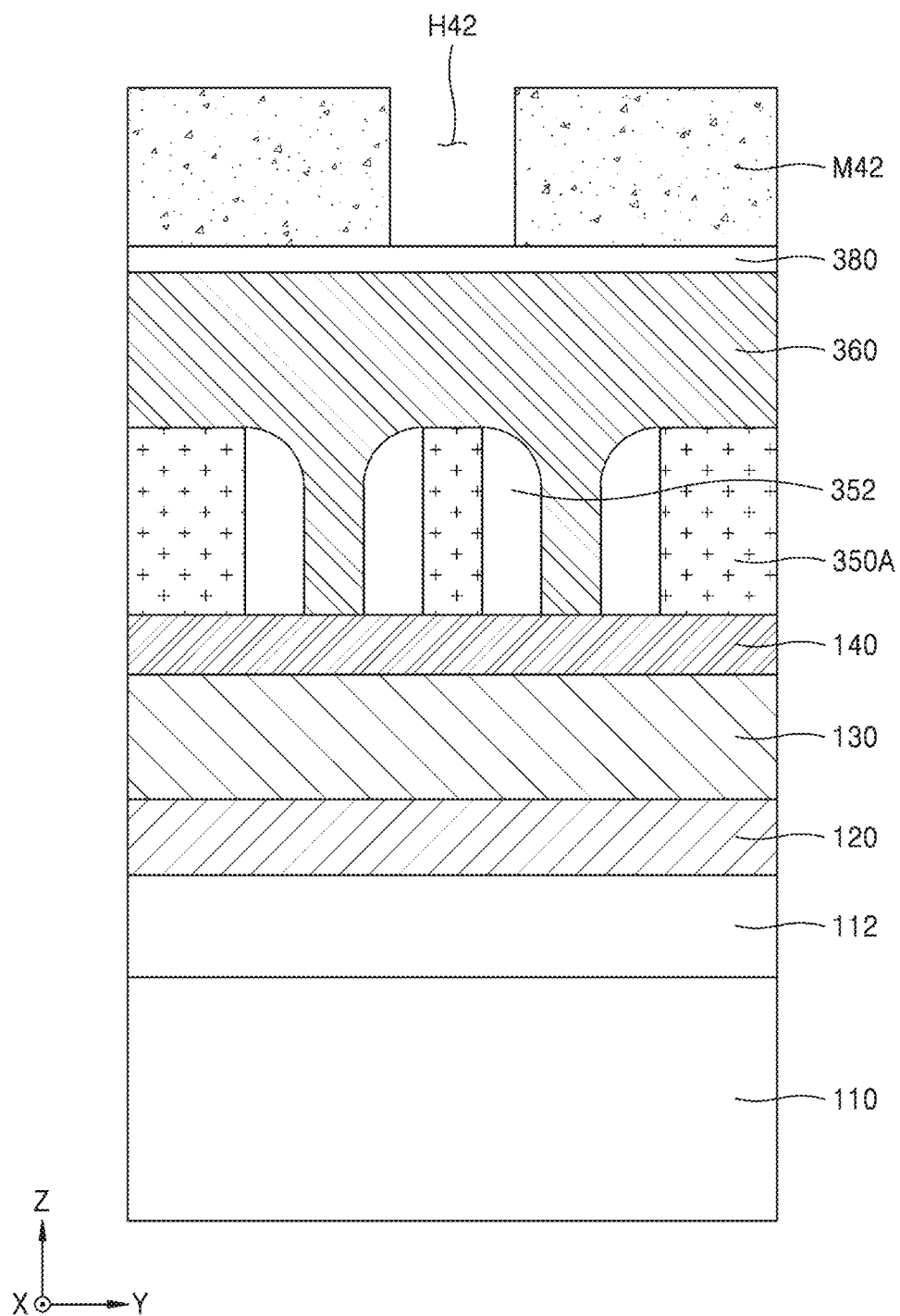
Figure 35A:
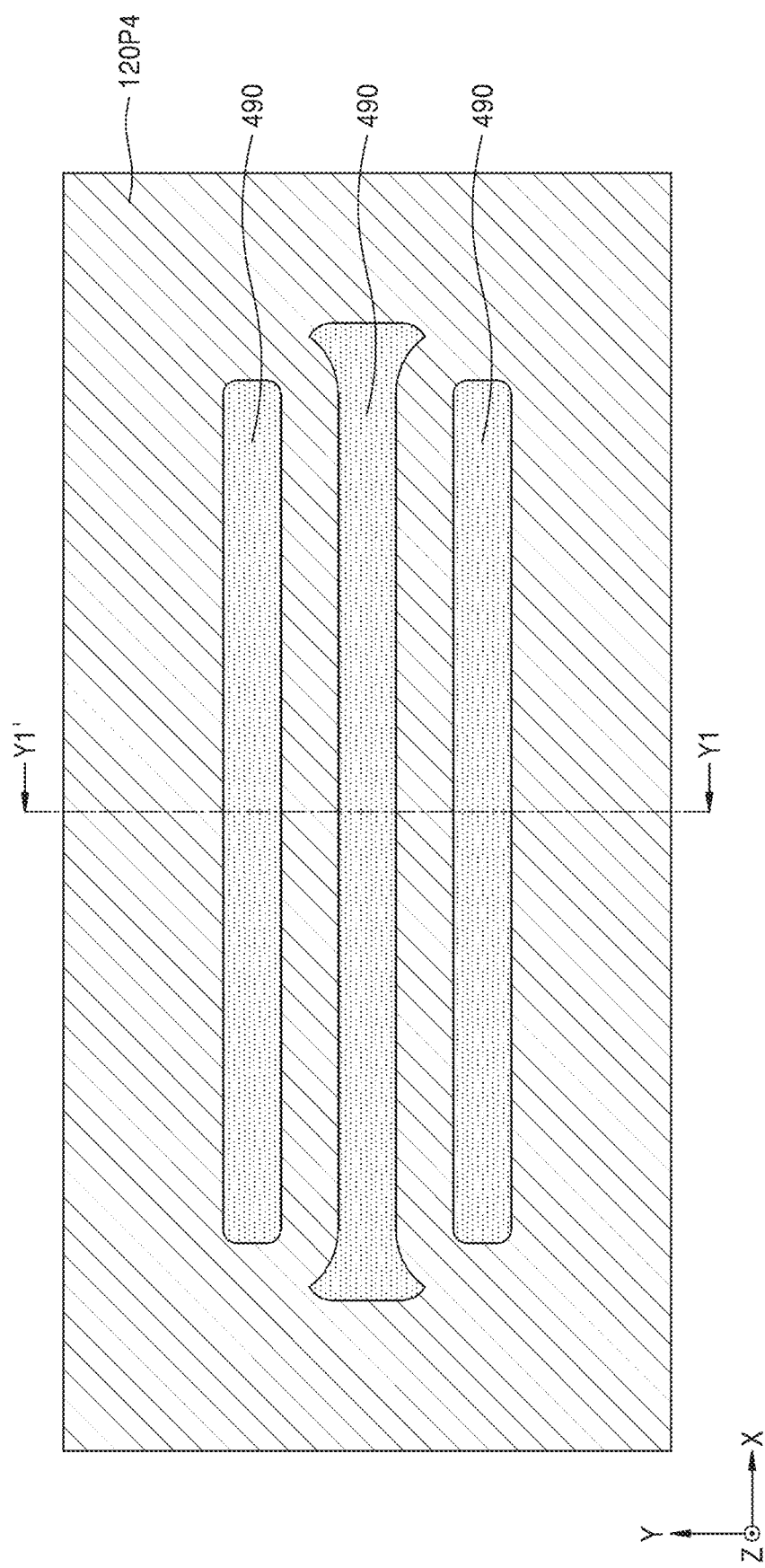
Figure 35B:
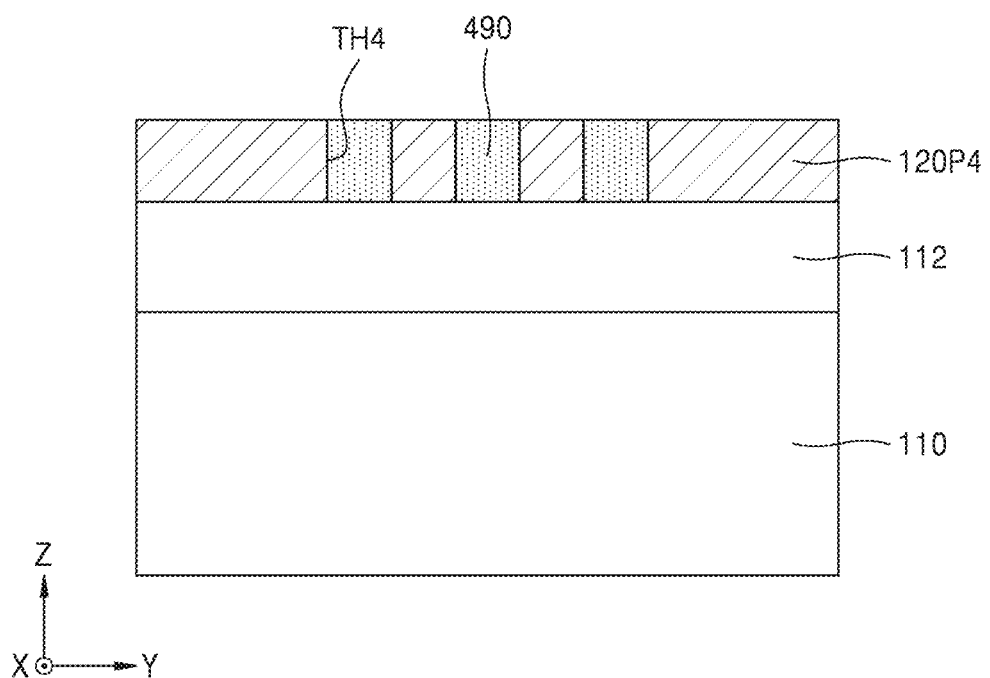
Figure 36:
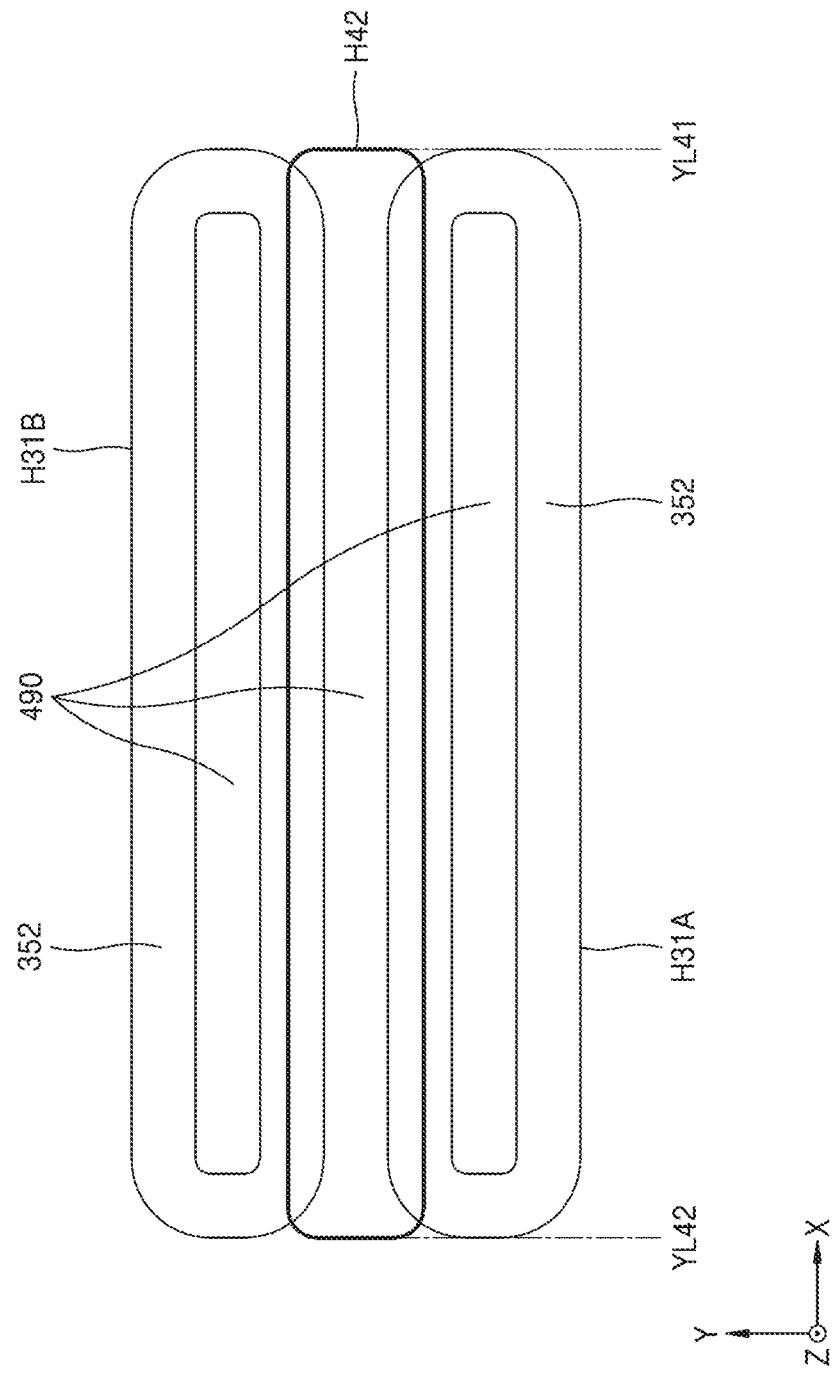
Figure 37A:
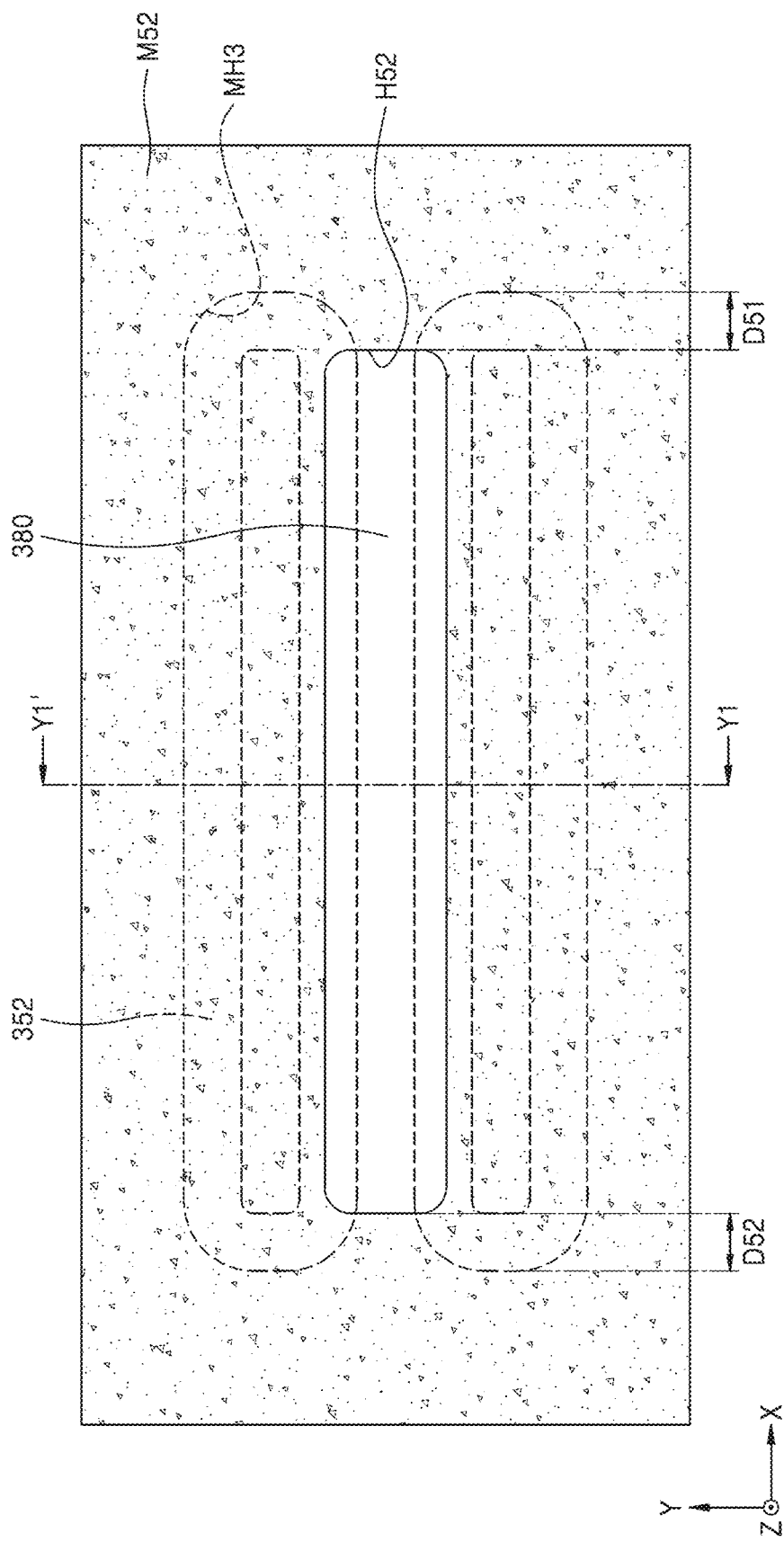
Figure 37B:
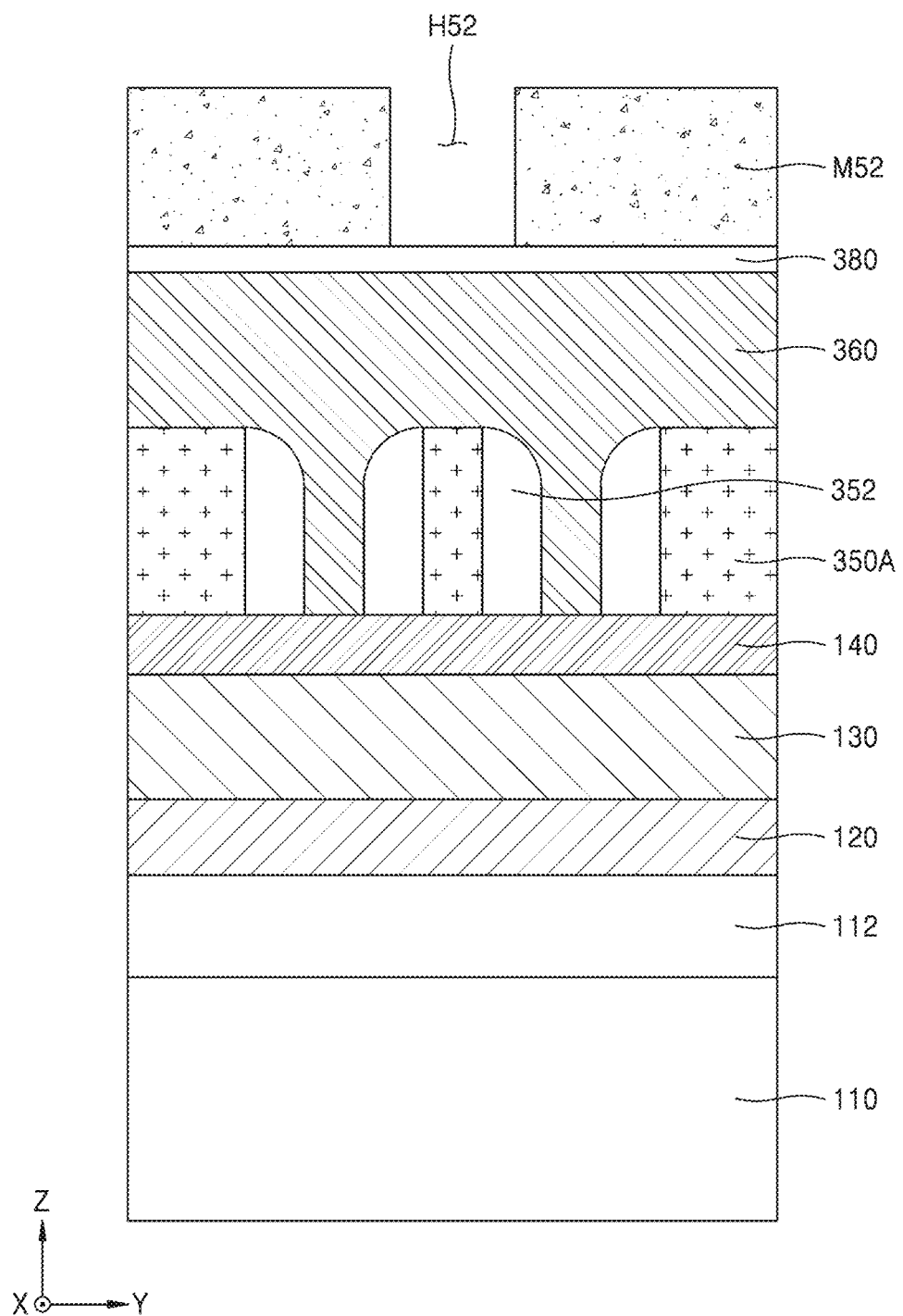
Figure 38A:
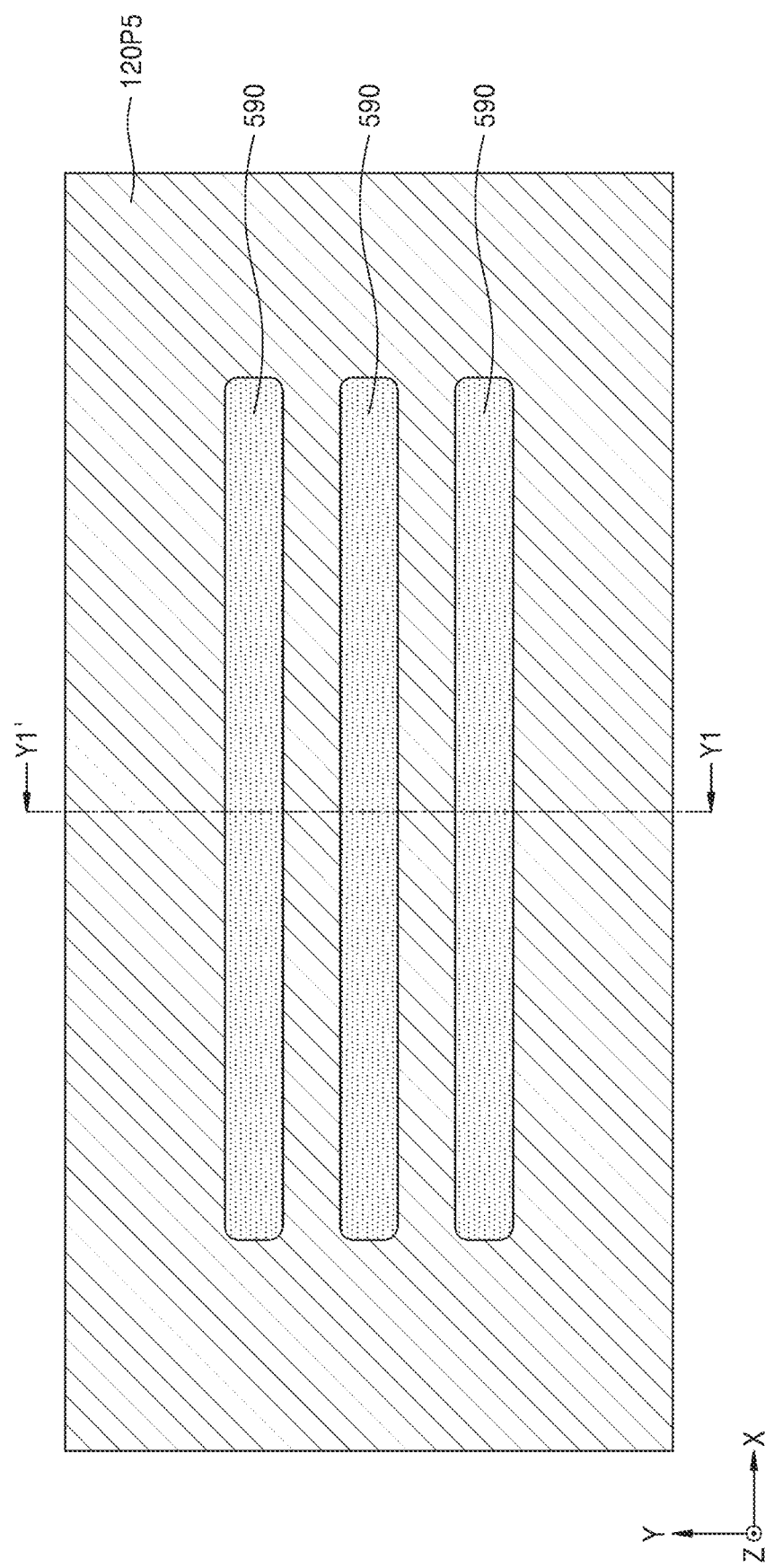
Figure 38B:
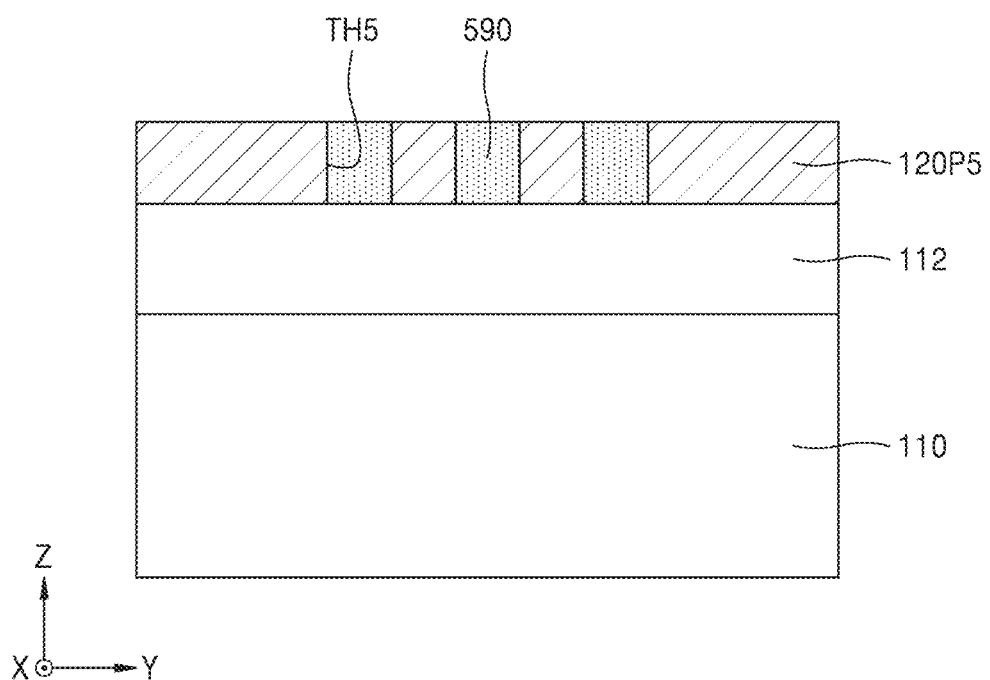
Figure 39:
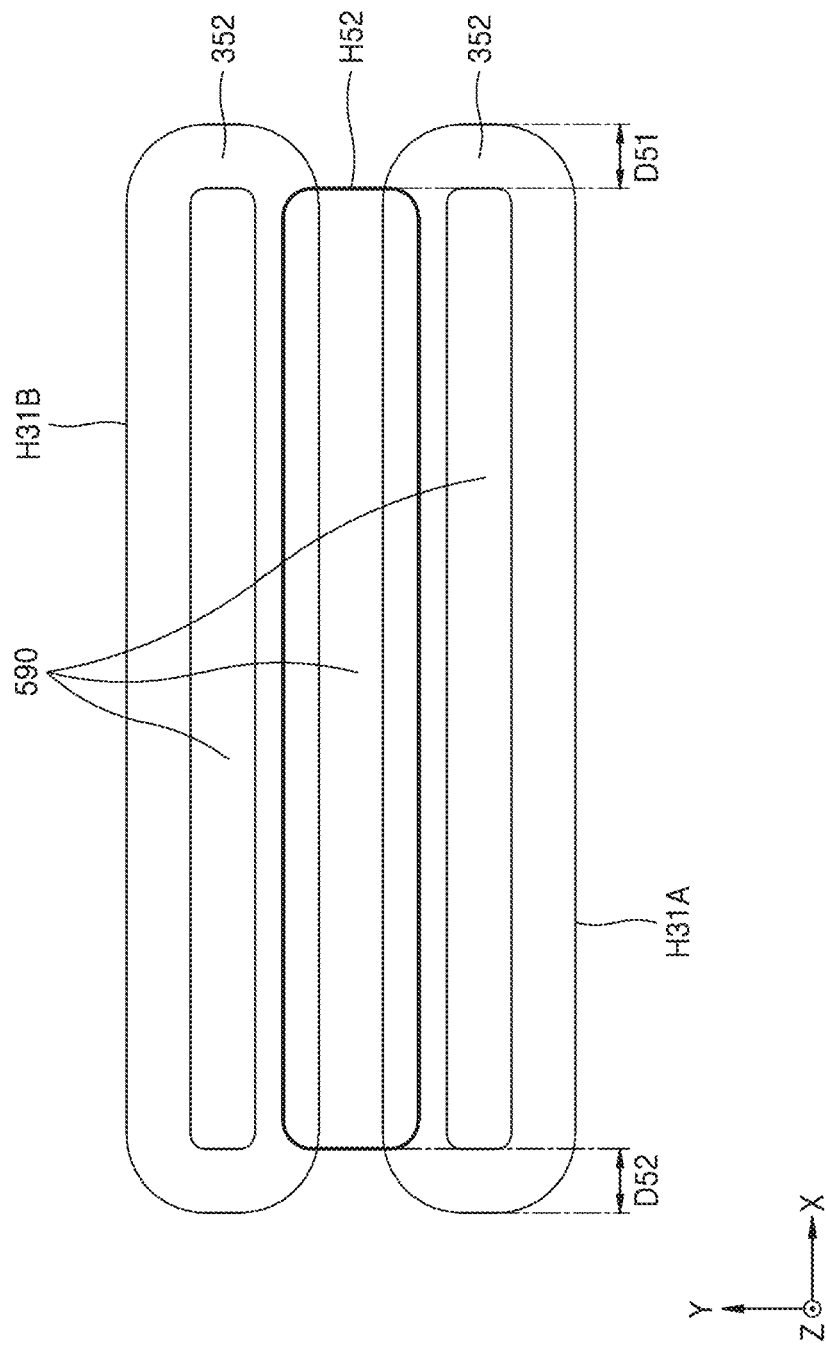
Figure 40A:
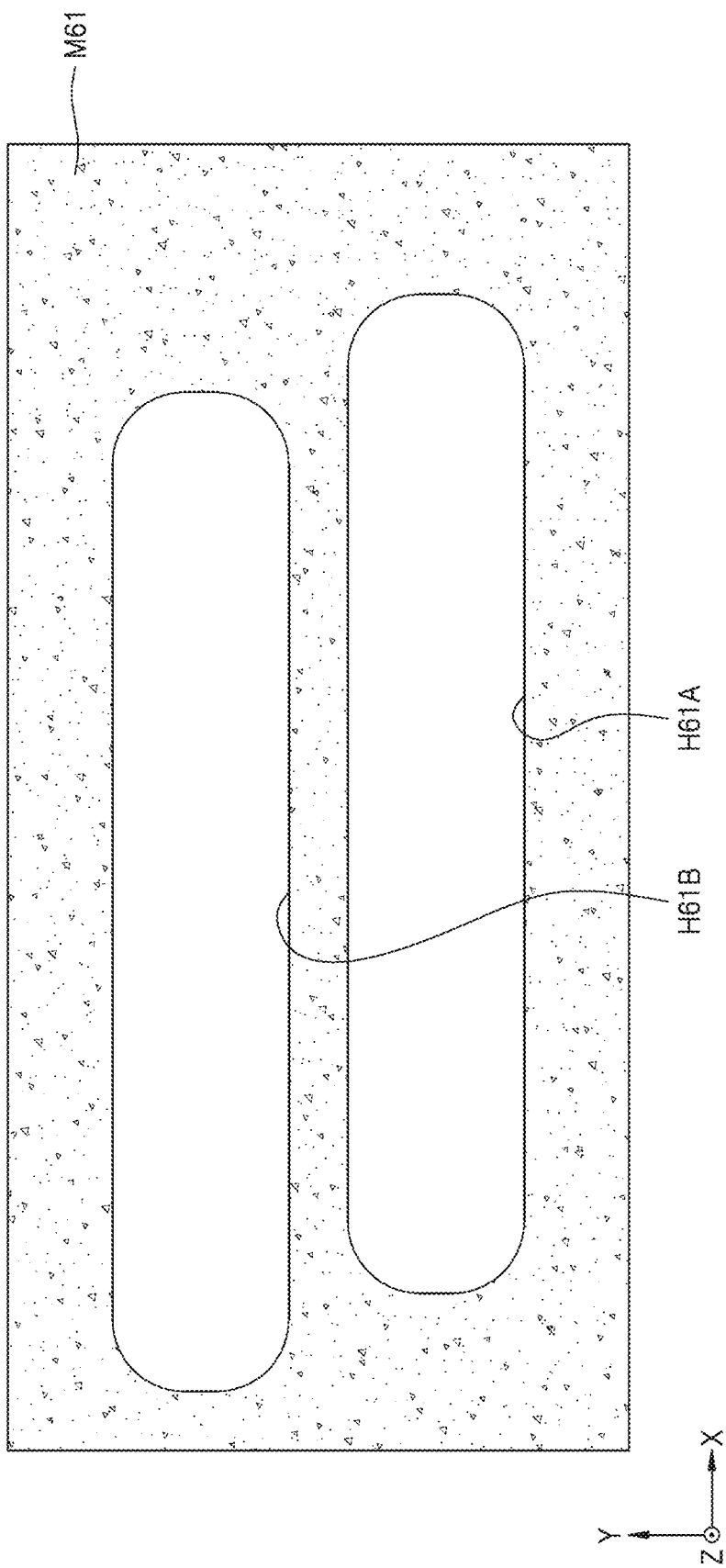
Figure 40B:
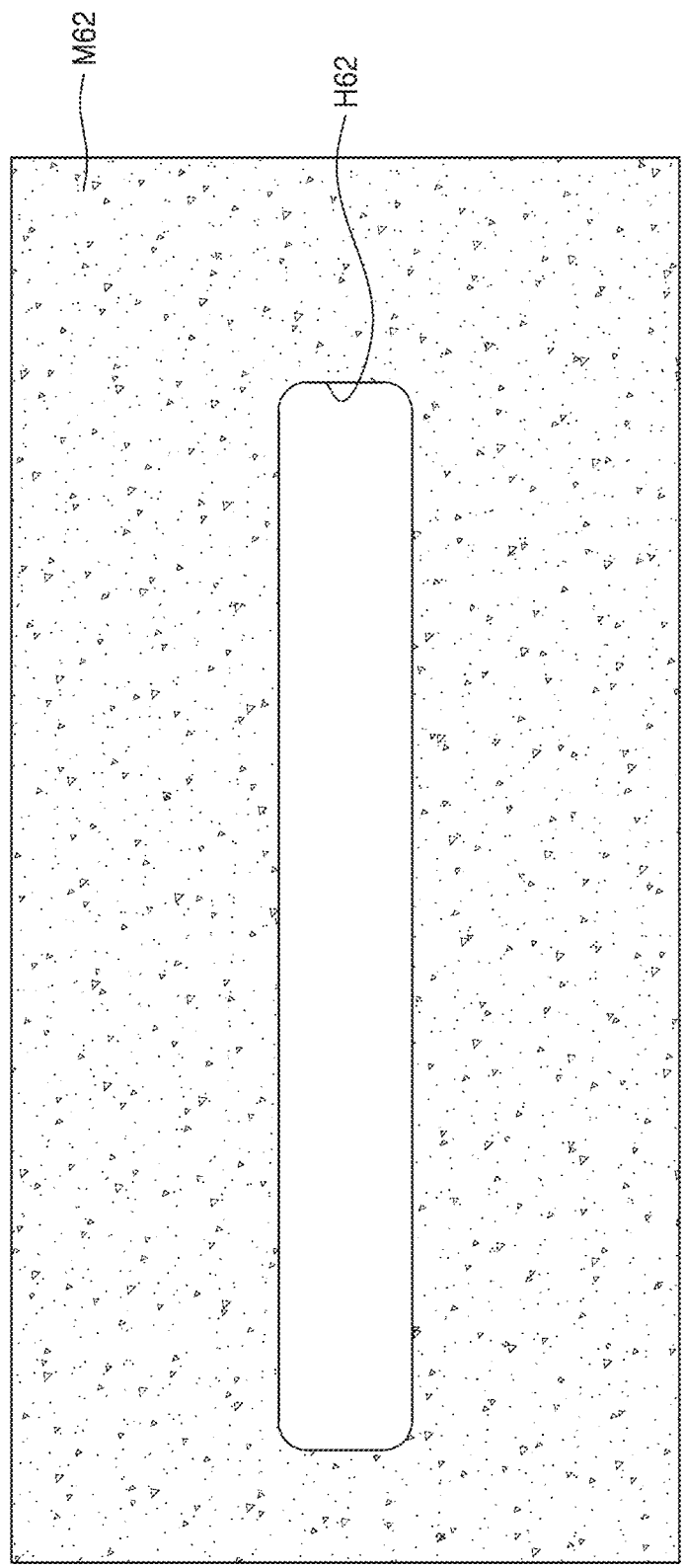
Figure 40C:
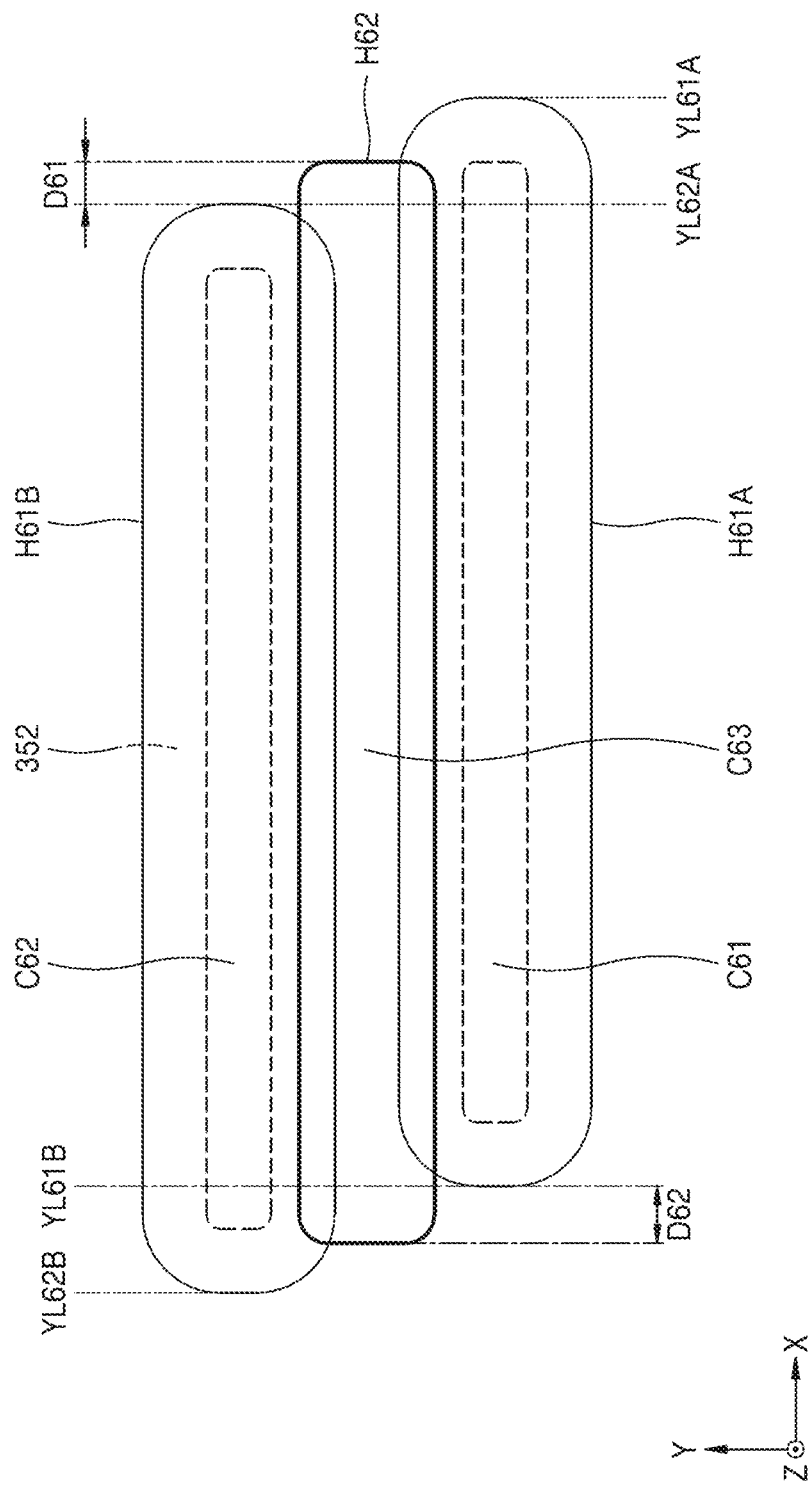
Figure 41:
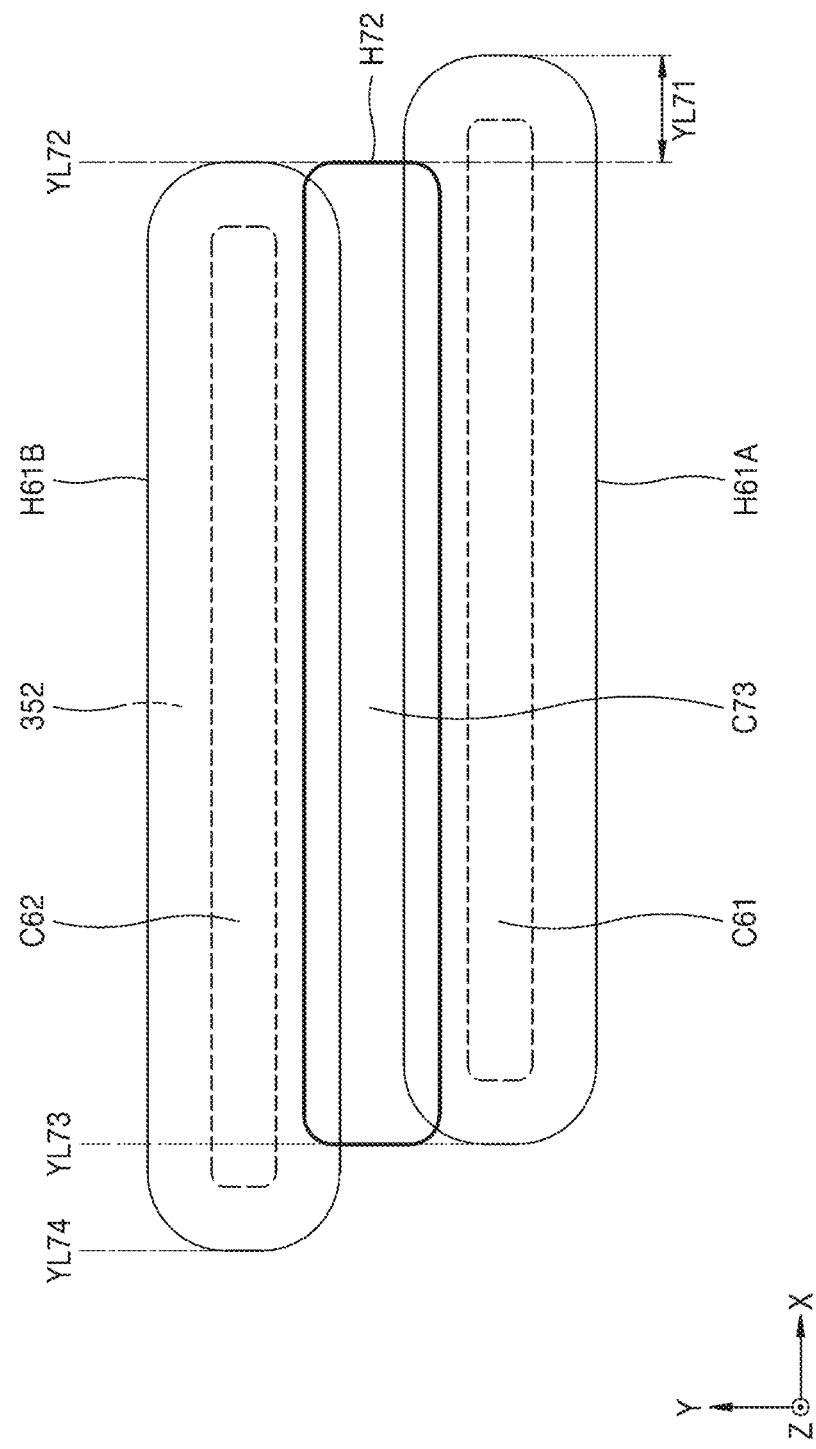
Figure 42:
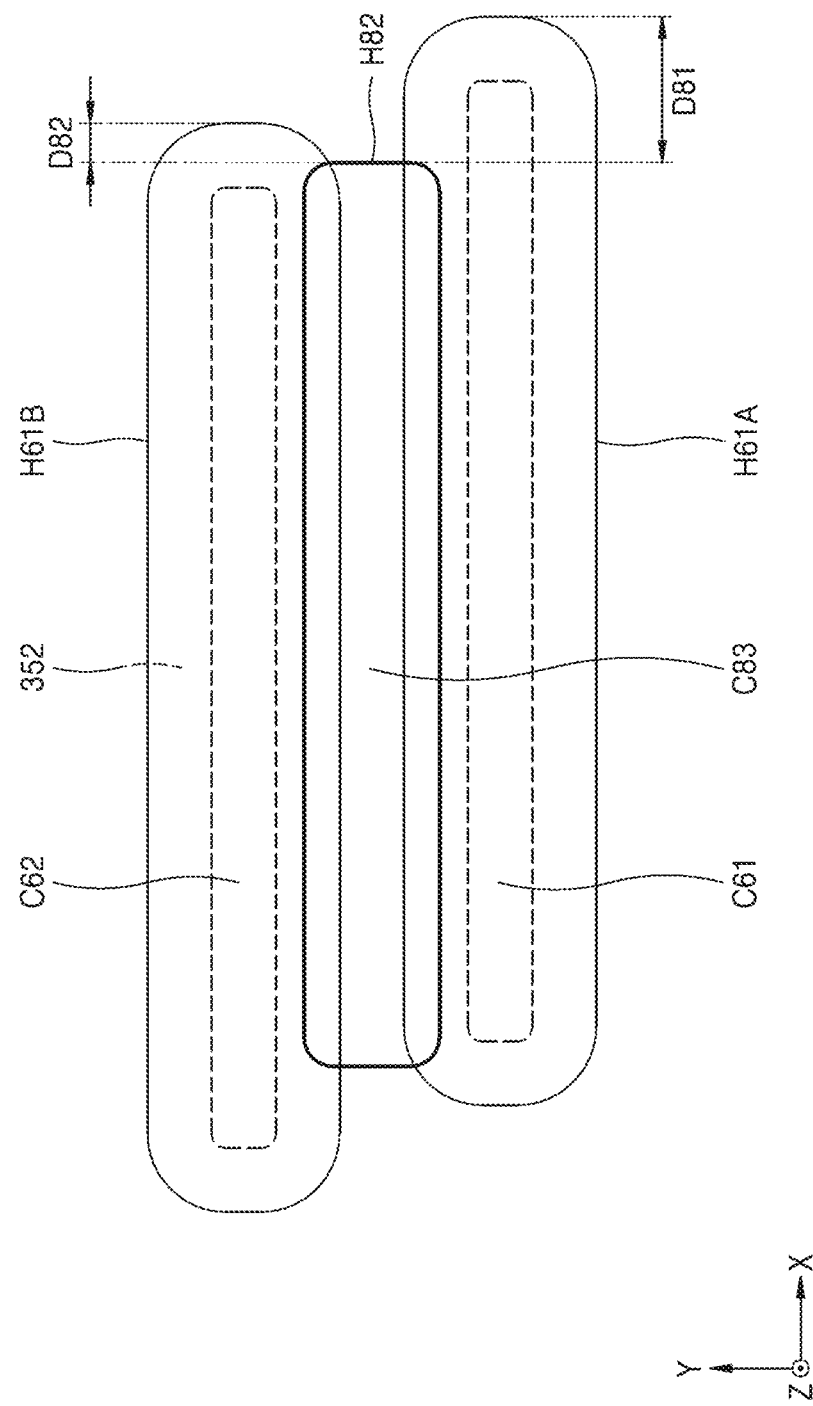
Figure 43:
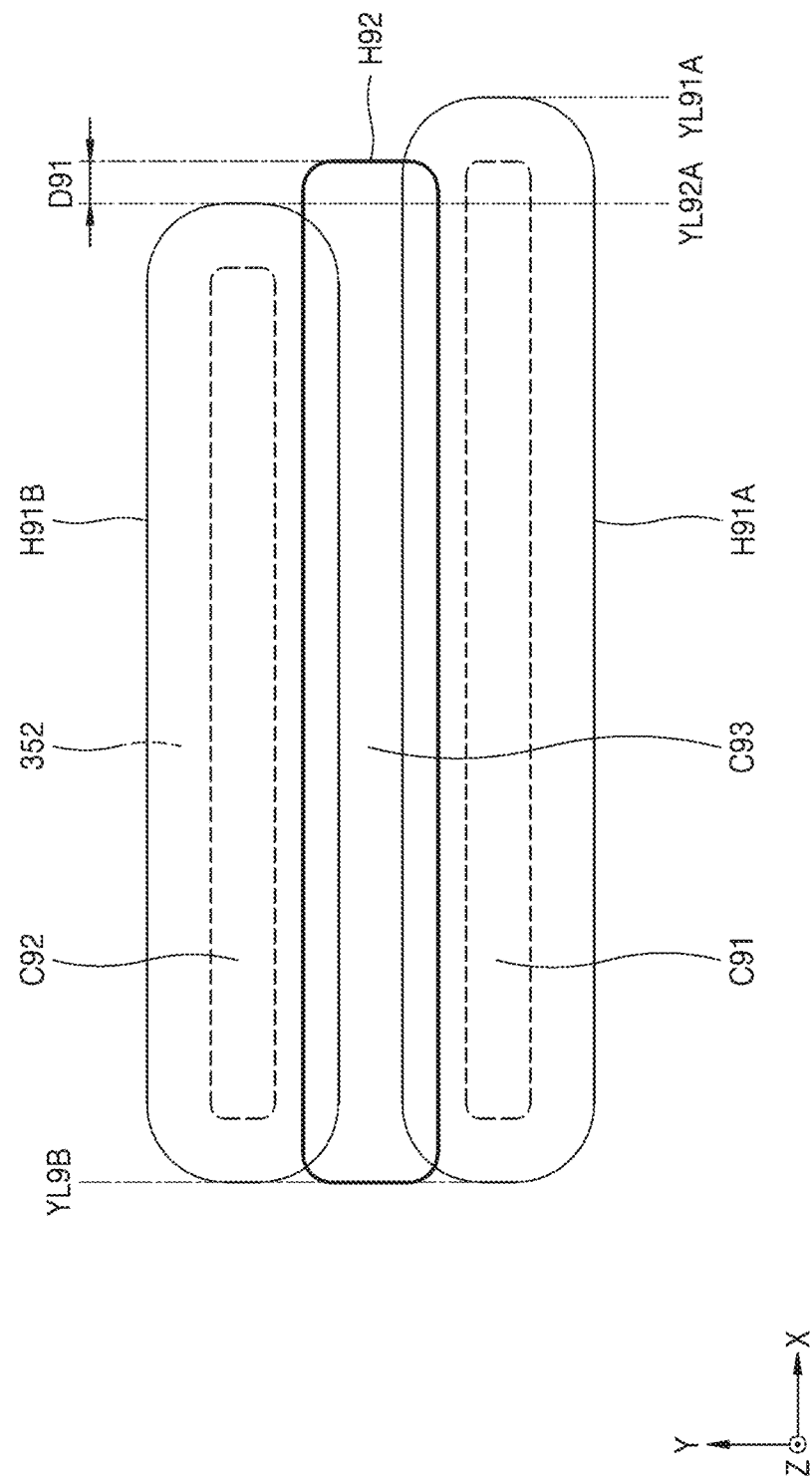

34B and 35B are cross-sectional views taken along lines Y1-Y1' of FIGS. 34A and 35A, respectively;

FIG. 36 is a detailed diagram of respective positions of a plurality of conductive lines obtained using the method of manufacturing the IC device, which has been described with reference to FIGS. 34A to 35B;

FIGS. 37A and 38A are plan views of an IC device during a process sequence of a method of manufacturing the IC device, according to some example embodiments; FIGS. 37B and 38B are cross-sectional views taken along lines Y1-Y1' of FIGS. 37A and 38A, respectively;

FIG. 39 is a detailed diagram of respective positions of a plurality of conductive lines obtained using the method of manufacturing the IC device, which has been described with reference to FIGS. 37A to 38B;

FIGS. 40A and 40B are plan views of a method of manufacturing an IC device, according to some example embodiments; FIG. 40C is a detailed diagram of respective positions of a plurality of conductive lines obtained using the method of manufacturing the IC device, which has been described with reference to FIGS. 40A and 40B; and FIGS. 41 to 43 are plan views of a method of manufacturing an IC device, according to some example embodiments.

DETAILED DESCRIPTION OF SOME EXAMPLE EMBODIMENTS

Hereinafter, some example embodiments will be described in detail with reference to the accompanying drawings. The same reference numerals are used to denote the same elements in the drawings, and repeated descriptions thereof will be omitted.

Figure 1:
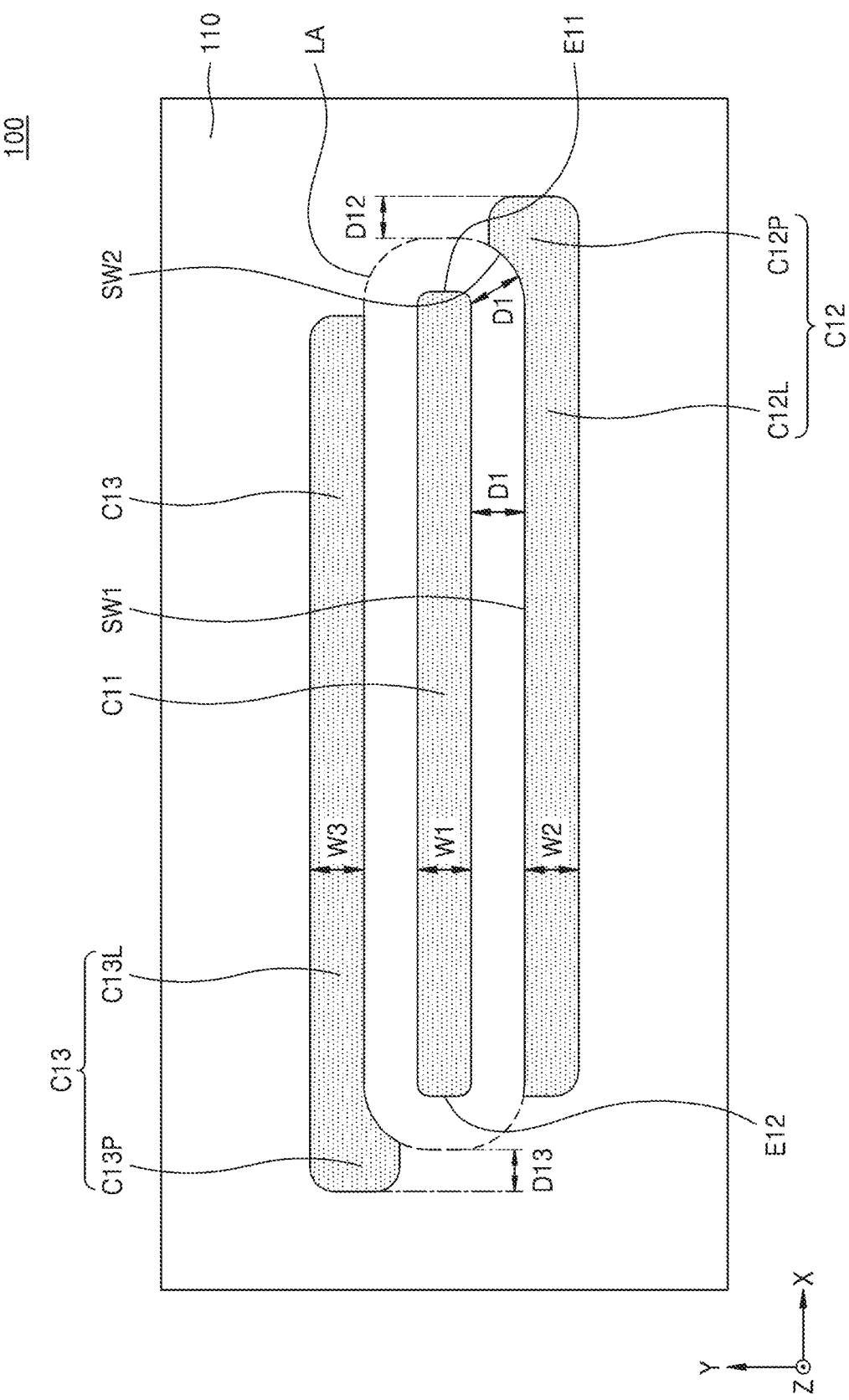
FIGS. 1 to 9 are plan views of an integrated circuit (IC) device, according to some example embodiments.

FIG. 1 is a plan view of an IC device 100 according to some example embodiments.

Referring to FIG. 1, the IC device 100 may include a plurality of conductive lines (e.g., first to third conductive lines C11, C12, and C13) arranged parallel to each other on a substrate 110. Each of the first to third conductive lines C11, C12, and C13 may extend long in a first lateral direction (e.g. an X direction).

The second and third conductive lines C12 and C13 may be on both sides of the first conductive line C11 and each an insulation distance D1 apart from the first conductive line C11 in a second lateral direction (e.g. a Y direction). Here, the second lateral direction (Y direction) may be perpendicular to the first lateral direction (X direction); however, example embodiments are not necessarily limited thereto.

The first conductive line C11 may extend long in a local area LA in the first lateral direction (X direction) and be apart by the insulation distance D1 from a closed curve defining the local area LA. In some example embodiments, the local area LA may have an elliptical planar shape and/or a racetrack shape. The first conductive line C11 may continuously extend without interruption in or inside the local area LA. The first conductive line C11 may have a first end portion E11 and a second end portion E12, which are opposite to each other in the first lateral direction (X direction). The first end portion E11 and the second end portion E12 of the first conductive line C11 may be the insulation distance D1 apart from (e.g. nearest to by the insulation distance D1) the closed curve defining the local area LA.

The second conductive line C12 may extend parallel to the first conductive line C11 in the first lateral direction (X direction outside the local area LA, and may face the first conductive line C11 with the insulation distance D1 therebetween in the second lateral direction (Y direction). The second conductive line C12 may include a linear line portion C12L and a bulging end portion C12P. The linear line portion C12L may have a first sidewall SW1 extending in a straight line along the closed curve defining the local area LA. The bulging end portion C12P may have a second sidewall SW2 extending in a curve along the closed curve defining the local area LA from the linear line portion C12L. The bulging end portion C12P may have a protruding structure from the linear line portion C12L toward the first end portion E11 of the first conductive line C11 in the second lateral direction (Y direction).

In the first lateral direction (X direction), the bulging end portion C12P of the second conductive line C12 may protrude further than the first end portion E11 of the first conductive line C11 to the outside of the local area LA. In the first lateral direction (X direction), the bulging end portion C12P of the second conductive line C12 may protrude a first distance D12 further than the closed curve defining the local area LA in a direction away from the local area LA. A distance, e.g. a smallest distance from the linear line portion C12L of the second conductive line C12 to the first conductive line C11 may be equal to a distance, e.g. a smallest distance from the bulging end portion C12P of the second conductive line C12 to the first conductive line C11.

The bulging end portion C12P of the second conductive line C12 may have a protruding shape from the linear line portion C12L forward direction (e.g. upward in FIG. 1) in the second lateral direction (Y direction) toward the first end portion E11 of the first conductive line C11, but may not protrude from the linear line portion C12L backward (e.g. downward in FIG. 1) in the second lateral direction (Y direction, that is, in a direction away from the first conductive line C11.

The third conductive line C13 may be opposite the second conductive line C12 across the first conductive line C11 outside the local area LA. The third conductive line C13 may extend parallel to the first conductive line C11 in the first lateral direction (X direction) outside the local area LA, and face the first conductive line C11 with the insulation distance D1 therebetween, e.g. between the first conductive line C11 and the third conductive line C13, in the second lateral direction (Y direction).

Similar to the second conductive line C12, the third conductive line C13 may include a linear line portion C13L and a bulging end portion C13P. The linear line portion C13L may have a sidewall extending in a straight line along the closed curve defining the local area LA. The bulging end portion C13P may have a sidewall extending in a curve along the closed curve defining the local area LA from the linear line portion C13L. The bulging end portion C13P may have a protruding structure toward the second end portion E12 of the first conductive line C11 in the second lateral direction (Y direction). In the first lateral direction (X direction), the bulging end portion C13P of the third conductive line C13 may protrude further than the second end portion E12 of the first conductive line C11 to the outside of the local area LA.

In the first lateral direction (X direction), the bulging end portion C13P of the third conductive line C13 may protrude a second distance D13 further than the closed curve defining the local area LA in a direction away from the local area LA. In some example embodiments, the first distance D12 may be equal to the second distance D13, without being limited thereto.

The bulging end portion C13P of the third conductive line C13 may have a protruding shape backward (downward in FIG. 1) in the second lateral direction (Y direction) from the linear line portion C13L toward the second end portion E12 of the first conductive line C11, but may not protrude forward (upward in FIG. 1) in the second lateral direction (Y direction), which is a direction away from the linear line portion C13L.

In some example embodiments, the second conductive line C12 and the third conductive line C13 may have point-symmetric shapes with respect to one point on the first conductive line C11. In some example embodiments, the overall planar shape of the first conductive line C11, the second conductive line C12, and the third conductive line C13 may be point-symmetric with respect to one point on the first conductive line C11. In some example embodiments, planar shapes of the second conductive line C12 and the third conductive line C13 may be mutually point-symmetric with respect to one point on the first conductive line C11.

In some example embodiments, the first conductive line C11, the second conductive line C12, and the third conductive line C13 may have the same width in the second lateral direction (Y direction). In other example embodiments, at least two of the first conductive line C11, the second conductive line C12, and the third conductive line C13 may have different widths in the second lateral direction (Y direction). In an example, a first width W1 of the first conductive line C11, a second width W2 of the second conductive line C12, and a third width W3 of the third conductive line C13 may be equal in the second lateral direction (Y direction). In another example, at least two of the first width W1, the second width W2, and the third width W3 may be different from each other.

The substrate 110 may include a semiconductor, such as silicon (Si) or germanium (Ge), or a compound semiconductor, such as silicon germanium (SiGe), silicon carbide (SiC), gallium arsenide (GaAs), indium arsenide (InAs), or indium phosphide (InP). In another example, the substrate 110 may have a silicon-on-insulator (SOI) structure. The substrate 110 may include a substrate including a conductive region, for example, a doped well or a doped structure.

Each of the first conductive line C11, the second conductive line C12, and the third conductive line C13 may include a metal, a conductive metal nitride, or a combination thereof. For example, each of the first conductive line C11, the second conductive line C12, and the third conductive line C13 may include copper (Cu), tungsten (W), ruthenium (Ru), titanium (Ti), tantalum (Ta), or a combination thereof, without being limited thereto.

Figure 2:
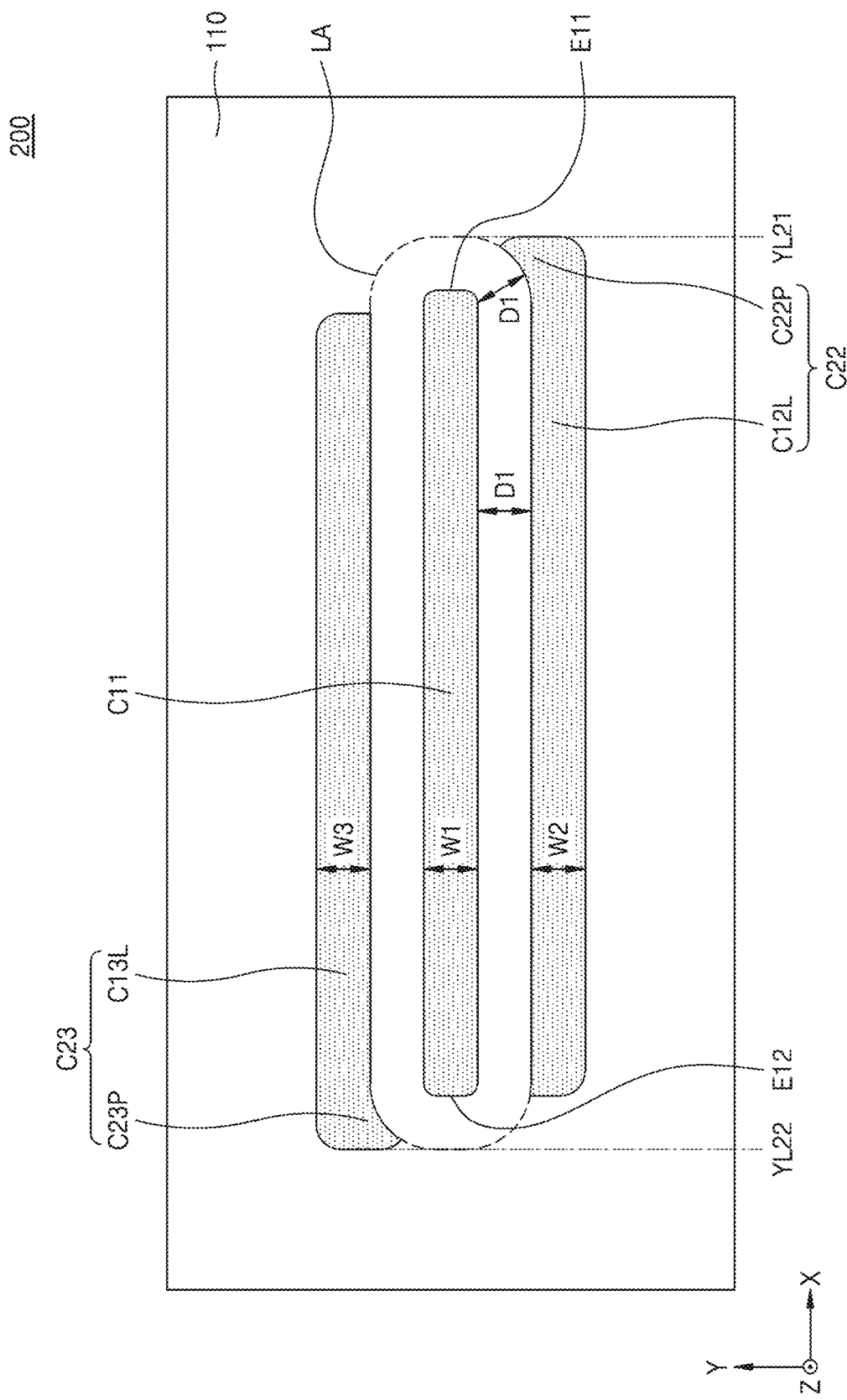

FIG. 2 is a plan view of an IC device 200, according to some example embodiments. In FIG. 2, the same reference numerals are used to denote the same elements as in FIG. 1, and a detailed description thereof is omitted.

Referring to FIG. 2, the IC device 200 may include a plurality of conductive lines (e.g., first to third conductive lines C11, C22, and C23), which are parallel to each other on a substrate 110. The second conductive line C22 and the third conductive line C23 may be on both sides of the first conductive line C11 in a second lateral direction (Y direction).

The second conductive line C22 and the third conductive line C23 may have substantially the same configurations as the second conductive line C12 and the third conductive line C13 described with reference to FIG. 1. That is, the second conductive line C22 may include a linear line portion C12L and a bulging end portion C22P having a sidewall extending in a curve along a closed curve defining the local area LA from the linear line portion C12L. The bulging end portion C22P may have a protruding structure toward the first end portion E11 of the first conductive line C11 in a second lateral direction (Y direction). In the first lateral direction (X direction), the bulging end portion C22P of the second conductive line C22 may protrude further than the first end portion E11 of the first conductive line C11 to the outside of the local area LA.

The third conductive line C23 may include a linear line portion C13L and a bulging end portion C23P having a sidewall extending in a curve along the closed curve defining the local area LA from the linear line portion C13L. The bulging end portion C23P may have a protruding structure toward the second end portion E12 of the first conductive line C11 in the second lateral direction (Y direction). In the first lateral direction (X direction), the bulging end portion C23P of the third conductive line C23 may protrude further than the second end portion E12 of the first conductive line C11 to the outside of the local area LA.

The bulging end portion C22P and C23P of the IC device 200 shown in FIG. 2 may have substantially the same configurations as the bulging end portions C12P and C13P shown in FIG. 1. However, the bulging end portions C22P and C23P of the IC device 200 shown in FIG. 2 may have smaller sizes than the bulging end portions C12P and C13P of the IC device 10 shown in FIG. 1. In the first lateral direction (X direction), an end of the bulging end portion C22P of the second conductive line C22 and one end of the closed curve defining the local area LA may be on a first straight line YL21 that follows the second lateral direction (Y direction). In the first lateral direction (X direction), an end of the bulging end portion C23P of the third conductive line C23 and the other end of the closed curve defining the local area LA may be on a second straight line YL22 that follows the second lateral direction (Y direction).

In some example embodiments, the second conductive line C22 and the third conductive line C23 may have point-symmetric shapes with respect to one point on the first conductive line C11. In some example embodiments, the overall planar shape of the first conductive line C11, the second conductive line C22, and the third conductive line C23 may have a point-symmetric shape with respect to one point on the first conductive line C11. In some example embodiments, planar shapes of the second conductive line C22 and the third conductive line C23 may be mutually point-symmetric with respect to one point on the first conductive line C11.

Figure 3:
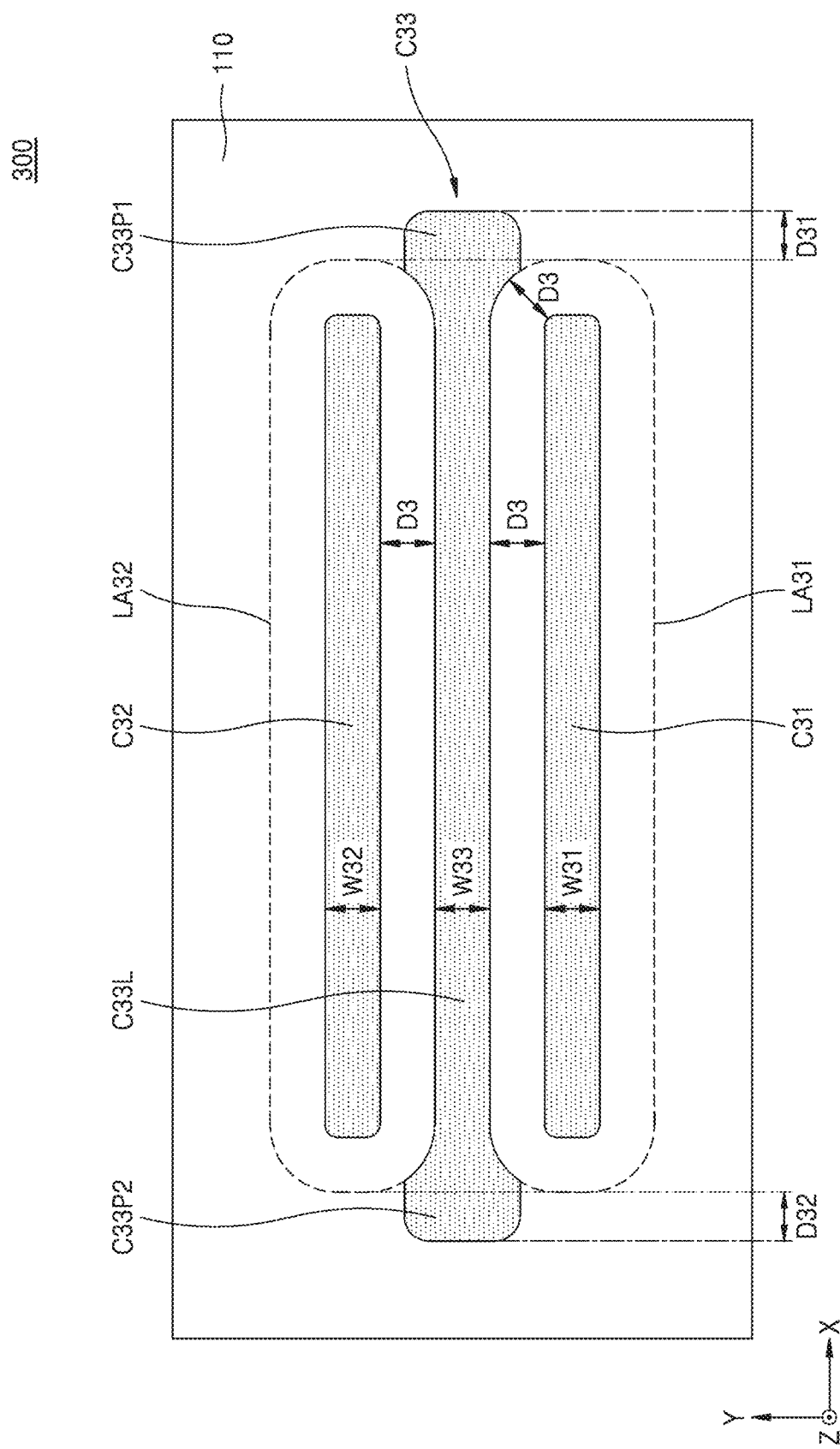

FIG. 3 is a plan view of an IC device 300, according to some example embodiments. In FIG. 3, the same reference numerals are used to denote the same elements as in FIG. 1, and a detailed description thereof is omitted.

Referring to FIG. 3, the IC device 300 may include a plurality of conductive lines (e.g., first to third conductive lines C31, C32, and C33), which are parallel to each other on a substrate 110. The third conductive line C33 may be between the first conductive line C31 and the second conductive line C32 in a second lateral direction (Y direction). The third conductive line C33 may be an insulation distance D3 apart from each of the first conductive line C31 and the second conductive line C32 in a lateral direction.

The first conductive line C31 may extend long in a first local area LA31 in the first lateral direction (X direction) and be apart by the insulation distance D3 from a closed curve defining the first local area LA31. The second conductive line C32 may extend long in a second local area LA32 in the first lateral direction (X direction) and be apart by the insulation distance D3 from a closed curve defining the second local area LA32. In some example embodiments, each of the first local area LA31 and the second local area LA32 may have an elliptical planar shape.

The third conductive line C33 may include a linear line portion C33L, which extends in a straight line in the first lateral direction (X direction), and a first bulging end portion C33P1 and a second bulging end portion C33P2, which protrude from the linear line portion C33L in opposite directions in the first lateral direction (X direction). The first bulging end portion C33P1 and the second bulging end portion C33P2 may respectively have protruding shapes toward end portions of the first conductive line C31 and the second conductive line C32. The first bulging end portion C33P1 and the second bulging end portion C33P2 may have the same planar shape and have mutual point-symmetric shapes with respect to one point on the third conductive line C33.

The linear line portion C33L of the third conductive line C33 may have a sidewall extending in a straight line along the closed curve defining the first local area LA31 and a sidewall extending in a straight line along the closed curve defining the second local area LA32. The first bulging end portion C33P1 and the second bulging end portion C33P2 of the linear line portion C33L may respectively have sidewalls extending in curves along the closed curves defining the first local area LA31 and the second local area LA32.

The first bulging end portion C33P1 and the second bulging end portion C33P2 may respectively have protruding shapes toward the end portions of the first conductive line C31 and the second conductive line C32 in the second lateral direction (Y direction). In the first lateral direction (X direction), the first bulging end portion C33P1 and the second bulging end portion C33P2 may respectively protrude further than the end portions of the first conductive line C31 and the second conductive line C32 in a direction away from the end portions of the first conductive line C31 and the second conductive line C32. In the first lateral direction (X direction), the first bulging end portion C33P1 may protrude a first distance D31 further than a closed curve defining each of the first local area LA31 and the second local area LA32 in a direction away from the first local area LA31 and the second local area LA32. In the first lateral direction (X direction), the second bulging end portion C33P2 may protrude a second distance D32 further than the closed curve defining each of the first local area LA31 and the second local area LA32 in the direction away from the first local area LA31 and the second local area LA32. The first distance D31 may be equal to the second distance D32, without being limited thereto.

In some example embodiments, in the first lateral direction (X direction), the first local area LA31 and the second local area LA32 may have the same length, and the first conductive line C31 and the second conductive line C32 may have the same length. In the first lateral direction (X direction), a length of the third conductive line C33 may be greater than a length of each of the first conductive line C31 and the second conductive line C32.

In some example embodiments, the third conductive line C33 may have a point-symmetric shape with respect to one point on the third conductive line C33. In some example embodiments, the overall planar shape of the first conductive line C31, the second conductive line C32, and the third conductive line C33 may have a point-symmetric shape with respect to one point on the third conductive line C33. In some example embodiments, the first conductive line C31 and the second conductive line C32 may have point-symmetric shapes with respect to one point on the third conductive line C33.

In some example embodiments, a first width W31 of the first conductive line C31, a second width W32 of the second conductive line C32, and a third width W33 of the third conductive line C33 may be equal in the second lateral direction (Y direction). In another example, at least two of the first width W31, the second width W32, and the third width W33 may be different from each other. Detailed configurations of the first conductive line C31, the second conductive line C32, and the third conductive line C33 may be substantially the same as those of the first conductive line C11, the second conductive line C12, and the third conductive line C13, which are provided with reference to FIG. 1.

Figure 4:
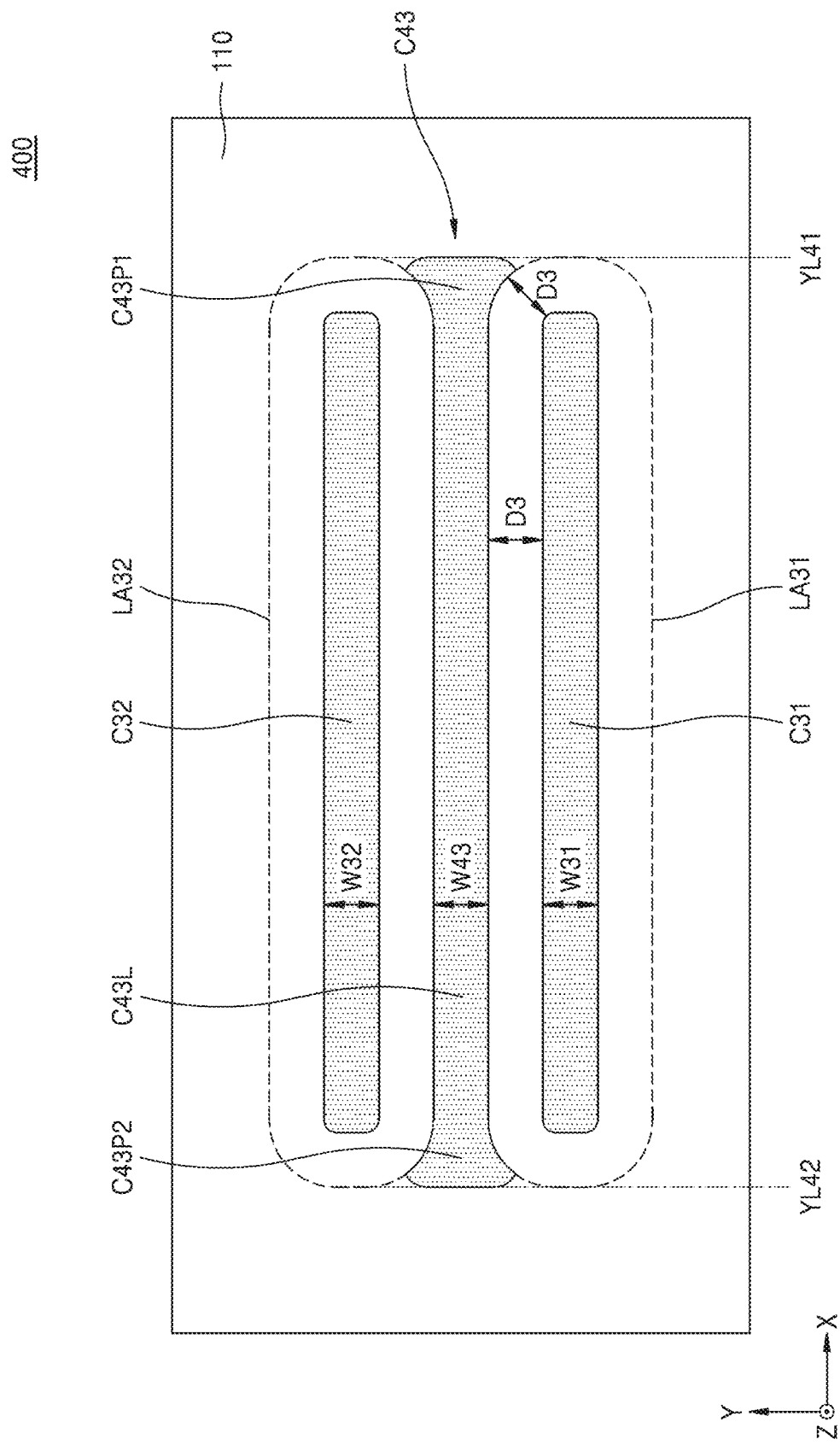

FIG. 4 is a plan view of an IC device 400, according to some example embodiments. In FIG. 4, the same reference numerals are used to denote the same elements as in FIG. 3, and a detailed description thereof will be omitted.

Referring to FIG. 4, the IC device 400 may include a plurality of conductive lines (e.g., first to third conductive lines C31, C32, and C43) arranged parallel to each other on a substrate 110.

The third conductive line C43 may have substantially the same configuration as the third conductive line C33 described with reference to FIG. 3. The third conductive line C43 may be an insulation distance D3 apart from each of the first conductive line C31 and the second conductive line C32 in a lateral direction. The third conductive line C43 may include a linear line portion C43L, which extends in a straight line in the first lateral direction (X direction), and a first bulging end portion C43P1 and a second bulging end portion C43P2, which protrude from the linear line portion C43L in opposite directions to each other in the first lateral direction (X direction). The first bulging end portion C43P1 and the second bulging end portion C43P2 may respectively have protruding shapes from end portions of the first conductive line C31 and the second conductive line C32.

The linear line portion C43L, the first bulging end portion C43P1, and the second bulging end portion C43P2 of the third conductive line C43 may have substantially the same configurations as the linear line portion C33L, the first bulging end portion C33P1, and the second bulging end portion C33P2 described with reference to FIG. 3. However, the first bulging end portion C43P1 and the second bulging end portion C43P2 shown in FIG. 4 may have smaller sizes than the first bulging end portion C33P1 and the second bulging end portion C33P2 shown in FIG. 3.

In some example embodiments, the third conductive line C43 may have a point-symmetric shape with respect to one point on the third conductive line C43. In some example embodiments, the overall planar shape of the first conductive line C31, the second conductive line C32, and the third conductive line C43 may have a point-symmetric shape with respect to one point on the third conductive line C43. Planar shapes of the first conductive line C31 and the second conductive line C32 may be mutually point-symmetric with respect to one point on the third conductive line C43.

In some example embodiments, a third width W43 of the third conductive line C43 may be equal to at least one of a first width W31 of the first conductive line C31 and a second width W32 of the second conductive line C32. In other example embodiments, at least two of the first width W31, the second width W32, and the third width W43 may be different from each other in a second lateral direction (Y direction).

In the first lateral direction (X direction), an end of the first bulging end portion C43P1 of the third conductive line C43 and one end of a closed curve defining each of the first local area LA31 and the second local area LA32 may be on a first straight line YL41 that follows the second lateral direction (Y direction). In the first lateral direction (X direction), an end of the second bulging end portion C43P2 of the third conductive line C43 and the other end of the closed curve defining each of the first local area LA31 and the second local area LA32 may be on a second straight line YL42 that follows the second lateral direction (Y direction). A detailed configuration of the third conductive line C43 may be substantially the same as that of the third conductive line C33, which is described with reference to FIG. 3.

Figure 5:
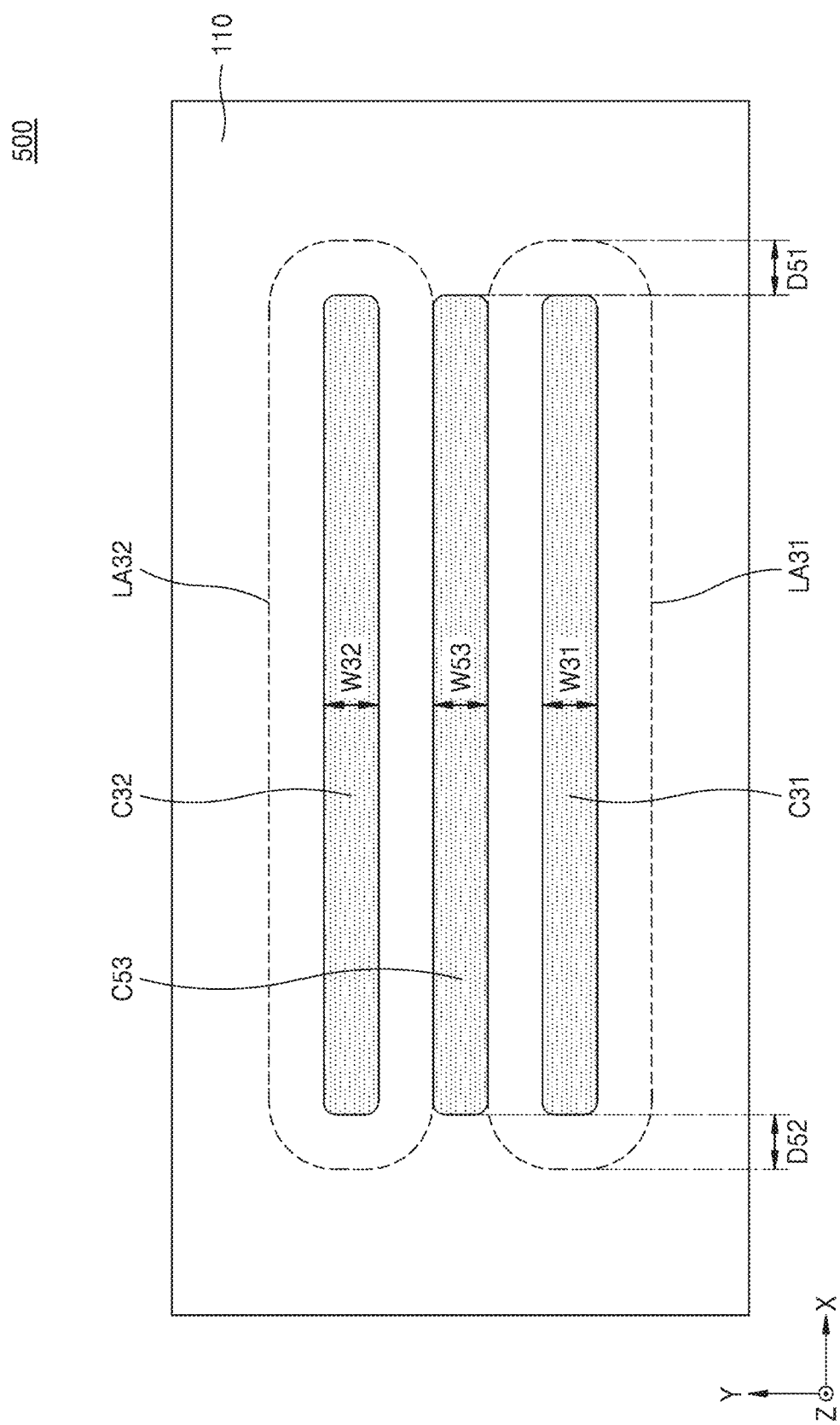

FIG. 5 is a plan view of an IC device 500, according to some example embodiments. In FIG. 5, the same reference numerals are used to denote the same elements as in FIG. 3, and a detailed description thereof will be omitted.

Referring to FIG. 5, the IC device 500 may include a plurality of conductive lines (e.g., first to third conductive lines C31, C32, and C53), which are parallel to each other on a substrate 110.

The third conductive line C53 may have substantially the same configuration as the third conductive line C53 described with reference to FIG. 3. However, the third conductive line C53 may not include bulging end portions corresponding to the first bulging end portion C33P1 and the second bulging end portion C33P2. The third conductive line C53 may extend in a straight line in a first lateral direction (X direction) along closed curves respectively defining a first local area LA31 and a second local area LA32, but may not include a portion extending in a curve along the closed curves.

One end of the third conductive line C53 may be at a point, which is a first distance D51 backward (leftward in FIG. 5) in the first lateral direction (X direction) from a straight line that extends in the second lateral direction (Y direction) through one end of the closed curve defining the first local area LA31 or the second local area LA32. The other end of the third conductive line C53 may be at a point, which is a second distance D52 forward (rightward in FIG. 5) in the first lateral direction (X direction) from the straight line that extends in the second lateral direction (Y direction) through the one end of the closed curve defining the first local area LA31 or the second local area LA32.

In some example embodiments, the first conductive line C31, the second conductive line C32, and the third conductive line C53 may have the same lengths in the first lateral direction (X direction). In other example embodiments, the first conductive line C31, the second conductive line C32, and the third conductive line C53 may have different lengths in the first lateral direction (X direction). In addition, from among the first conductive line C31, the second conductive line C32, and the third conductive line C53, the third conductive line C53 may have the smallest length.

The overall planar shape of the first conductive line C31, the second conductive line C32, and the third conductive line C53 may be point-symmetric with respect to one point on the third conductive line C53. In some example embodiments, a third width W53 of the third conductive line C53 may be equal to at least one of the first width W31 of the first conductive line C31 and the second width W32 of the second conductive line C32. A detailed configuration of the third conductive line C53 may be substantially the same as that of the third conductive line C33 described with reference to FIG. 3.

Figure 6:
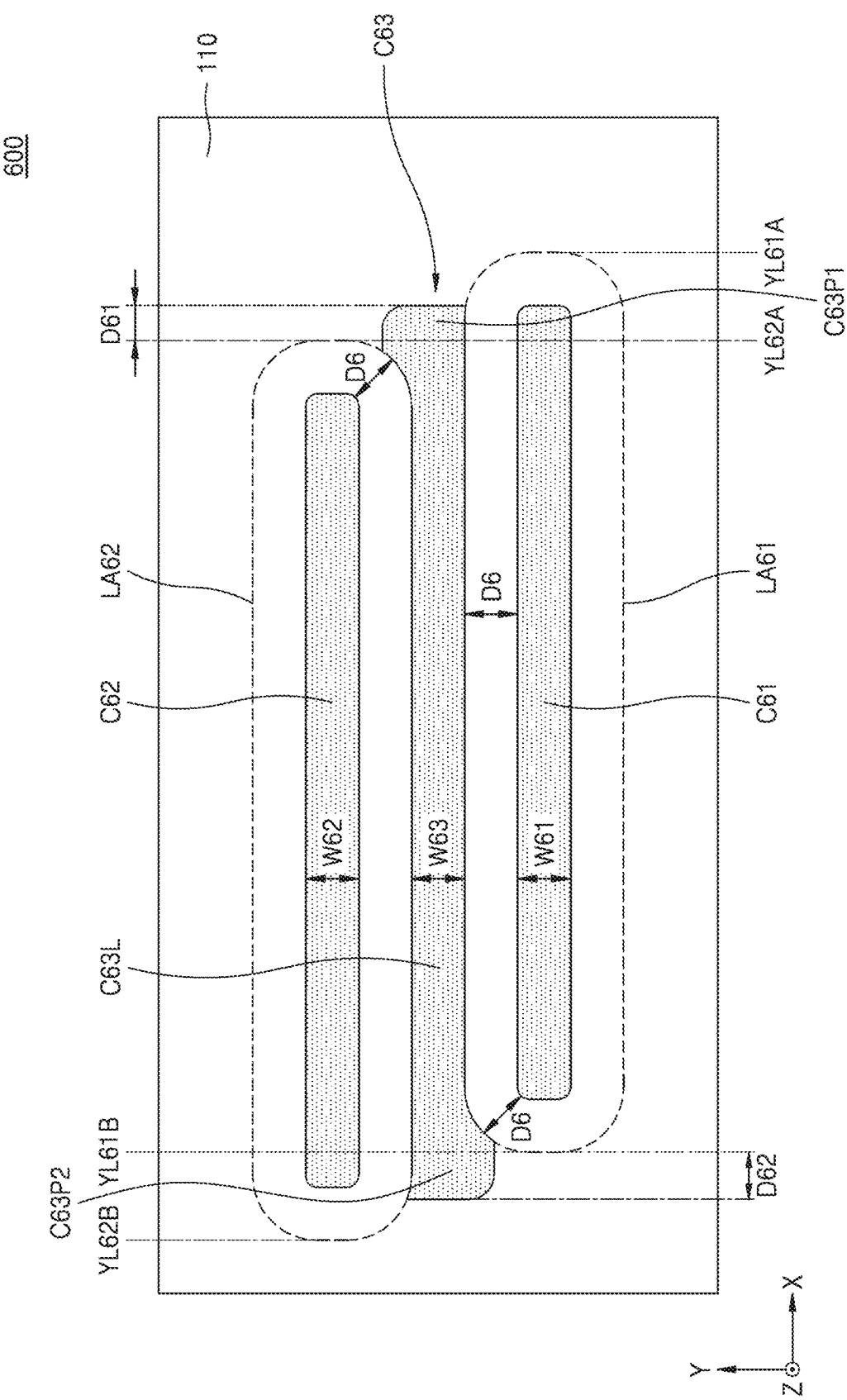

FIG. 6 is a plan view of an IC device 600 according to some example embodiments. In FIG. 6, the same reference numerals are used to denote the same elements as in FIG. 3, and a detailed description thereof is omitted.

Referring to FIG. 6, the IC device 600 may include a plurality of conductive lines (e.g., first to third conductive lines C61, C62, and C63), which are parallel to each other on a substrate 110. The third conductive line C63 may be between the first conductive line C61 and the second conductive line C62 in the second lateral direction (Y direction). The third conductive line C63 may be an insulation distance D6 apart from each of the first conductive line C61 and the second conductive line C62 in a lateral direction.

The first conductive line C61, the second conductive line C62, and the third conductive line C63 may have substantially the same configurations as the first conductive line C31, the second conductive line C32, and the third conductive line C33 described with reference to FIG. 3. The first conductive line C61 may extend long in a first local area LA61 in a first lateral direction (X direction) and be apart by the insulation distance D6 from a closed curve defining a first local area LA31. The second conductive line C62 may extend long in the first lateral direction (X direction) in a second local area LA62) and be apart by the insulation distance D6 from a closed curve defining the second local area LA62. In some example embodiments, each of the first local area LA61 and the second local area LA62 may have an elliptical planar shape.

The first local area LA61 and the second local area LA62 may be misaligned from each other in the second lateral direction (Y direction). Thus, the first conductive line C61 and the second conductive line C62 may also be misaligned from each other in the second lateral direction (Y direction).

The third conductive line C63 may include a linear line portion C63L, a first bulging end portion C63P1, and a second bulging end portion C63P2. The linear line portion C63L may extend in a straight line in the first lateral direction (X direction) between the first conductive line C61 and the second conductive line C62. The first bulging end portion C63P1 and the second bulging end portion C63P2 may protrude in opposite directions to each other from the linear line portion C63L in the first lateral direction (X direction).

The first bulging end portion C63P1 and the second bulging end portion C63P2 may respectively have substantially the same configurations as the first bulging end portion C33P1 and the second bulging end portion C33P2 described with reference to FIG. 3. However, the first bulging end portion C63P1 and the second bulging end portion C63P2 may have a protruding shape toward an end portion of one selected from the first conductive line C61 and the second conductive line C62. Although FIG. 6 illustrates a case in which the first bulging end portion C63P1 protrudes toward the end portion of the second conductive line C62 and the second bulging end portion C63P2 protrudes toward the end portion of the first conductive line C61, inventive concepts is not limited thereto. Unlike that shown in FIG. 6, the first bulging end portion C63P1 may protrude toward the end portion of the first conductive line C61, and the second bulging end portion C63P2 may protrude toward the end portion of the second conductive line C62.

The linear line portion C63L, the first bulging end portion C63P1, and the second bulging end portion C63P2 of the third conductive line C63 may respectively have substantially the same configurations as the linear line portion C33L, the first bulging end portion C33P1, and the second bulging end portion C33P2 described with reference to FIG. 3. However, the first bulging end portion C63P1 of the third conductive line C63 may have a sidewall extending in a curve along a closed curve defining the second local area LA32. The first bulging end portion C63P1 may include a protruding portion toward the second conductive line C62, but may not include a protruding portion toward the first conductive line C61. The second bulging end portion C63P2 of the third conductive line C63 may have a sidewall extending in a curve along the closed curve defining the first local area LA31. The second bulging end portion C63P2 may include a protruding portion toward the first conductive line C61, but may not include a protruding portion toward the second conductive line C62.

In some example embodiments, the third conductive line C63 may have a point-symmetric shape with respect to one point on the third conductive line C63. In some example embodiments, the overall planar shape of the first conductive line C61, the second conductive line C62, and the third conductive line C63 may be point-symmetric with respect to one point on the third conductive line C63. In some example embodiments, planar shapes of the first conductive line C61 and the second conductive line C62 may be point-symmetric with respect to one point on the third conductive line C63.

In some example embodiments, at least one of a first width W61 of the first conductive line C61 and a second width W62 of the second conductive line C62 may be equal to a third width W63 of the third conductive line C63. In other example embodiments, at least two of the first width W61, the second width W62, and the third width W63 may be different from each other in the second lateral direction (Y direction).

In the first lateral direction (X direction), the first bulging end portion C63P1 may protrude by a first distance D61 further than the closed curve defining the second local area LA62 in a direction away from the second local area LA62. An end of the first bulging end portion C63P1 may be in a region between a first straight line YL61A and a second straight line YL62A. The first straight line YL61A may pass through one end of a closed curve defining the first local area LA61 and extend in the second lateral direction (Y direction). The second straight line YL62A may pass through one end of the closed curve defining the second local area LA62 and extend in the second lateral direction (Y direction).

In the first lateral direction (X direction), the second bulging end portion C63P2 may protrude by a second distance D62 further than the closed curve defining the first local area LA61 in a direction away from the first local area LA61. An end of the second bulging end portion C63P2 may be in a region between a third straight line YL61B and a fourth straight line YL62B. The third straight line YL61B may pass through the other end of the closed curve defining the first local area LA61 and extend in the second lateral direction (Y direction). The fourth straight line YL62B may pass through one end of the closed curve defining the second local area LA62 and extend in the second lateral direction (Y direction).

Figure 7:
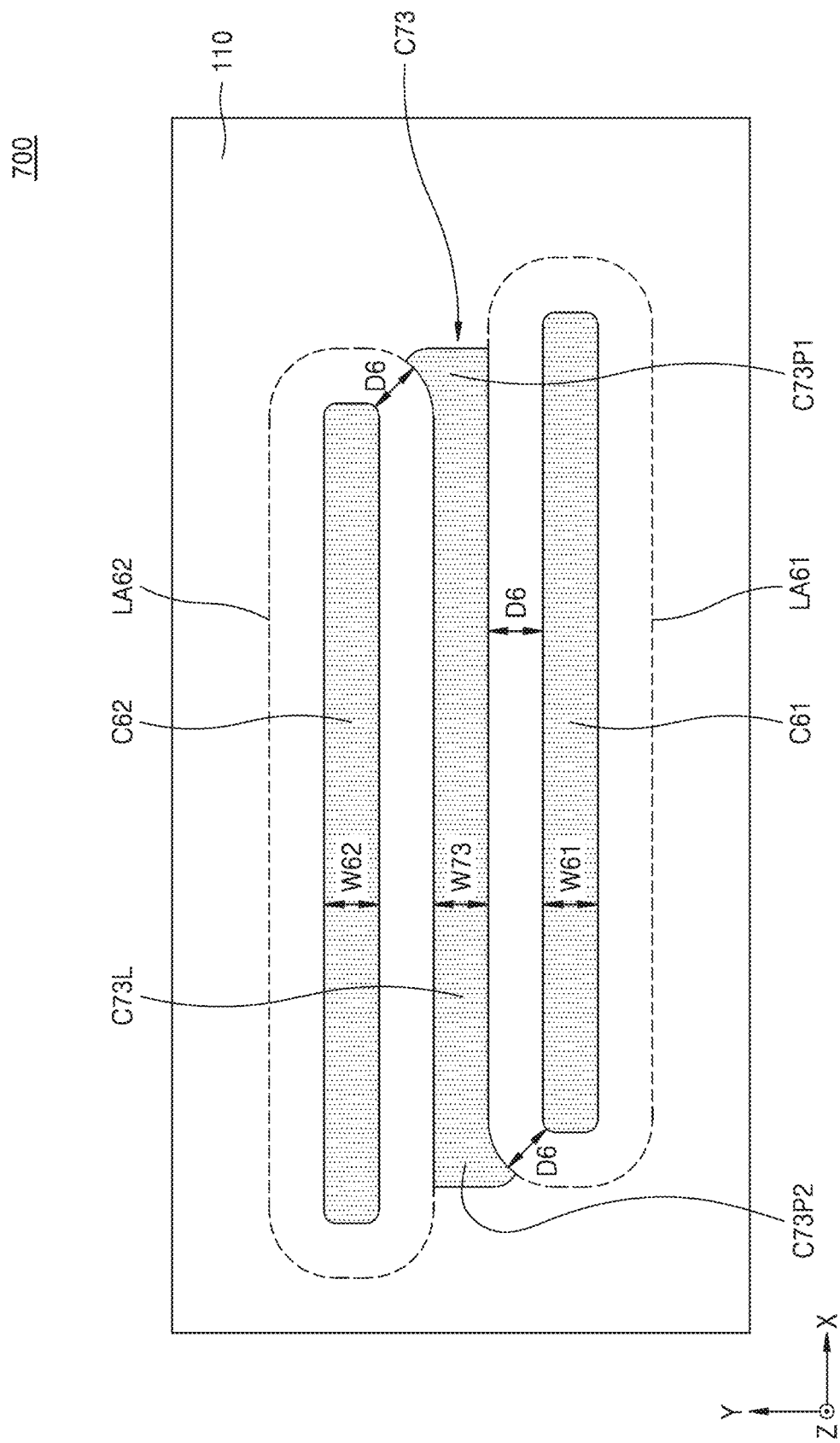

FIG. 7 is a plan view of an IC device 700, according to some example embodiments. In FIG. 7, the same reference numerals are used to denote the same elements as in FIG. 6, and a detailed description thereof is omitted.

Referring to FIG. 7, the IC device 700 may include a first conductive line C61, a second conductive line C62, and a third conductive line C73, which are parallel to each other on a substrate 110.

The third conductive line C73 may have substantially the same configuration as the third conductive line C63 described with reference to FIG. 6. The third conductive line C73 may include a linear line portion C73L, a first bulging end portion C73P1, and a second bulging end portion C73P2. The linear line portion C73L may extend in a straight line in a first lateral direction (X direction). The first bulging end portion C73P1 and the second bulging end portion C73P2 may protrude from the linear line portion C73L in opposite directions to each other in the first lateral direction (X direction). The first bulging end portion C73P1 and the second bulging end portion C73P2 may have substantially the same configurations as the first bulging end portion C63P1 and the second bulging end portion C63P2, which are described with reference to FIG. 6. However, the first bulging end portion C73P1 and the second bulging end portion C73P2 of the IC device 700 shown in FIG. 7 may have smaller sizes than the first bulging end portion C63P1 and the second bulging end portion C63P2 shown in FIG. 6.

In some example embodiments, the third conductive line C73 may have a point-symmetric shape with respect to one point on the third conductive line C73. In some example embodiments, the overall planar shape of the first conductive line C61, the second conductive line C62, and the third conductive line C73 may be point-symmetric with respect to one point on the third conductive line C73. Planar shapes of the first conductive line C61 and the second conductive line C62 may be mutually point-symmetric with respect to one point on the third conductive line C73.

In some example embodiments, a third width W73 of the third conductive line C73 may be equal to at least one of a first width W61 of the first conductive line C61 and a second width W62 of the second conductive line C62. In other example embodiments, at least two of the first width W61, the second width W62, and the third width W73 may be different from each other in a second lateral direction (Y direction). Detailed configurations of the first conductive line C61, the second conductive line C62, and the third conductive line C73 may be substantially the same as those of the first conductive line C61, the second conductive line C62, and the third conductive line C63, which are described with reference to FIG. 6.

Figure 8:
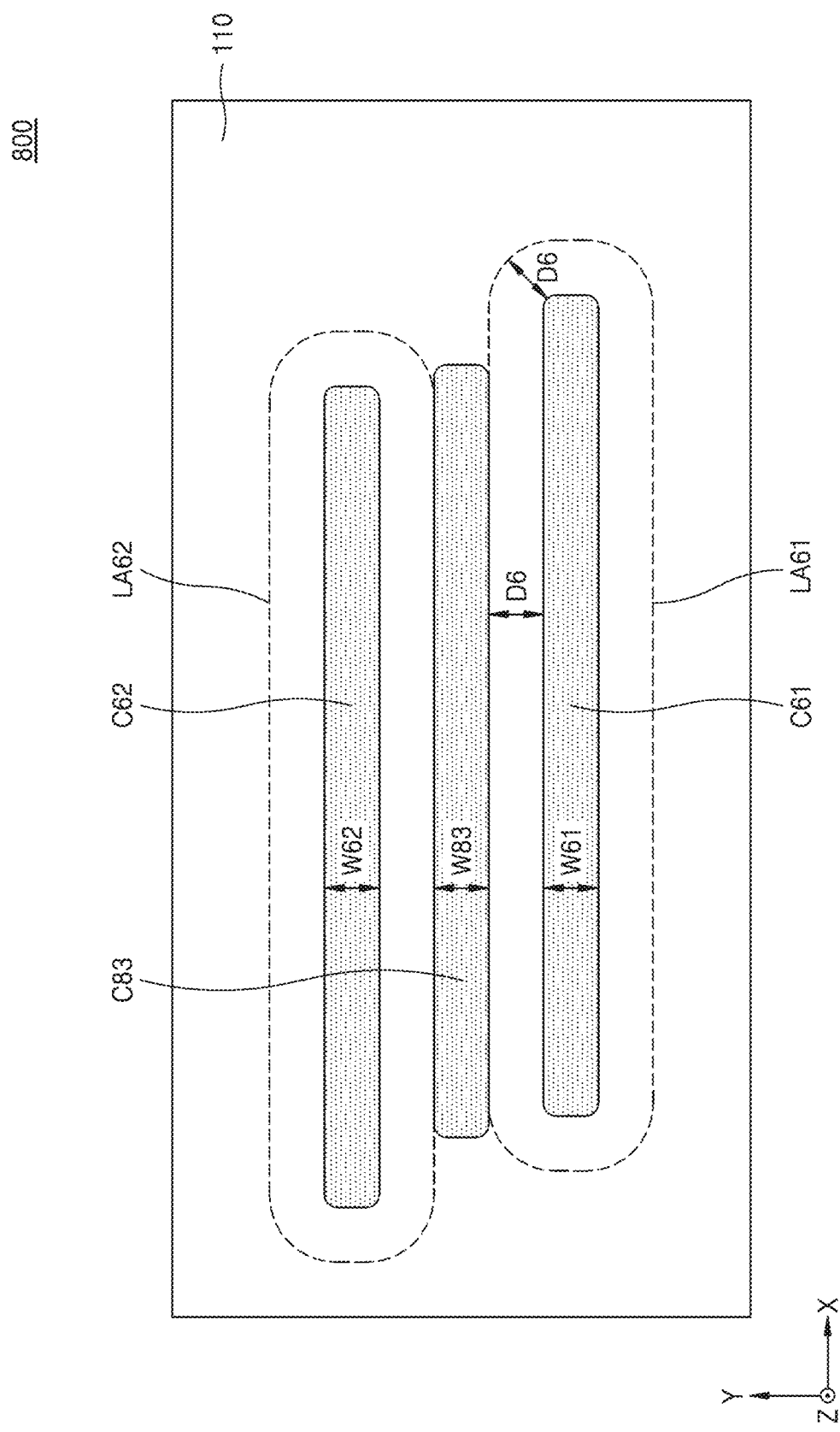

FIG. 8 is a plan view of an IC device 800, according to some example embodiments. In FIG. 8, the same reference numerals are used to denote the same elements as in FIG. 6, and a detailed description thereof is omitted.

Referring to FIG. 8, the IC device 800 may include a first conductive line C61, a second conductive line C62, and a third conductive line C83, which are parallel to each other on a substrate 110. The third conductive line C83 may have substantially the same configuration as the third conductive line C63 described with reference to FIG. 6. However, the third conductive line C83 may not include bulging end portions corresponding to a first bulging end portion C63P1 and a second bulging end portion C63P2. The third conductive line C83 may extend in a straight line in a first lateral direction (X direction) along closed curves respectively defining the first local area LA61 and the second local area LA62, but may not include a portion extending in a curve along the closed curves.

In some example embodiments, the first conductive line C61, the second conductive line C62, and the third conductive line C83 may have the same lengths in the first lateral direction (X direction). In other example embodiments, the first conductive line C61, the second conductive line C62, and the third conductive line C83 may have different lengths in the first lateral direction (X direction). In addition, from among the first conductive line C61, the second conductive line C62, and the third conductive line C83, the third conductive line C83 may have the smallest length. The first conductive line C61, the second conductive line C62, and the third conductive line C83 may be misaligned from each other in a second lateral direction (Y direction).

Figure 9:
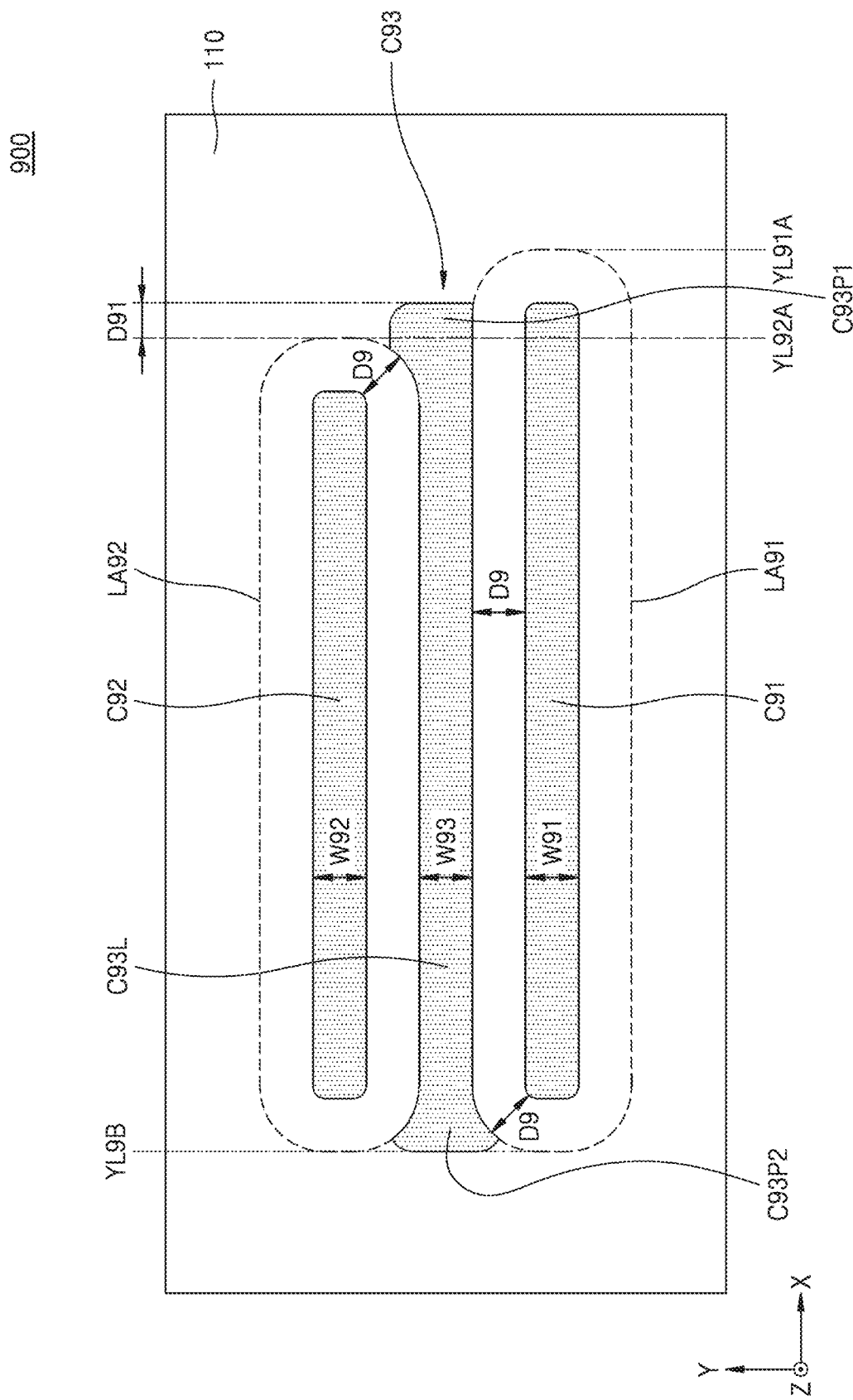

FIG. 9 is a plan view of an IC device 900, according to some example embodiments. In FIG. 9, the same reference numerals are used to denote the same elements as in FIG. 3, and a detailed description thereof is omitted.

Referring to FIG. 9, the IC device 900 may include a plurality of conductive lines (e.g., first to third conductive lines C91, C92, and C93), which are parallel to each other on a substrate 110. The third conductive line C93 may be between the first conductive line C91 and the second conductive line C92 in a second lateral direction (Y direction). The third conductive line C93 may be an insulation distance D9 apart from each of the first conductive line C91 and the second conductive line C92 in a lateral direction.

The first conductive line C91, the second conductive line C92, and the third conductive line C93 may have substantially the same configurations as the first conductive line C31, the second conductive line C32, and the third conductive line C33 described with reference to FIG. 3. The first conductive line C91 may extend long in a first local area LA91 in a first lateral direction (X direction), and be apart by the insulation distance D9 from a closed curve defining the first local area LA91. The second conductive line C92 may extend long in a second local area LA92 in the first lateral direction (X direction) and be apart by the insulation distance D9 from a closed curve defining the second local area LA92. In some example embodiments, each of the first local area LA91 and the second local area LA92 may have an elliptical planar shape.

In the first lateral direction (X direction), the first local area LA91 and the second local area LA92 may have respectively different lengths. One side of the first local area LA91 and one side of the second local area LA92 may be misaligned from each other in the second lateral direction (Y direction), and the other side of the first local area LA91 and the other side of the second local area LA92 may be on a straight line YL9B that extends in the second lateral direction (Y direction). The first conductive line C91 and the second conductive line C92 may have different lengths in the first lateral direction (X direction).

The third conductive line C93 may include a linear line portion C93L extending in a straight line in the first lateral direction (X direction) between the first conductive line C91 and the second conductive line C92 and a first bulging end portion C93P1 and a second bulging end portion C93P2, which protrude in opposite directions to each other from the linear line portion C93L in the first lateral direction (X direction). The first bulging end portion C93P1 and the second bulging end portion C93P2 of the third conductive line C93 may have different planar shapes.

Similar to the first bulging end portion C63P1 described with reference to FIG. 6, the first bulging end portion C93P1 of the third conductive line C93 may have a protruding shape toward an end portion of the second conductive line C92. In the first lateral direction (X direction), the first bulging end portion C93P1 may protrude by a first distance D91 further than the closed curve defining the second local area LA92 in a direction away from the second local area LA92. An end of the first bulging end portion C93P1 may be in a region between a straight line YL91A and a straight line YL92A. The straight line YL91A may pass through one end of the closed curve defining the first local area LA91 and extend in the second lateral direction (Y direction). The straight line YL92A may pass through one end of the closed curve defining the second local area LA92 and extend in the second lateral direction (Y direction). The first bulging end portion C93P1 of the third conductive line C93 may have a sidewall extending in a curve along the closed curve defining the second local area LA92 and include a protrusion toward the second conductive line C92, but may not include a protrusion toward the first conductive line C91.

Similar to the second bulging end portion C33P2 and the second bulging end portion C43P2 described with reference to FIGS. 3 and 4, the second bulging end portion C93P2 of the third conductive line C93 may have a sidewall extending in a curve along the closed curve defining the first local area LA91 and a sidewall extending in a curve along the closed curve defining the second local area LA92. The second bulging end portion C93P2 may include protruding portions toward the first conductive line C91 and the second conductive line C92. In the first lateral direction (X direction), an end of the second bulging end portion C93P2 of the third conductive line C93, the other end of the closed curve defining the first local area LA91, and the other end of the closed curve defining the second local area LA92 may be on one straight line YL9B that follows the second lateral direction (Y direction). A detailed configuration of the third conductive line C93 may be substantially the same as that of the third conductive line C33, which is provided with reference to FIG. 3.

In some example embodiments, at least one of a first width W91 of the first conductive line C91 and a second width W92 of the second conductive line C92 may be equal to a third width W93 of the third conductive line C93. In other example embodiments, at least two of the first width W91, the second width W92, and the third width W93 may be different from each other in the second lateral direction (Y direction).

Although example structures and arrangements of a plurality of conductive lines included in the IC devices 100, 200, 300, 400, 500, 600, 700, 800, and 900 have been described with reference to FIGS. 1 to 9, it will be understood that inventive concepts is not limited thereto and various modifications and changes may be made therein. An IC device according to some example embodiments may include conductive lines, which have a fine width and are arranged parallel to each other at a fine pitch, and the conductive lines may be arranged in various sizes and various shapes according to desired designs.

Figure 10:
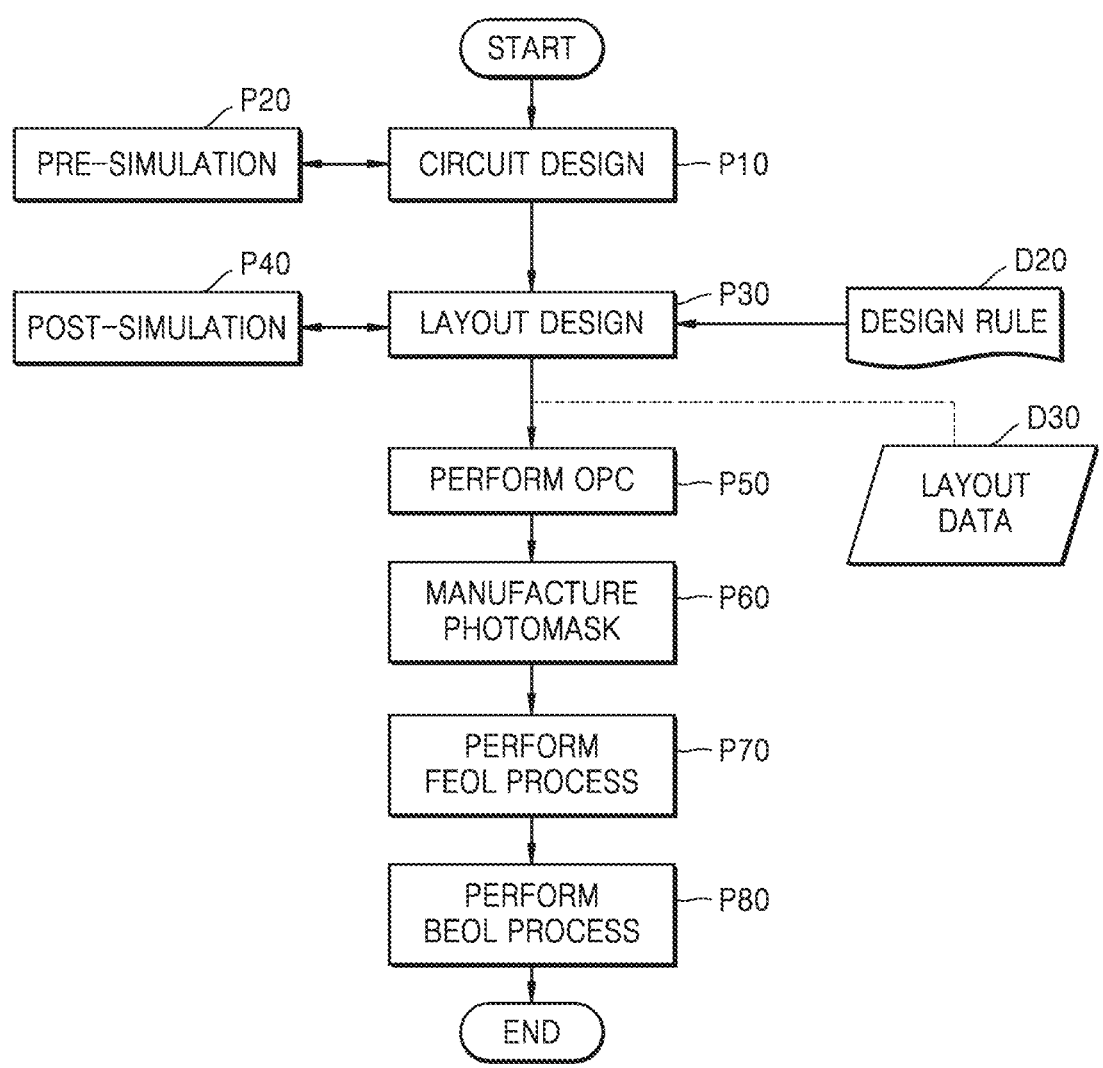
FIG. 10 is a flowchart of a method of manufacturing an IC device, according to some example embodiments.

FIG. 10 is a flowchart of a method of manufacturing an IC device, according to some example embodiments.

Referring to FIG. 10, in process P10, circuit design may be performed. For example, various elements (e.g., transistors) may be designed to satisfy the performance of the IC device to be manufactured. In some example embodiments, the circuit design may be performed by a circuit design tool configured to provide a user interface to a designer.

The circuit design according to process P10 may be performed with reference to results of a pre-simulation performed in process P20. For example, the pre-simulation may be performed to test the performance of a designed circuit, and a structure, such as a circuit structure and/or schematic structure, of the circuit may be modified based on the results of the pre-simulation. The pre-simulation may be performed with a Simulation Program with Integrated Circuit Emphasis (SPICE) process; however, example embodiments are not limited thereto.

In process P30, layout design may be performed. In some example embodiments, the layout design may be performed by a layout design tool.

The layout design according to process P30 may be performed with reference to results of a post-simulation performed in process P40. The layout designed in process P30 may be modified based on the results of the post-simulation; alternatively or additionally, the circuit design may also be modified based on the results of the post-simulation.

The layout design according to process P30 may be performed based on a design rule D20. The design rule D20 may define a plurality of rules based on processes for manufacturing the IC device. For example, the design rule D20 may define a pitch of patterns allowed in the same conductive layer and/or a space between the patterns. The layout of the IC device may be designed to comply with or be consistent with the plurality of rules defined by the design rule D20.

When the layout design is completed in process P30, layout data D30 for defining a layout may be generated. The layout data D30 may include geometric information about patterns included in the IC device to be formed.

In process P50, an optical proximity correction (OPC) operation may be performed. The OPC operation may collectively refer to operations for forming patterns having desired shapes by correcting distortion phenomena (e.g., refraction) caused by the characteristics of light in a photolithography process performed to manufacture/fabricate an IC device, for example by adding serif patterns and/or adding inrigger features and/or outrigger features. Additionally or alternatively features such as dummy-fill features may be added during the OPC process, after the OPC process, and/or before the OPC process; example embodiments are not limited thereto.

By applying the OPC operation to the layout data D30 to the layout data D30, which is the resultant structure of the layout designed in the process P30, a pattern on a photomask manufactured in a subsequent process P60 may be determined. In some example embodiments, the layout of the IC device may be limitedly modified in the OPC operation according to the process P50.

In process P60, at least one photomask may be manufactured. For example, by applying the OPC operation to the layout data D30, patterns on the photomask required to or used to form a plurality of patterns may be defined, and at least one photomask for forming respective patterns of a plurality of layers may be manufactured. For example, the photomask may be or may correspond to a chrome pattern etched on a glass substrate; however, example embodiments are not limited thereto.

In process P70, a front-end-of-line (FEOL) process for manufacturing an IC device may be performed, e.g. based on the at least one photomask.

In the FEOL process, individual elements may be formed on a substrate. The individual elements may include active and/or passive elements such as a transistor, a capacitor, and a resistor, without being limited thereto. The FEOL process may include at least one of processes of planarizing structures on the substrate, cleaning processes, etching processes, deposition processes, ion implantation processes, processes of forming a conductive film, and processes of forming an insulating film with the various processes performed in various orders.

In process P80, a back-end-of-line (BEOL) process may be performed e.g. based on the at least one photomask.

The BEOL process may include processes of electrically interconnecting the individual elements formed in process P70 to each other. The BEOL process may include at least one of processes of forming a plurality of conductive films, processes of forming a plurality of conductive via contacts, silicidation processes, plating processes, insulating film depositing processes, and passivation film forming processes, with the various processes performed in various orders. The resultant structure on which the BEOL process according to the process P80 is performed may be packaged and used as a component of various applications.

Figure 11:
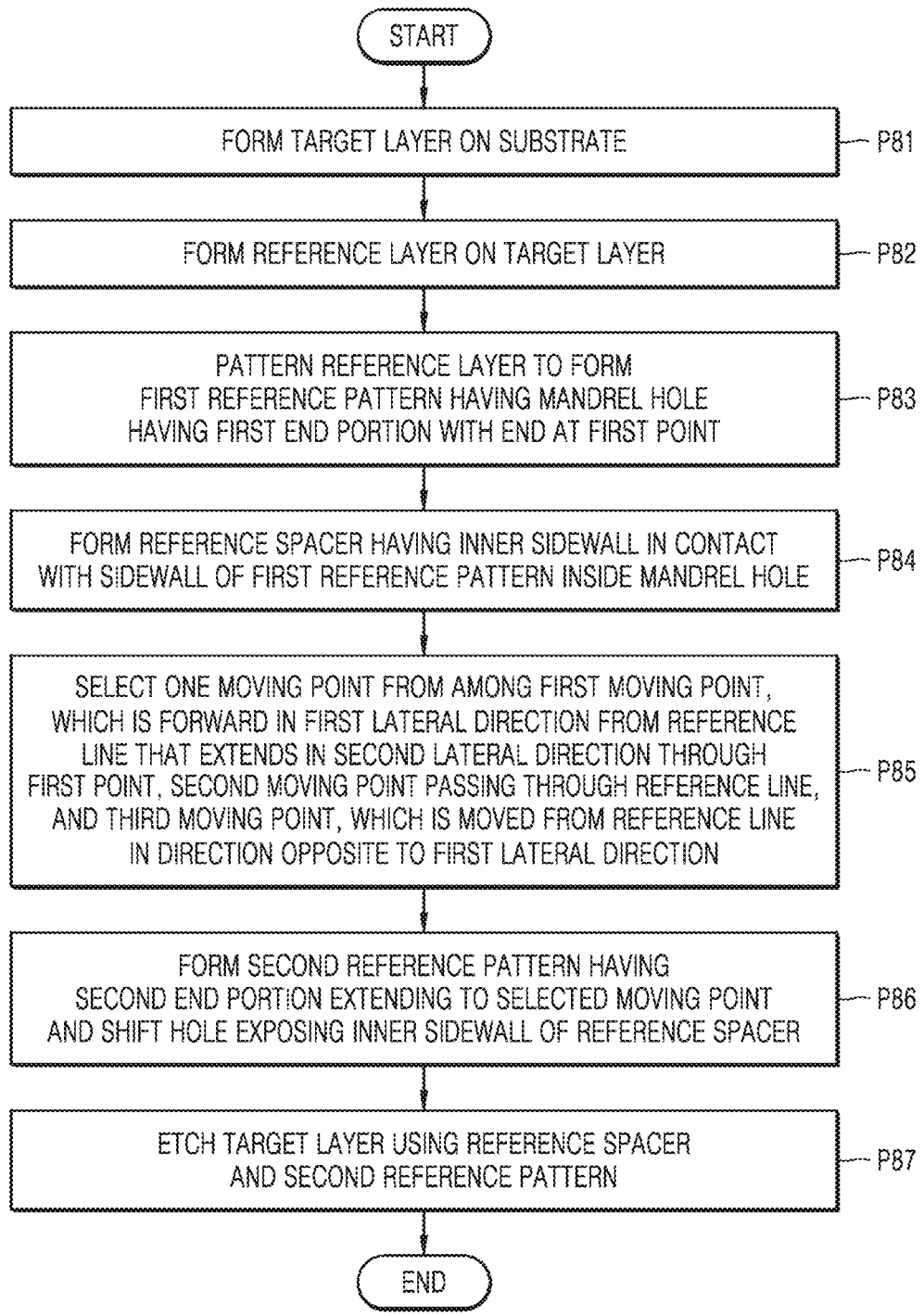
FIGS. 11 and 12 are flowcharts of a method of manufacturing an IC device, according to some example embodiments.
Figure 12:
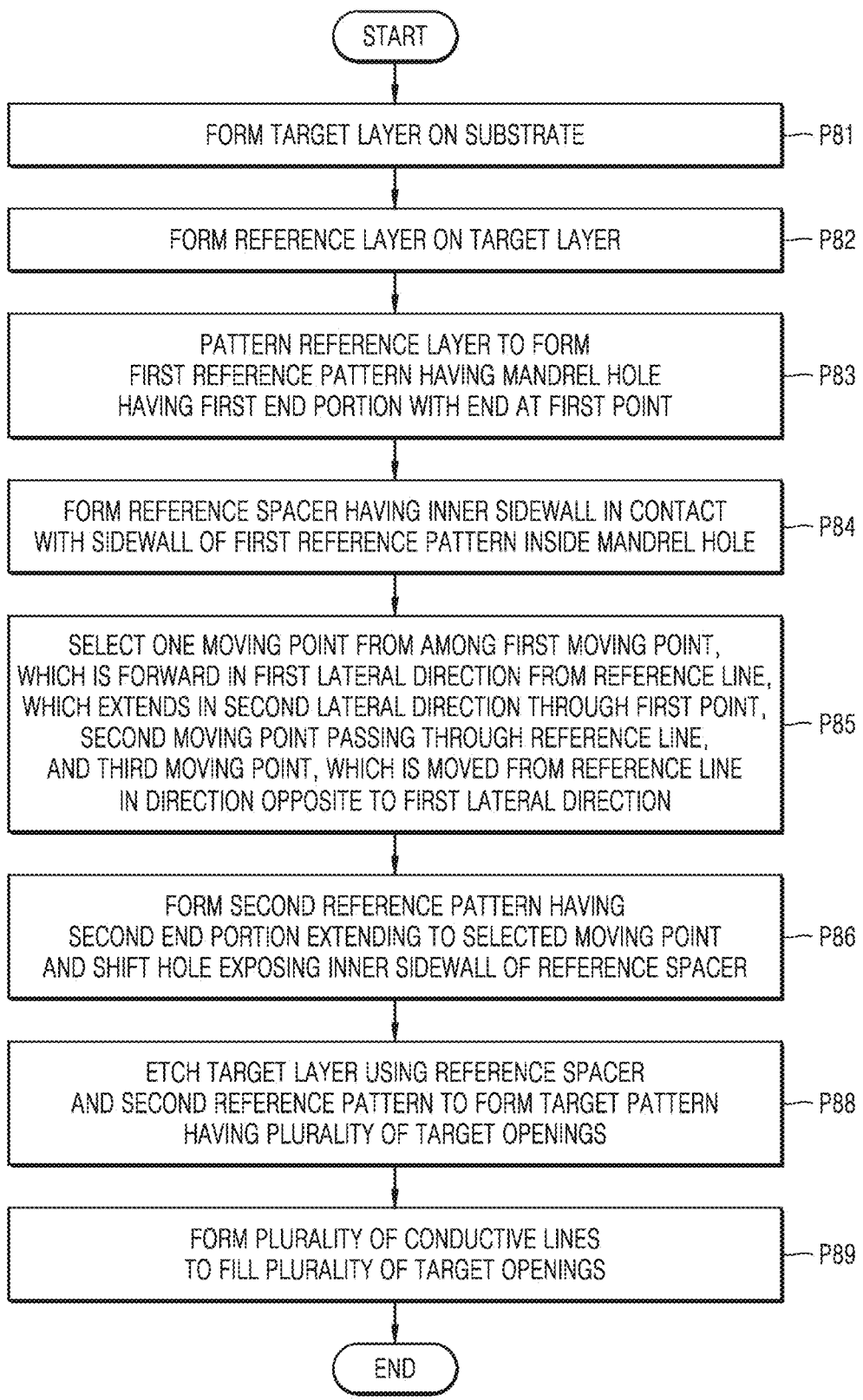

FIGS. 11 and 12 are flowcharts of processes of manufacturing IC devices, according to some example embodiments. Each of the processes shown in FIGS. 11 and 12 may be included in a BEOL process performed according to the process P80 of FIG. 10.

FIGS. 13A to 22A are plan views of a process sequence of a method of manufacturing an IC device, according to some example embodiments. FIGS. 13B to 22B are cross-sectional views taken along lines Y1-Y1' of FIGS. 13A to 22A, respectively; A method of manufacturing the IC device 100 shown in FIG. 1, according to in some example embodiments, will be described with reference to FIGS. 11, 12, and 13A to 22B.

Referring to FIGS. 11, 12, 13A, and 13B, in process P81, a target layer 120 may be formed on a substrate 110.

An FEOL structure 112 obtained in the FEOL process performed according to process P70 of FIG. 10 may be formed on the substrate 110. In this case, the target layer 120 may be formed on the FEOL structure 112. The FEOL structure 112 may include a transistor, a capacitor, and a resistor, without being limited thereto.

The target layer 120 may include a conductive film, a dielectric film, an insulating film, or a combination thereof. In an example, the target layer 120 may include a film including a metal, an alloy, a metal carbide, a metal nitride, a metal oxynitride, a metal oxycarbide, a semiconductor, polysilicon, oxide, nitride, oxynitride, or a combination thereof, without being limited thereto. Alternatively or additionally, the target layer 120 may constitute a hard mask layer. In this case, the target layer 120 may include various film materials depending on the type of the substrate 110. For example, the target layer 120 may include an oxide film, a nitride film, a silicon carbonitride (SiCN) film, a polysilicon film, or a combination thereof. Some example embodiments pertain to an example in which the target layer 120 includes an insulating material. For example, the target layer 120 may include silicon oxide, silicon oxycarbide (SiOC), silicon oxycarbonitride (SiOCN), silicon oxynitride (SiON), silicon carbonitride (SiCN), silicon nitride (SiN), SiCOH, an ultralow-k (ULK) material having an ultralow dielectric constant K of about 2.2 to about 2.4, or a combination thereof.

Figure 13A:
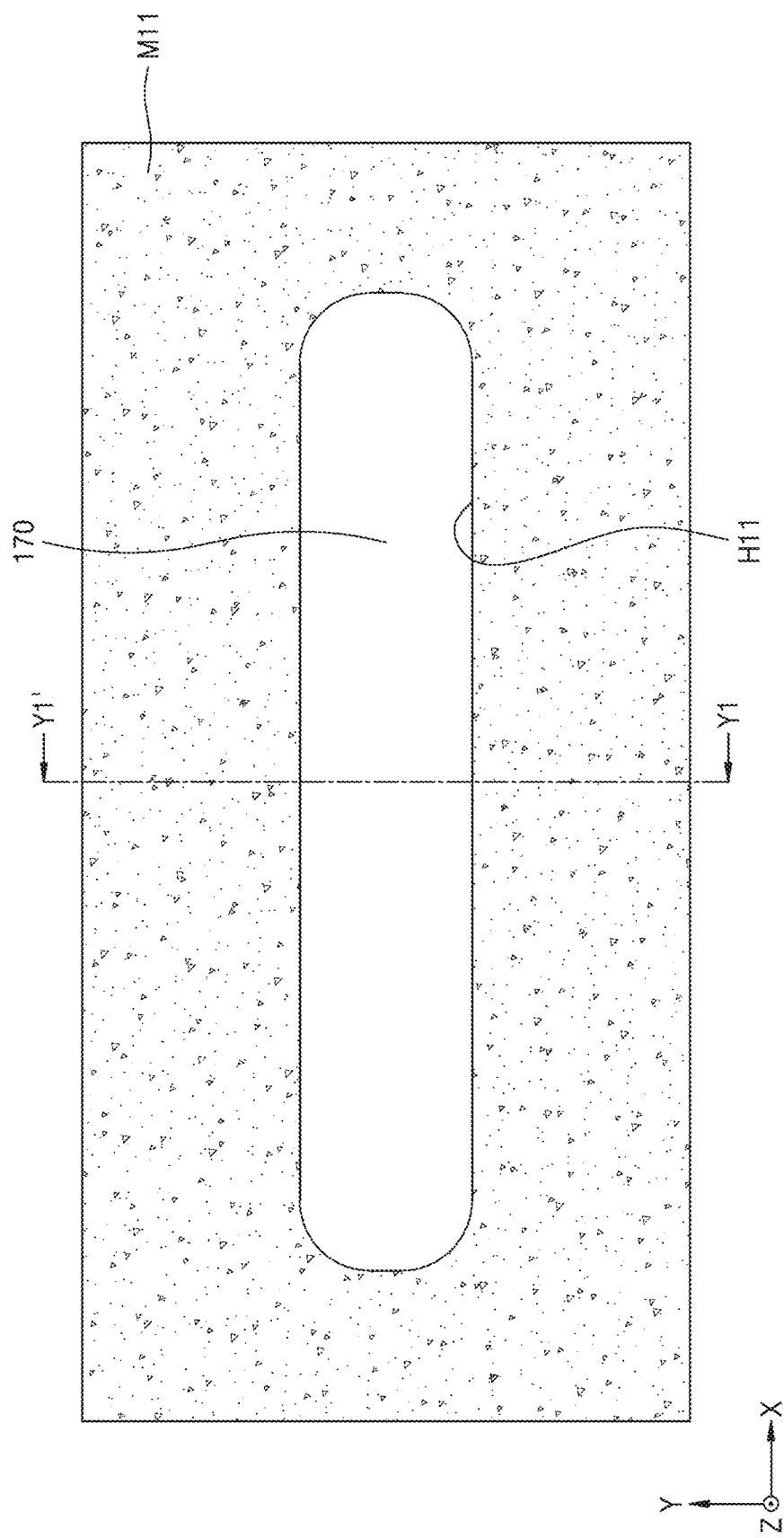
Figure 13B:
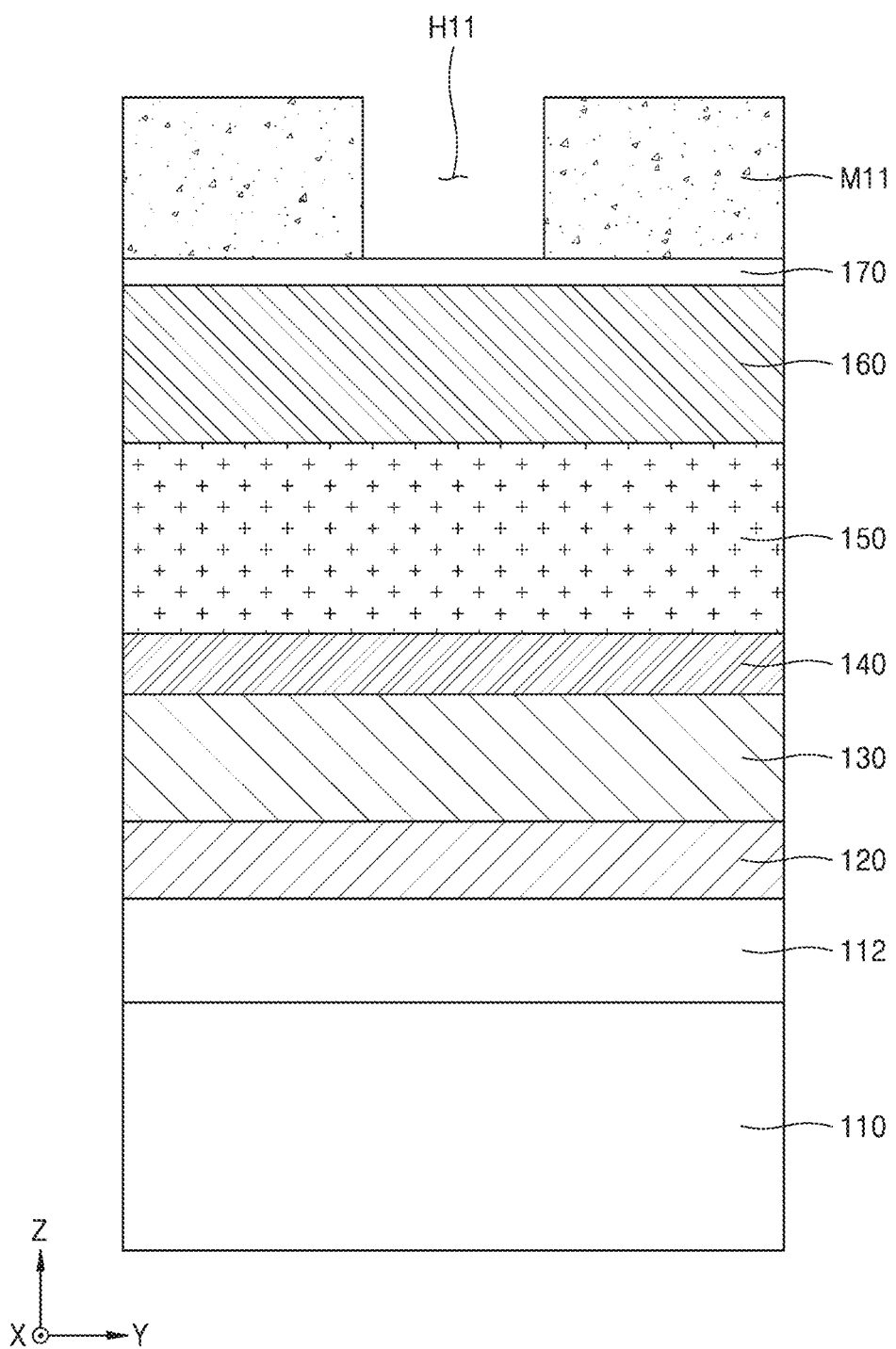
FIGS. 13B, 14B, 15B, 16B, 17B, 18B, 19B, 20B, 21B, and 22B are cross-sectional views taken along lines Y1-Y1' of FIGS. 13A to 22A, respectively.

Referring to FIGS. 11, 12, and 13B, in process P82 of FIG. 11, a reference layer 150 may be formed on the target layer 120.

In some example embodiments, before the reference layer 150 is formed, a lower hard mask layer 130 and a memory layer 140 may be sequentially formed on the target layer 120, and the reference layer 150 may be formed on the memory layer 140. Each of the lower hard mask layer 130, the memory layer 140, and the reference layer 150 may include a material that may be selectively etched with respect to another film adjacent thereto. In some example embodiments, the lower hard mask layer 130 may include titanium nitride (TiN), the memory layer 140 may include tetraethylorthosilicate (TEOS), and the reference layer 150 may include amorphous silicon, without being limited thereto.

Afterwards, as shown in FIG. 13B, a first upper hard mask layer 160, a first anti-reflection film 170, and a first mask pattern M11 may be sequentially formed on the reference layer 150.

In some example embodiments, the first upper hard mask layer 160 may include a carbon-containing film including, for example, a spin-on hardmask (SOH) material. The carbon-containing film including the SOH material may include an organic compound having a relatively high carbon content of about 85% to about 99% by weight, based on a total weight thereof. The organic compound may include a hydrocarbon compound including an aromatic ring or a derivative thereof. The first anti-reflection film 170 may include silicon oxynitride (SiON). The first mask pattern M11 may include a first photoresist pattern.

In some example embodiments, to form the first mask pattern M11, a first photoresist film may be formed on the first anti-reflection film 170, and a partial region of the first photoresist film may be exposed to form a first exposed area and a first non-exposed area. The first exposed area may be removed using a first developer, and thus, the first photoresist pattern including the first non-exposed area may be formed.

The first photoresist film may include a polymer of which polarity increases by the action of an acid. For example, the photoresist pattern may include a polymer including an acid-labile protecting group and chemically amplified photoresist including a photoacid generator (PAG). In some example embodiments, the first photoresist film may include at least one of resist for krypton fluoride (KrF) excimer laser (248 nm), resist for argon fluoride (ArF) excimer laser (193 nm), resist for fluorine ($F_2$) excimer laser (157 nm), or resist for extreme ultraviolet (EUV) (13.5 nm), or resist for other light on the electromagnetic spectrum. The first developer may include a basic water solution. For example, the first developer may include a tetramethyl ammonium hydroxide (TMAH) water solution.

The first mask pattern M11 may have a first opening H11 exposing the first anti-reflection film 170.

Referring to FIGS. 11, 12, 14A, and 14B, in process P83, the reference layer 150 shown in FIGS. 13A and 13B may be patterned, and thus, a first reference pattern 150A having a mandrel hole MH may be formed from the reference layer 150.

To form the first reference pattern 150A, the first anti-reflection film 170, the first upper hard mask layer 160, and the reference layer 150 may be sequentially etched using the first mask pattern M11 as an etch mask in the resultant structure of FIGS. 13A and 13B. The mandrel hole MH of the first reference pattern 150A may have a planar shape corresponding to the first opening H11 shown in FIG. 13A. Both ends of the mandrel hole MH may be respectively referred to as a first point EP1 and a second point EP2 in the first lateral direction (X direction). A top surface of the memory layer 140 may be exposed through the mandrel hole MH.

Figure 14A:
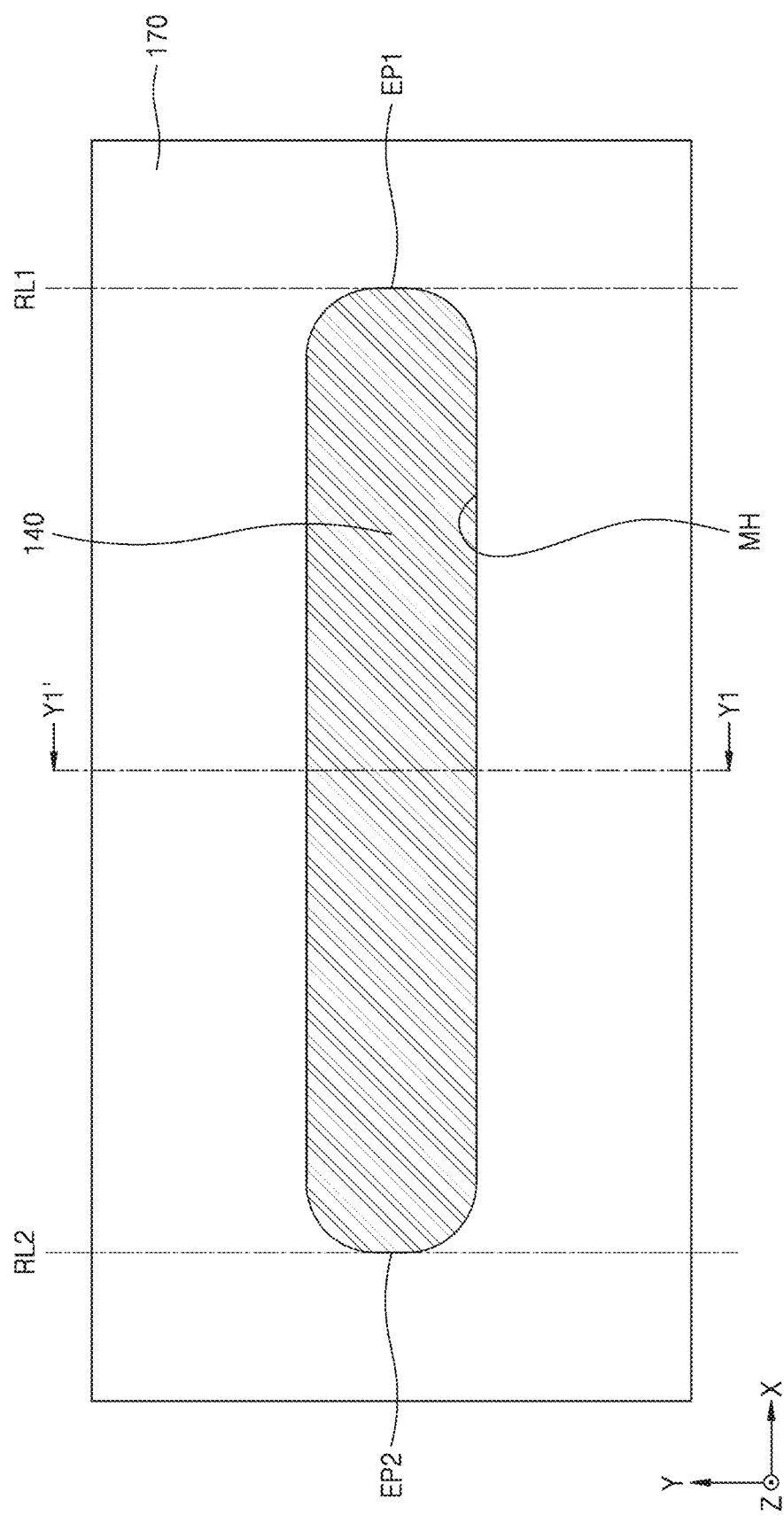
Figure 14B:
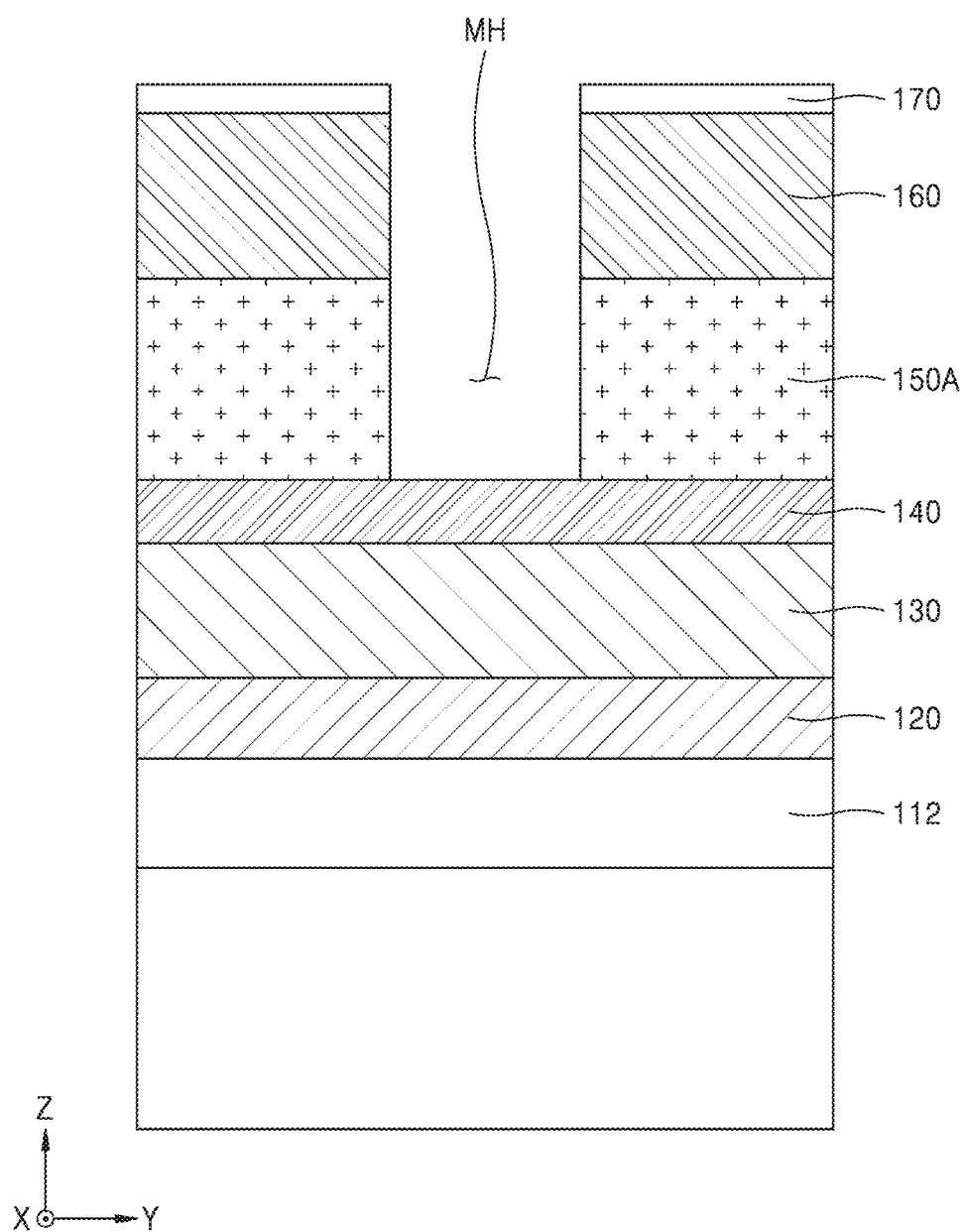

Referring to FIGS. 11, 12, 15A, and 15B, in process P84, unnecessary and/or unused materials may be removed from the resultant structure of FIGS. 14A and 14B to expose a top surface of the first reference pattern 150A. Thereafter, a reference spacer 152 having an inner sidewall in contact with a sidewall of the first reference pattern 150A may be formed inside the mandrel hole MH of the first reference pattern 150A.

A line-type space extending long in the first lateral direction (X direction) may be defined by the reference spacer 152 inside the mandrel hole MH. The top surface of the memory layer 140 may be exposed through an inner space of the reference spacer 152 inside the mandrel hole MH.

In some example embodiments, to form the reference spacer 152, a spacer film may be formed to conformally cover a sidewall and a top surface of the first reference pattern 150A. Thereafter, the spacer film may be etched, and thus, the reference spacer 152 may be left in the inner space of the mandrel hole MH. The reference spacer 152 may include silicon oxide, without being limited thereto.

Figure 15B:
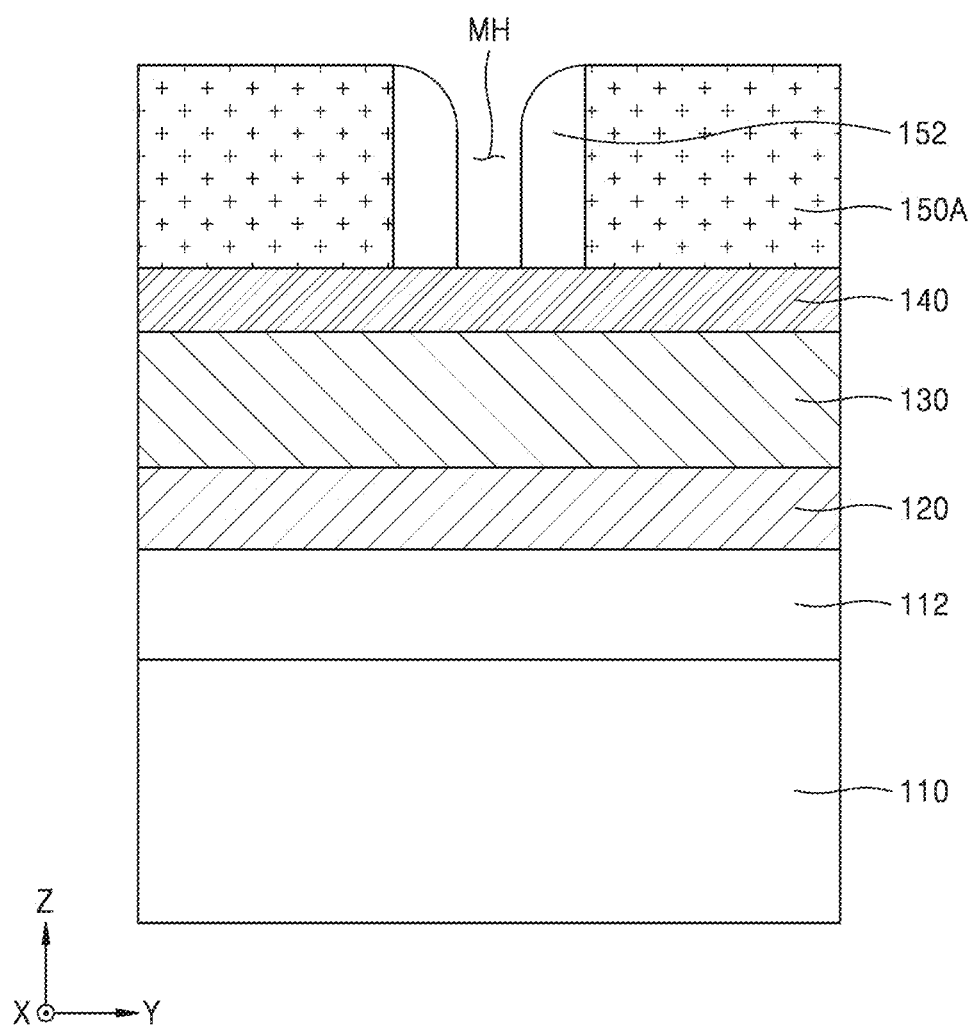

Referring to FIGS. 11 and 12, in process P85, in the resultant structure of FIGS. 15A and 15B, one moving point may be selected from a first moving point, a second moving point, and a third moving point. The first moving point may be a point, which is forward (rightward in FIG. 14A) of the first lateral direction (X direction) from reference lines RL1 and RL2 that extend in the second lateral direction (Y direction) through the first point EP1 or the second point EP2 (refer to FIG. 15A) of the mandrel hole MH. The second moving point may pass through the reference lines RL1 and RL2, and the third moving point may be a point, which is backward (leftward in FIG. 14A) in the first lateral direction (X direction) from the reference lines RL1 and RL2.

Figure 16A:
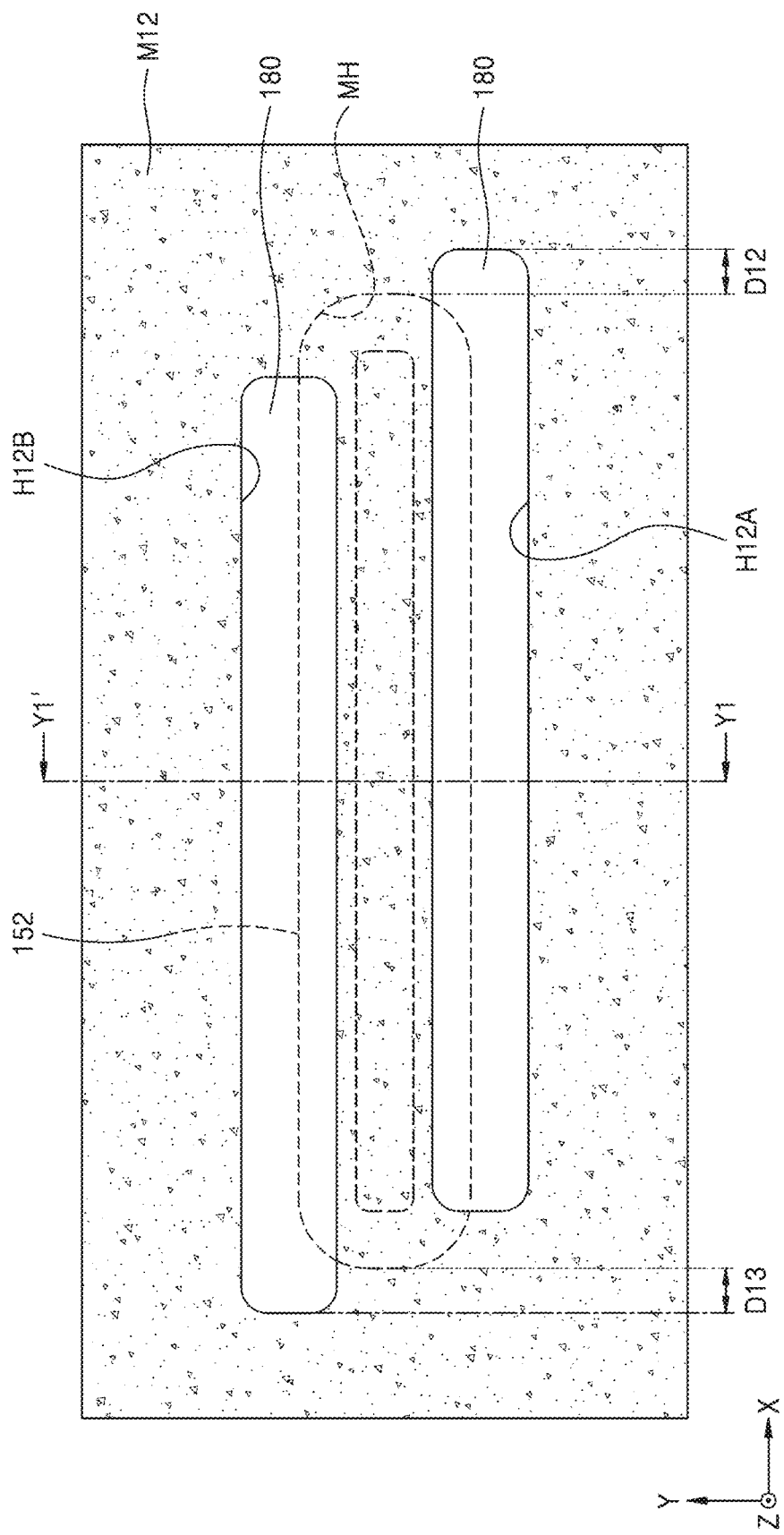
Figure 16B:
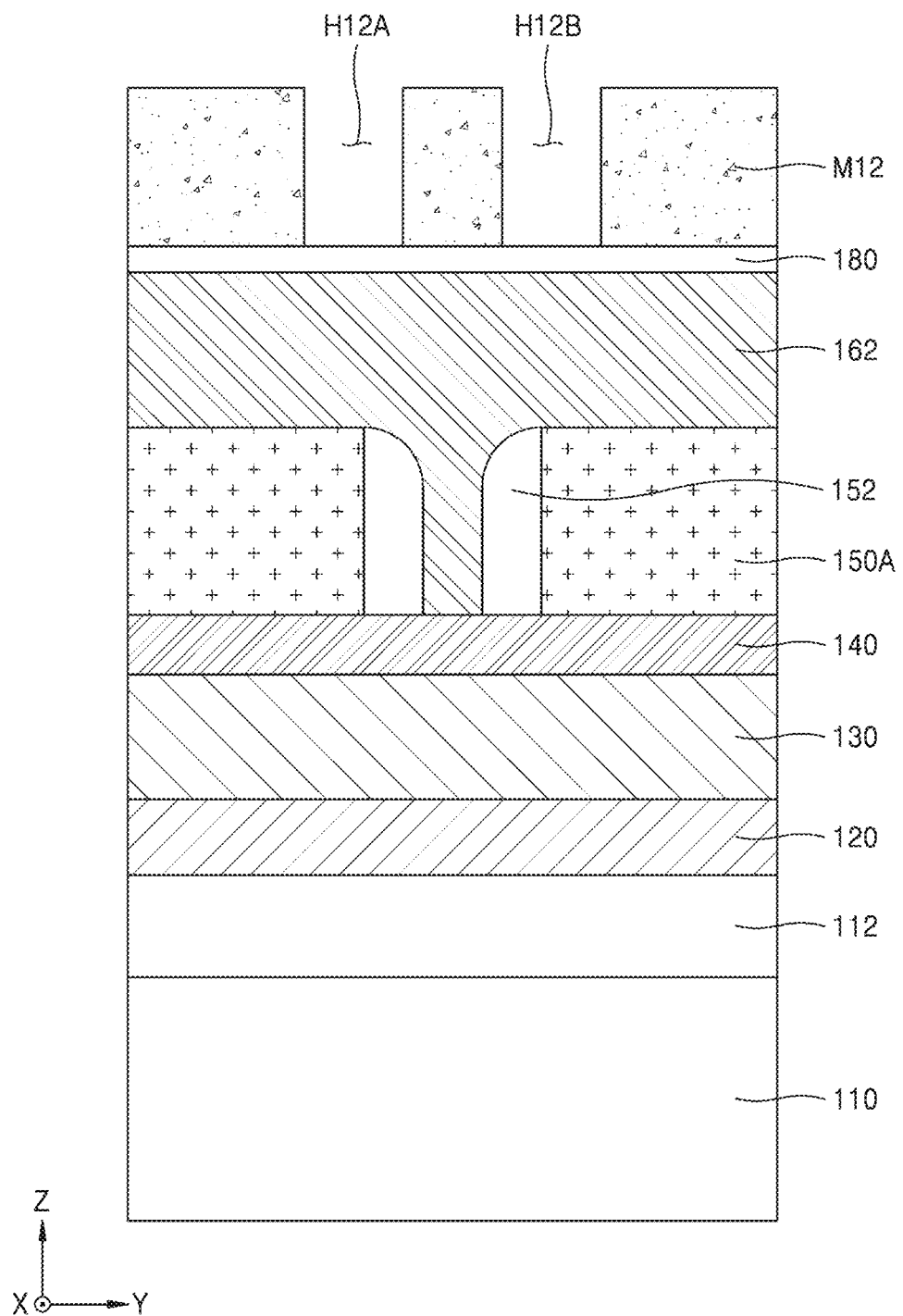

Referring to FIGS. 16A and 16B, a second upper hard mask layer 162, a second anti-reflection film 180, and a second mask pattern M12 may be sequentially formed on the resultant structure of FIGS. 15A and 15B.

In some example embodiments, a constituent material of the second upper hard mask layer 162 and the second anti-reflection film 180 may be the same as a material of the first upper hard mask layer 160 and the first anti-reflection film 170, which has been described with reference to FIGS. 13A and 13B. The second mask pattern M12 may include a second photoresist pattern.

In some example embodiments, to form the second mask pattern M12, a second photoresist film may be formed on the second anti-reflection film 180, and a partial region of the second photoresist film may be exposed to form a second exposed area and a second non-exposed area. The second non-exposed area may be removed using a second developer, and thus, the second photoresist pattern including the second exposed area may be formed.

The second photoresist film may have the same configuration as the first photoresist film described with reference to FIGS. 13A and 13B. The second developer may include a negative tone developer. For example, the second developer may include at least one of an organic solvent, such as at least one of n-butyl acetate (nBA), propylene glycol methyl ether (PGME), propylene glycol methyl ether acetate (PGMEA), γ-butyrolactone (GBL), and isopropanol (IPA), without being limited thereto.

The second mask pattern M12 may be formed to have first and second shift mask holes H12A and H12B of which positions are determined according to a moving point selected using the same method as in the process P85 of FIGS. 11 and 12. The first and second shift mask holes H12A and H12B may be at posits shifted from the mandrel hole MH (refer to FIGS. 15A and 15B) of the first reference pattern 150A in at least one of the first lateral direction (X direction) and the second lateral direction (Y direction). For example, as shown in FIG. 16A, the first shift mask hole H12A may be formed at a position, which is shifted by a first distance D12 in a direction away from the mandrel hole MH (refer to FIGS. 15A and 15B) of the first reference pattern 150A in the first lateral direction (X direction) and overlaps a portion of the reference spacer 152 in a vertical direction (Z direction). The second shift mask hole H12B may be formed at a position, which is shifted by a second distance D13 in a direction away from the mandrel hole MH (refer to FIGS. 15A and 15B) of the first reference pattern 150A in the first lateral direction (X direction) and overlaps a portion of the reference spacer 152 in the vertical direction (Z direction). The second anti-reflection film 180 may be exposed through the first and second shift mask holes H12A and H12B.

Referring to FIGS. 11, 12, 17A, and 17B, in process P86, a second reference pattern 150B having a plurality of shift holes SH may be formed from the first reference pattern 150A shown in FIGS. 16A and 16B. Each of the plurality of shift holes SH may have an end portion extending to a moving point selected in process P85 of FIGS. 11 and 12. An inner sidewall of the reference spacer 152 may be exposed through the plurality of shift holes SH. The plurality of shift holes SH may extend parallel to the mandrel hole MH (refer to FIGS. 14A to 15B) in the first lateral direction (X direction). The plurality of shift holes SH may include a pair of shift holes SH, which are respectively on both sides of the reference spacer 152 in the second lateral direction (Y direction). To form the second reference pattern 150B, the second anti-reflection film 180, the second upper hard mask layer 162, and the first reference pattern 150A may be sequentially etched using the second mask pattern M12 as an etch mask in the resultant structure of FIGS. 16A and 16B. A top surface of the memory layer 140 may be exposed through the plurality of shift holes SH formed in the second reference pattern 150B.

Figure 17B:
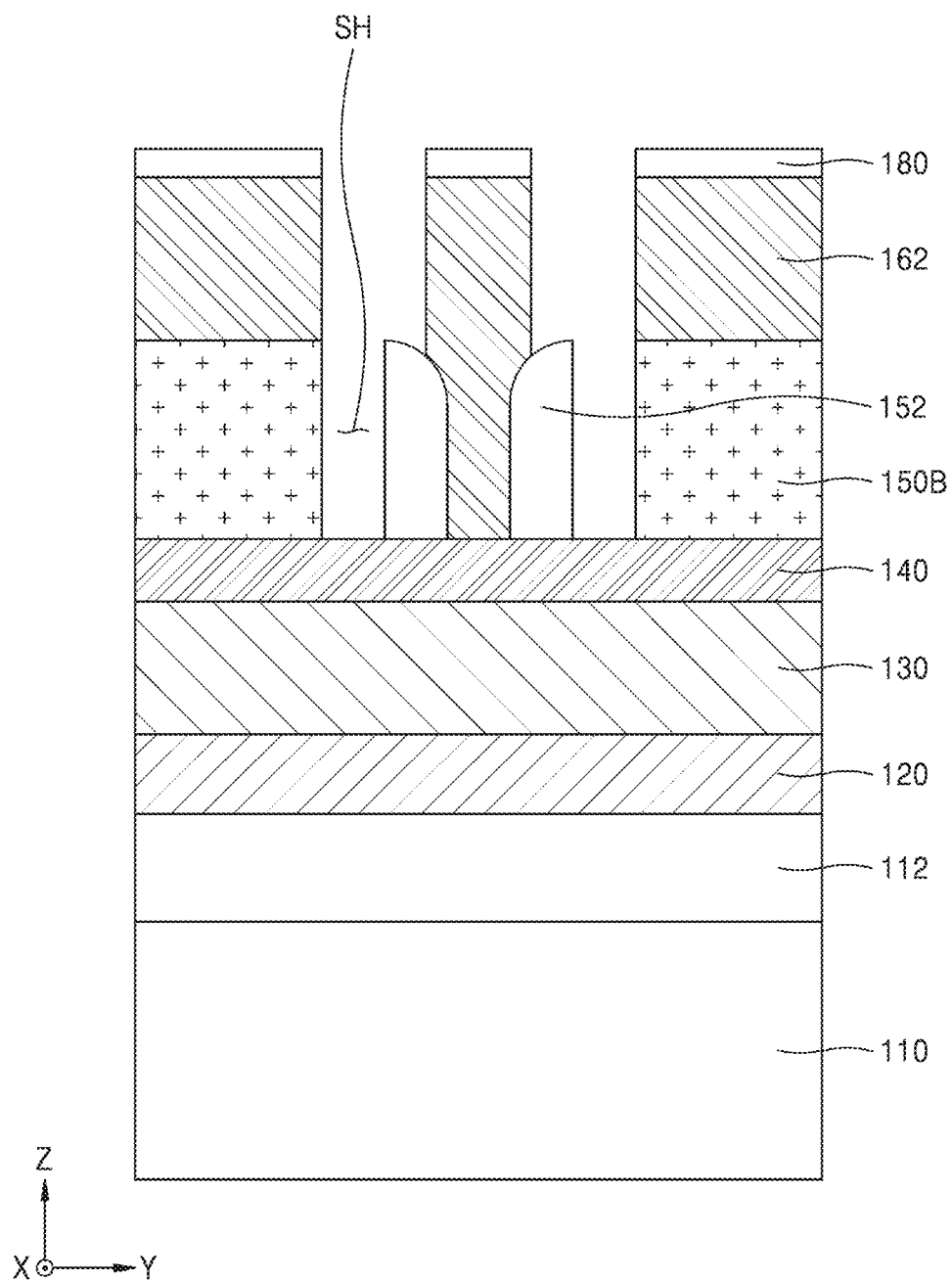
Figure 18A:
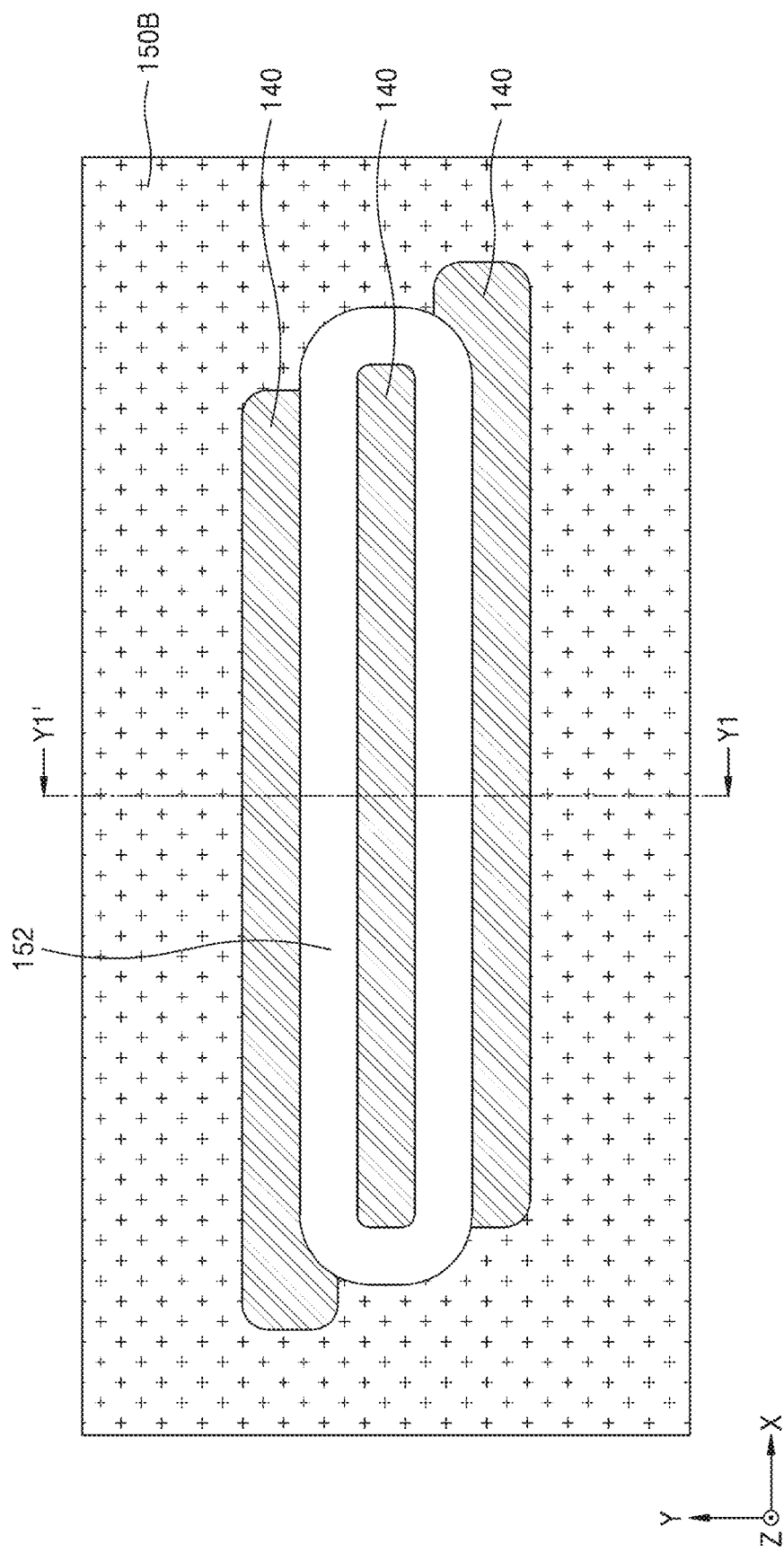
Figure 18B:
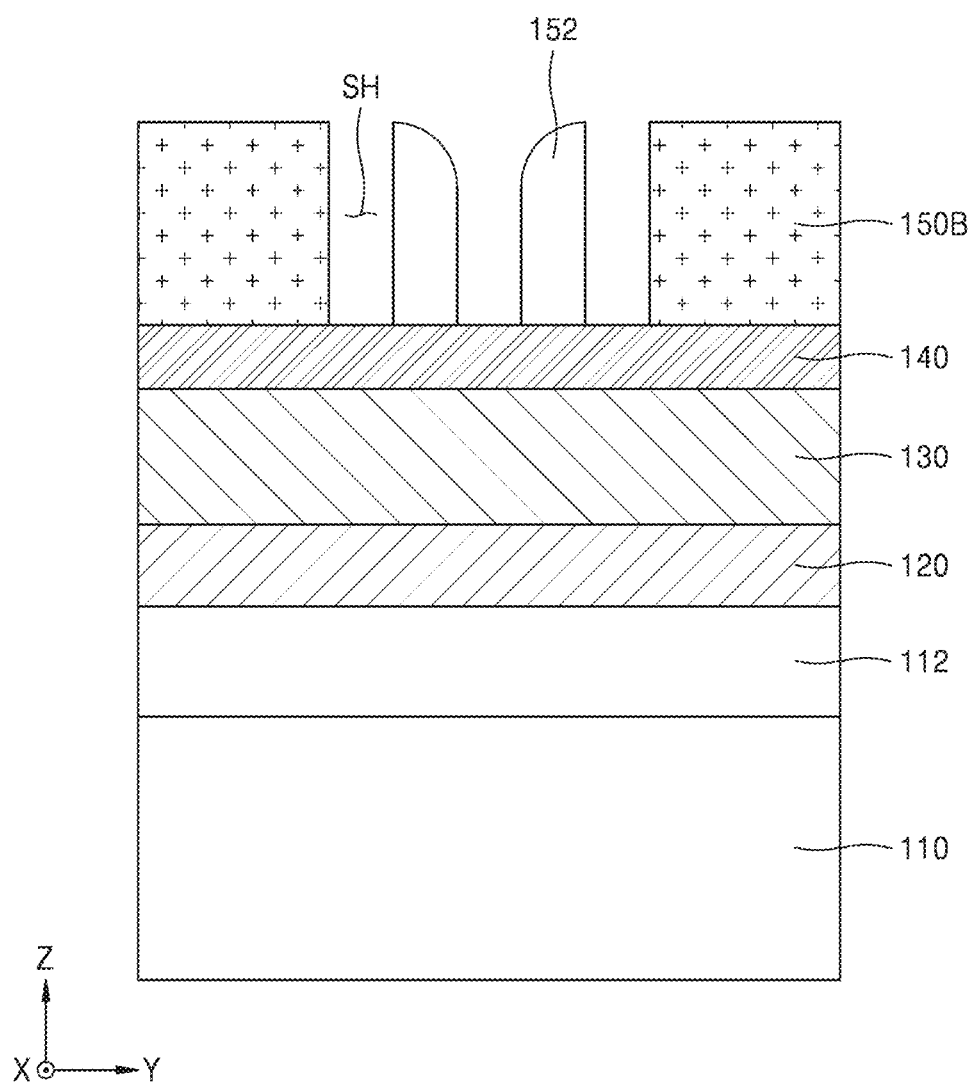

Referring to FIGS. 18A and 18B, the second anti-reflection film 180 and the second upper hard mask layer 162 may be removed from the resultant structure of FIGS. 17A and 17B, thereby exposing respective top surfaces of the reference spacer 152 and the second reference pattern 150B.

Figure 21B:
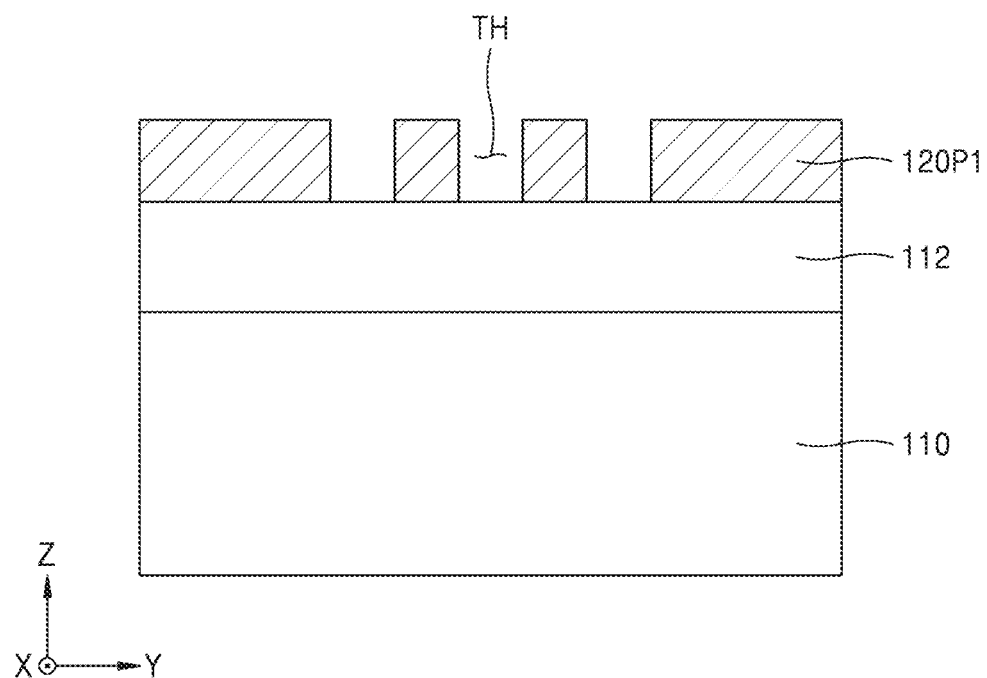

In process P87 of FIG. 11 and process P88 of FIG. 12, the target layer 120 may be etched using the reference spacer 152 and the second reference pattern 150B in the resultant structure of FIGS. 18A and 18B, and thus, a target pattern 120P1 shown in FIGS. 21A and 21B may be formed.

Figure 19B:
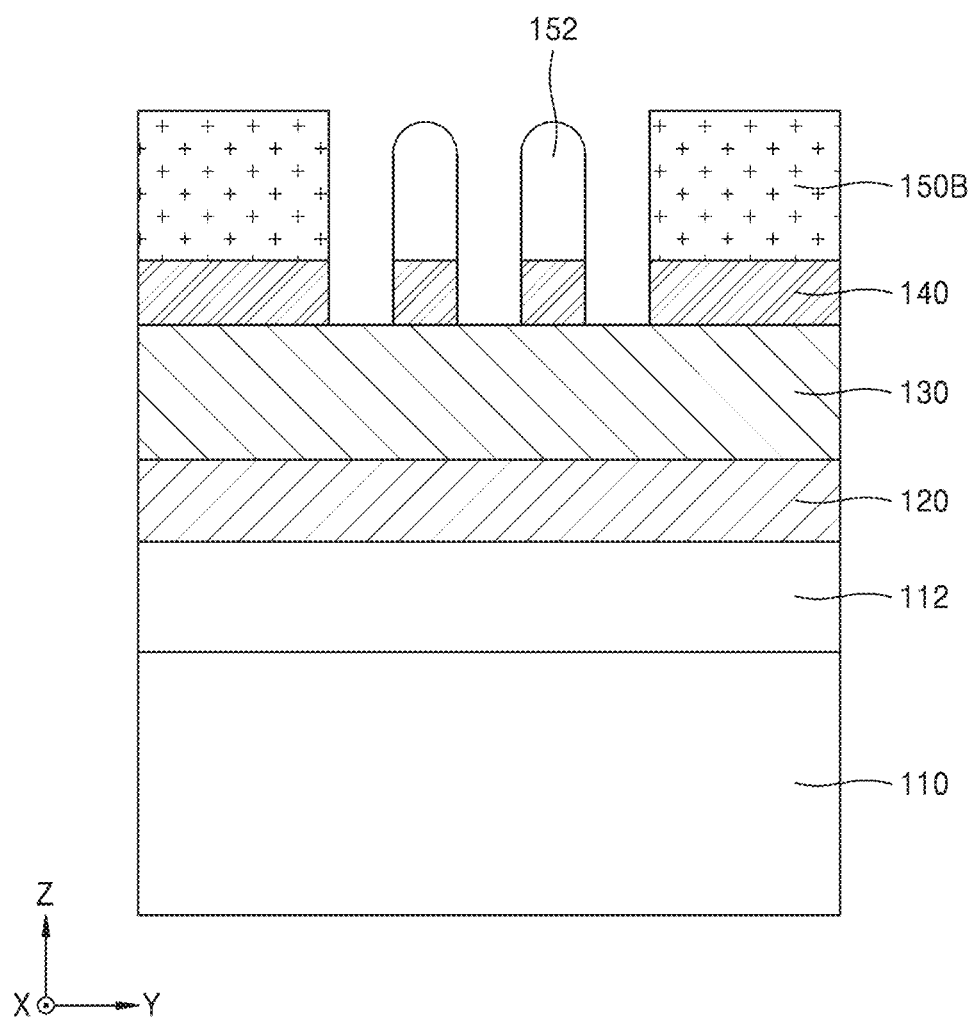
Figure 20B:
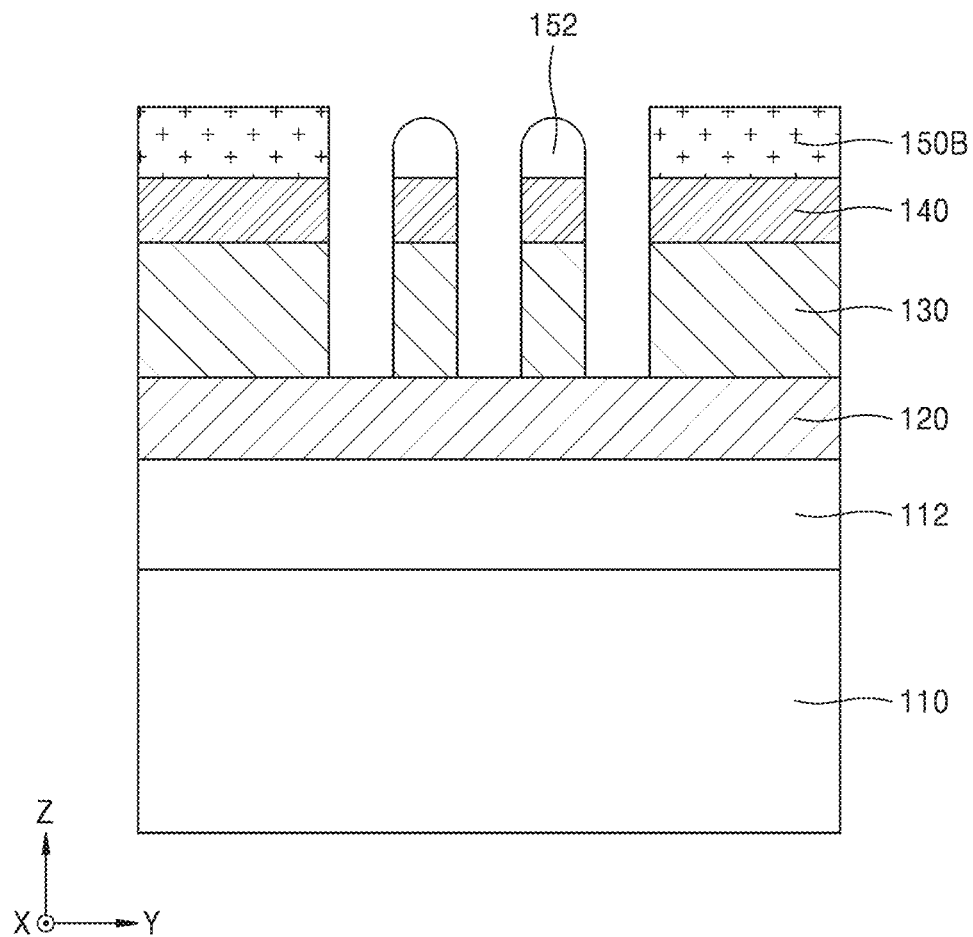

A process of forming the target pattern 120P1 will now be described in further detail. The memory layer 140 may be etched using the reference spacer 152 and the second reference pattern 150B as an etch mask in the resultant structure of FIGS. 18A and 18B as shown in FIGS. 19A and 19B. The lower hard mask layer 130 may be etched using residue of each of the reference spacer 152, the second reference pattern 150B, and the memory layer 140 as an etch mask in the resultant structure of FIGS. 19A and 19B as shown in FIGS. 20A and 20B. The target layer 120 may be etched using residue of each of the reference spacer 152, the second reference pattern 150B, the memory layer 140, and the lower hard mask layer 130, which remains in the resultant structure of FIGS. 20A and 20B, as an etch mask. Thus, the target pattern 120P1 shown in FIGS. 21A and 21B may be formed. The target pattern 120P1 may have a plurality of target openings TH exposing the FEOL structure 112.

Figure 22A:
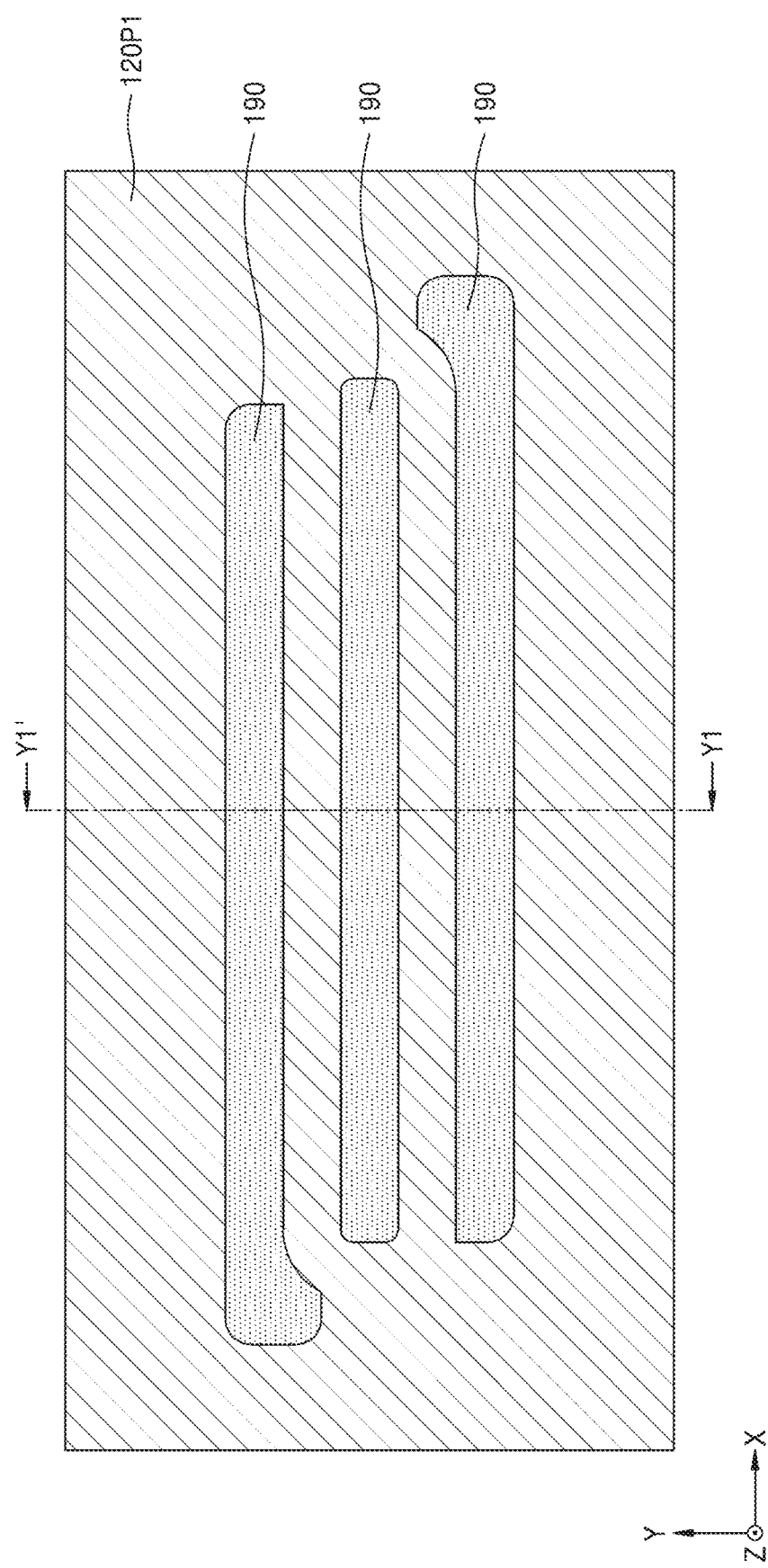
Figure 22B:
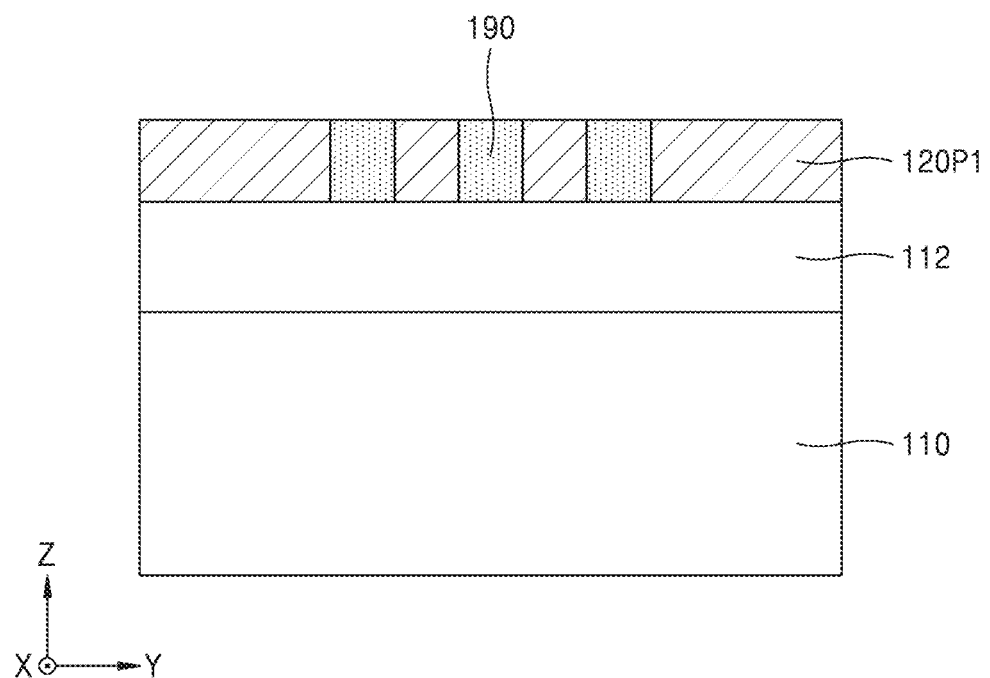

Referring to FIGS. 12, 22A, and 22B, in process P89, a plurality of conductive lines 190 may be formed to fill the plurality of target openings TH formed in the target pattern 120P1.

The plurality of conductive lines 190 may include a first conductive line C11, a second conductive line C12, and a third conductive line C13, which are shown in FIG. 1. The first conductive line C11 may have a planar shape corresponding to a region defined by the reference spacer 152 shown in FIGS. 15A and 15B. The second conductive line C12 and the third conductive line C13 may have a planar shape corresponding to a region excluding a portion of the shift hole SH of FIGS. 17A and 17B, which overlaps the reference spacer 152, and include the bulging end portions C12P and C13P (refer to FIG. 1) having ends of which positions are determined according to a moving point selected using the same method as in the process P85 of FIGS. 11 and 12.

Figure 23:
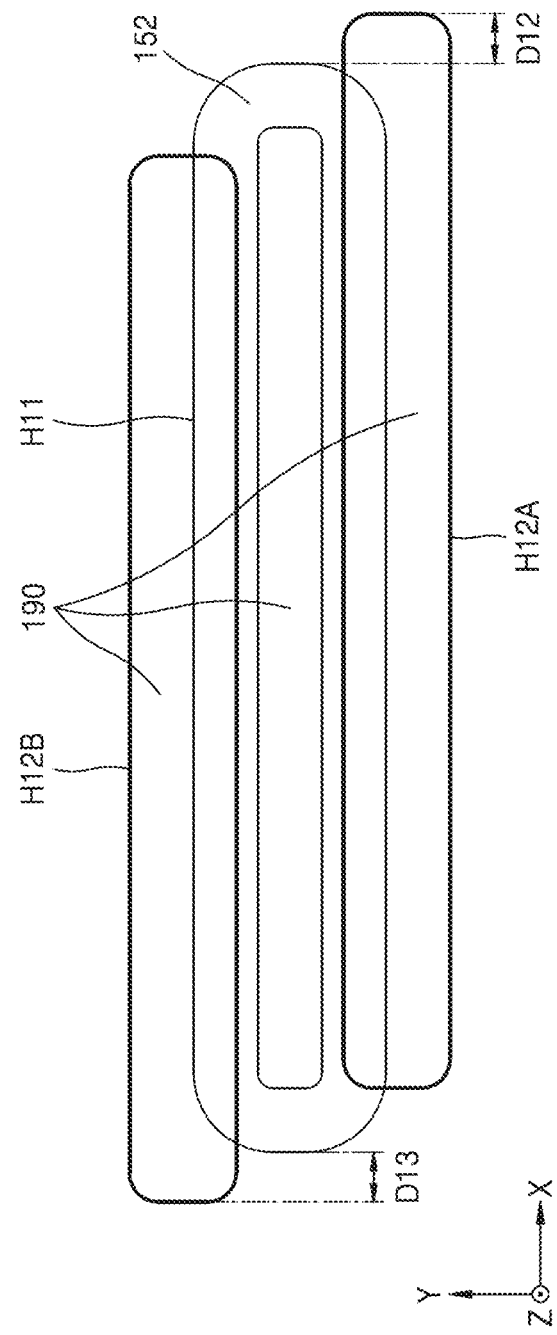
FIG. 23 is a detailed plan view of respective positions of a plurality of conductive lines obtained using the method of manufacturing the IC device, which has been described with reference to FIGS. 13A to 22B.

FIG. 23 is a plan view for explaining a relationship between respective positions of the first opening H11 of the first mask pattern M11 and the first and second shift mask holes H12A and H12B of the second mask pattern M12 and respective positions of the plurality of conductive lines 190, which are used in the method of manufacturing the IC device 100, which has been described with reference to FIGS. 13A to 22B.

Referring to FIG. 23, the first shift mask hole H12A may be formed at a position, which is shifted by a first distance D12 from the first opening H11 of the first mask pattern M11 forward (rightward in FIG. 23) in the first lateral direction (X direction) and overlaps a portion of the reference spacer 152 in a vertical direction (Z direction). The second shift mask hole H12B may be formed at a position, which is shifted by a second distance D13 backward (leftward in FIG. 23) in the first lateral direction (X direction) from the first opening H11 of the first mask pattern M11 and overlaps a portion of the reference spacer 152 in the vertical direction (Z direction).

A plurality of conductive lines 190 may be formed in a first region defined by the reference spacer 152 inside the first opening H11 of the first mask pattern M11, a second region excluding a portion of the first shift mask hole H12A, which overlaps the reference spacer 152, and a third region excluding a portion of the second shift mask hole H12B, which overlaps the reference spacer 152.

The method of manufacturing the IC device 100, which has been described with reference to FIGS. 13A to 23 according to the example embodiment, pertains to an example in which the plurality of conductive lines 190 are formed to fill the plurality of target openings TH formed in the target pattern 120P1 as described with reference to FIGS. 22A and 22B, but inventive concepts is not limited thereto. For example, in the process described with reference to FIGS. 13A and 13B, a conductive layer for forming a conductive line and an insulating hard mask layer may be sequentially formed instead of the target layer 120 on the FEOL structure 112, and the lower hard mask layer 130 may be formed on the insulating hard mask layer. In some example embodiments, the conductive layer for forming the conductive line may include copper (Cu), tungsten(W), ruthenium (Ru), titanium (Ti), tantalum (Ta), or a combination thereof. The insulating hard mask layer may include silicon nitride. Next, the processes described with reference to FIGS. 14A to 20B may be performed up to etching the lower hard mask layer 130. Thereafter, the insulating had mask layer may be etched using residue of each of the reference spacer 152, the second reference pattern 150B, the memory layer 140, and the lower hard mask layer 130 shown in FIGS. 20A and 20B as an etch mask to form a plurality of hard mask openings in the insulating hard mask layer. The plurality of hard mask openings may be filled with a plurality of reverse patterns, and a conductive layer for forming the conductive line may be etched using the reverse pattern as an etch mask. Thus, a plurality of conductive lines having planar shapes corresponding to the plurality of conductive lines 190 shown in FIGS. 22A and 22B may be formed from the conductive for forming the conductive line.

Figure 24A:
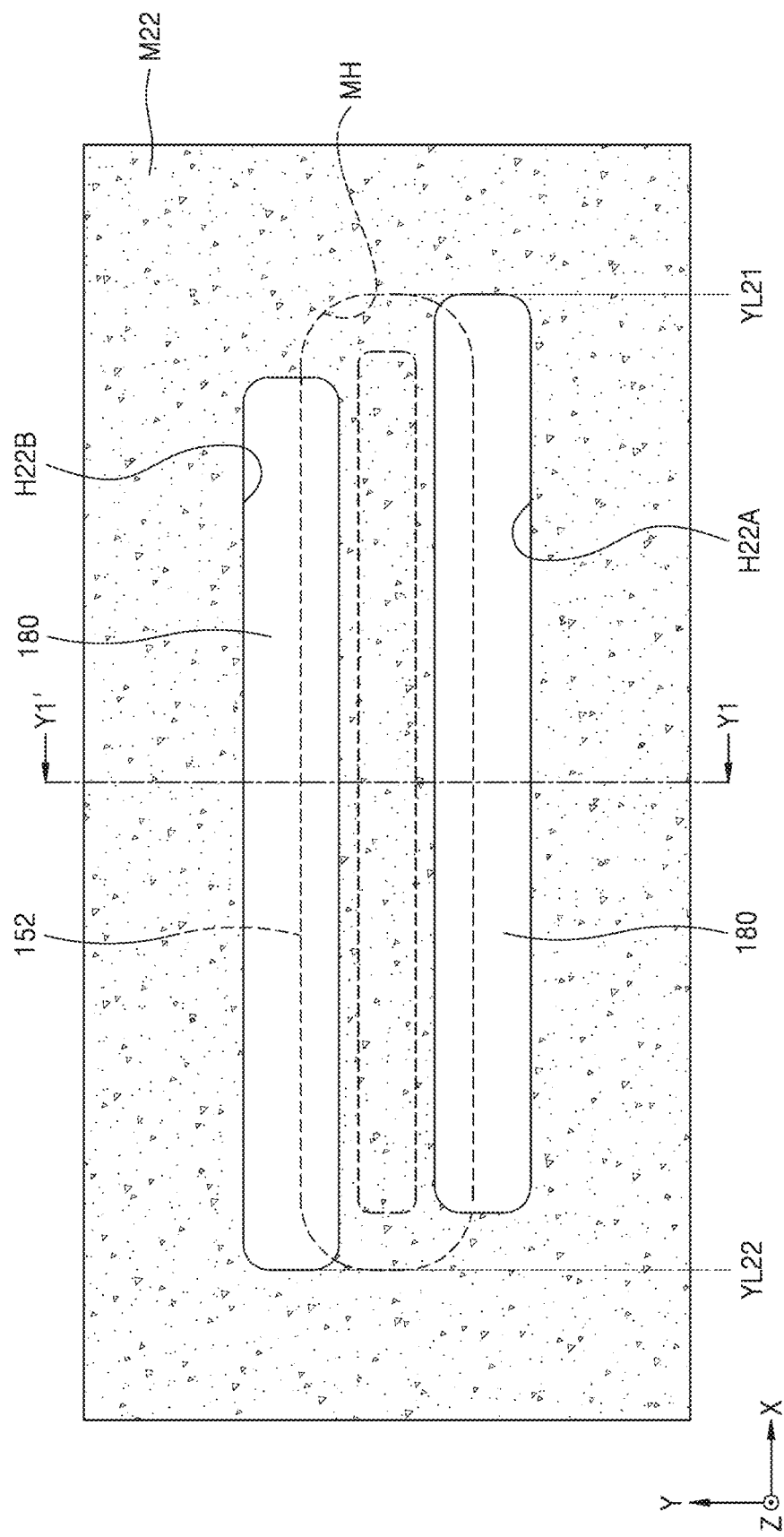
FIGS. 24A and 25A are plan views of an IC device during a process of a method of manufacturing the IC device, according to some example embodiments.
Figure 24B:
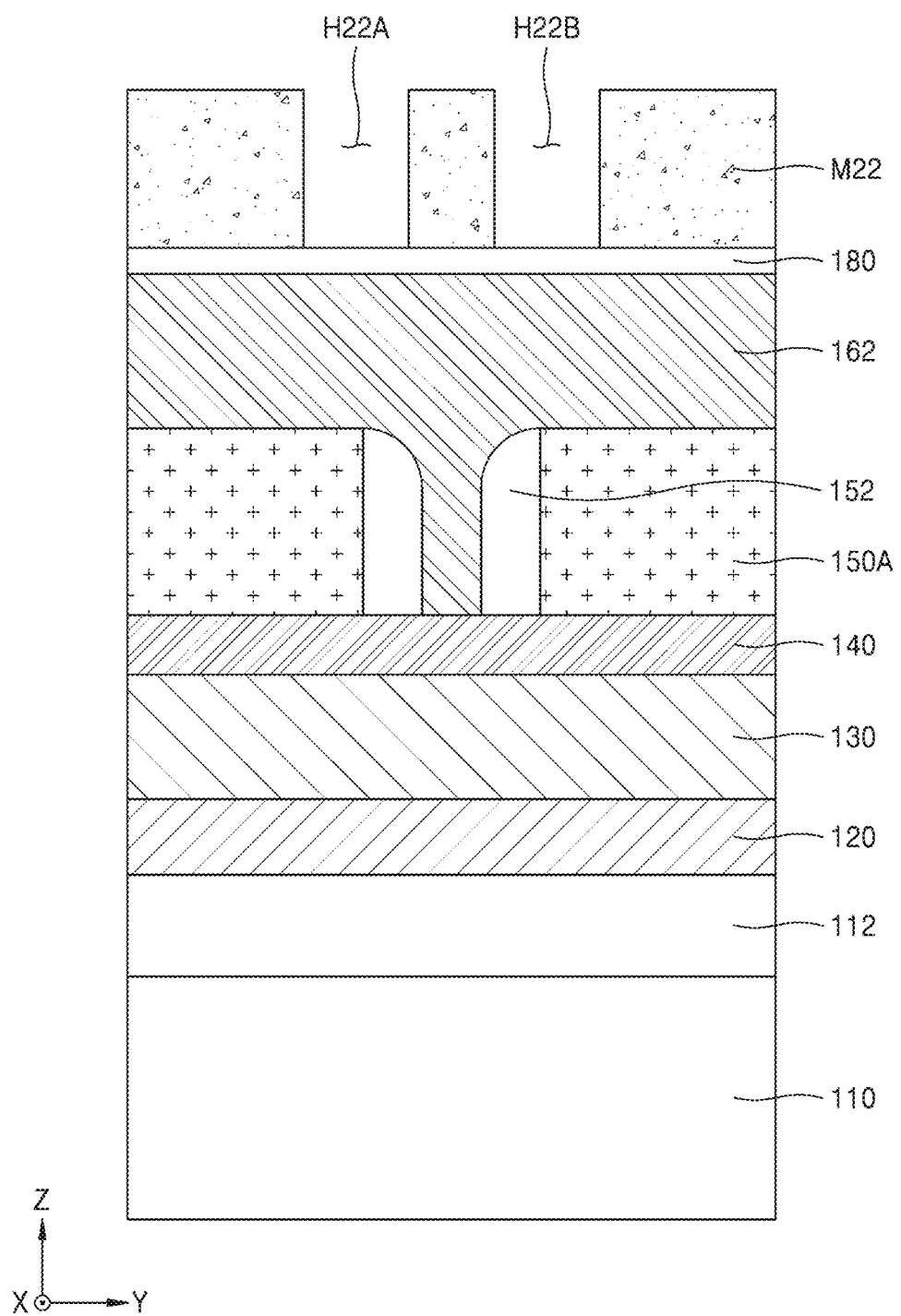
FIGS. 24B and 25B are cross-sectional views taken along lines Y1-Y1' of FIGS. 24A and 25A, respectively.
Figure 25A:
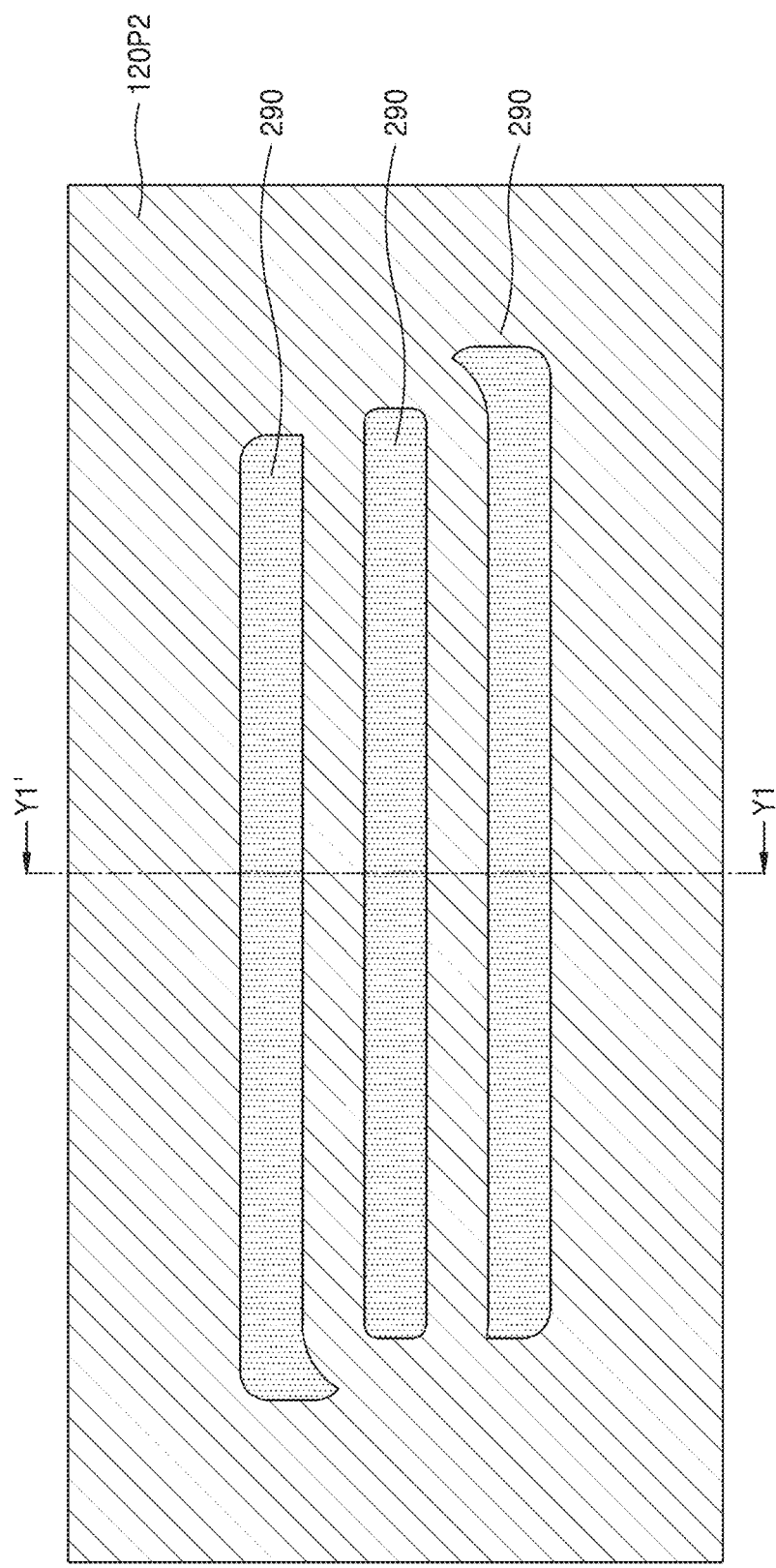
Figure 25B:
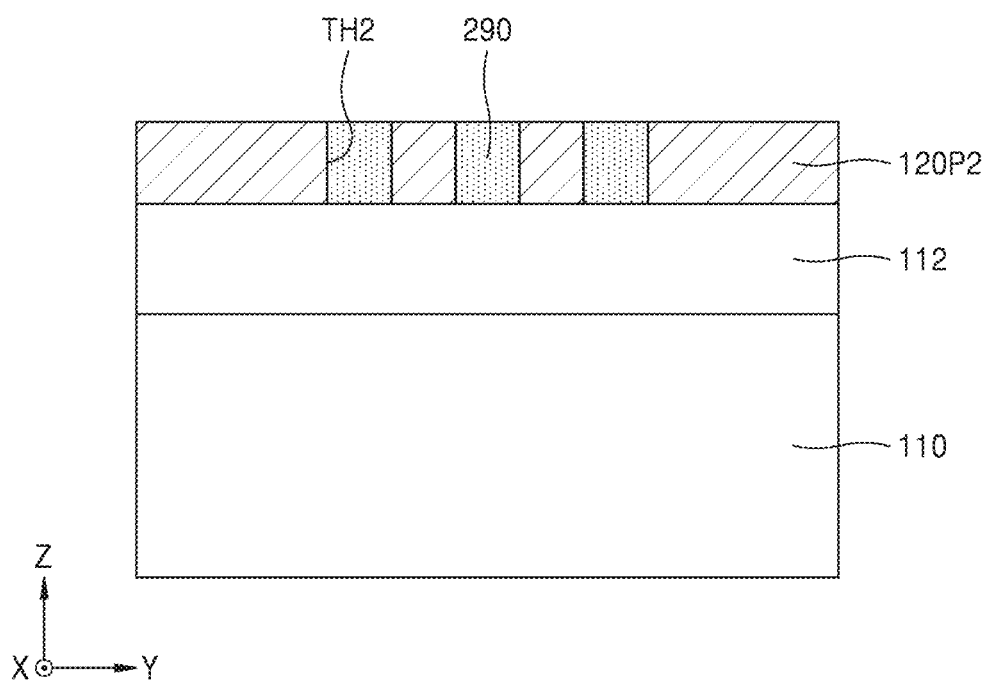

FIGS. 24A and 25A are plan views of a process sequence of a method of manufacturing an IC device, according to some example embodiments. FIGS. 24B and 25B are cross-sectional views taken along lines Y1-Y1' of FIGS. 24A and 25A, respectively. A method of manufacturing the IC device 200 shown in FIG. 2, according to in some example embodiments, will be described with reference to FIGS. 24A to 25B.

Referring to FIGS. 24A and 24B, the processes described with reference to FIGS. 13A to 16B may be performed. However, a second mask pattern M22 may be formed instead of the second mask pattern M12 in the processes described with reference to FIGS. 16A and 16B.

The second mask pattern M22 may have substantially the same configuration as the second mask pattern M12 described with reference to FIGS. 16A and 16B. However, the second mask pattern M22 may be formed to have first and second shift mask holes H22A and H22B of which positions are determined according to a moving point selected using the same method as in the process P85 of FIGS. 11 and 12. For example, as shown in FIG. 24A, one end of the first shift mask hole H22A and one end of the mandrel hole MH (refer to FIGS. 15A and 15B) of the first reference pattern 150A may be on a first straight line YL21 that follows the second lateral direction (Y direction), and a portion of the first shift mask hole H22A may overlap a portion of the reference spacer 152 in a vertical direction (Z direction). The other end of the second shift mask hole H22B and the other end of the mandrel hole MH (refer to FIGS. 15A and 15B) of the first reference pattern 150A may be on a second straight line YL22 that follows the second lateral direction (Y direction). A portion of the second shift mask hole H22B may overlap a portion of the reference spacer 152 in the vertical direction (Z direction).

Referring to FIGS. 25A and 25B, processes that are similar to those described with reference to FIGS. 17A to 22B may be performed on the resultant structure of FIGS. 24A and 24B. Thus, a target pattern 120P2 having a plurality of target openings TH2 may be formed, and a plurality of conductive lines 290 may be formed to fill the plurality of target openings TH2 of the target pattern 120P2. The plurality of conductive lines 290 may include a first conductive line C11, a second conductive line C22, and a third conductive line C23, which are shown in FIG. 2.

Figure 26:
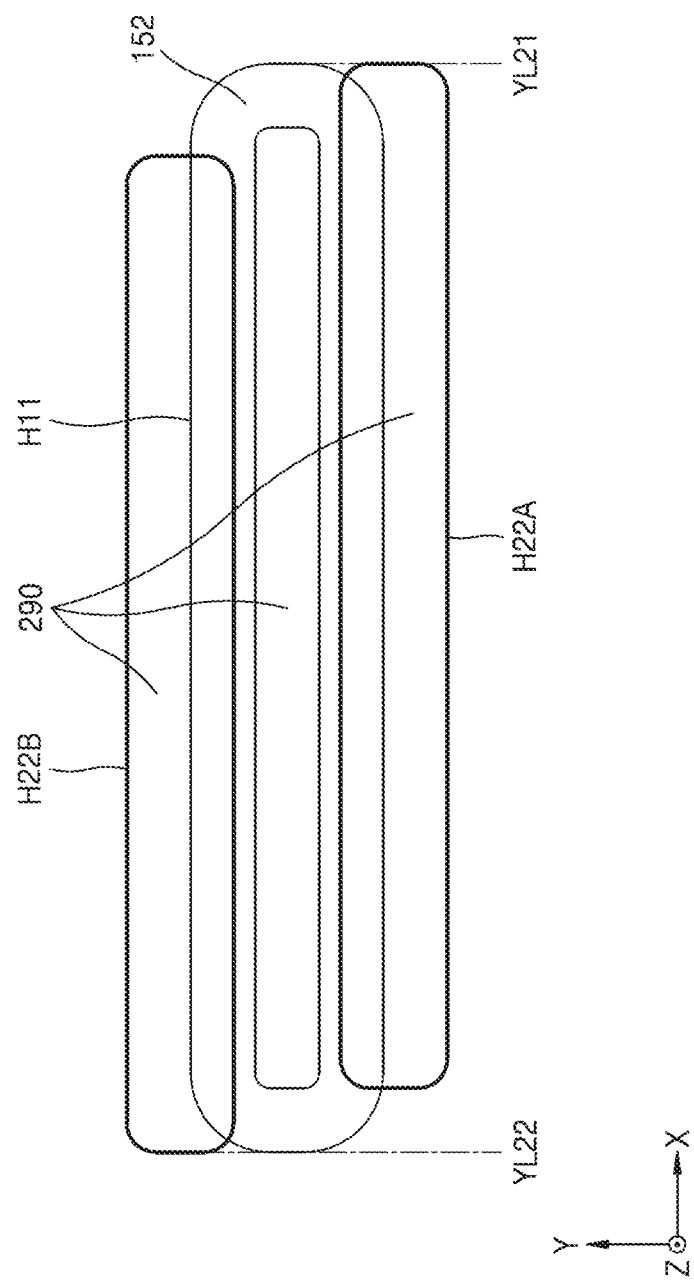
FIG. 26 is a detailed plan view of respective positions of a plurality of conductive lines obtained using the method of manufacturing the IC device, which has been described with reference to FIGS. 24A to 25B.

FIG. 26 is a plan view for explaining a relationship between respective positions of the first opening H11 of the first mask pattern M11 and the first and second shift mask holes H22A and H22B of the second mask pattern M22 and respective positions of the plurality of conductive lines 290, which are used in the method of manufacturing the IC device 200, which has been described with reference to FIGS. 24A to 25B.

Referring to FIG. 26, one end of the first shift mask hole H22A and one end of the first opening H11 of the first mask pattern M11 may be on a first straight line YL21 that follows the second lateral direction (Y direction). A portion of the first shift mask hole H22A may overlap a portion of the reference spacer 152 in the vertical direction (Z direction). The other end of the second shift mask hole H22B and the other end of the first opening H11 of the first mask pattern M11 may be on a second straight line YL22 that follows the second lateral direction (Y direction). A portion of the second shift mask hole H22B may overlap a portion of the reference spacer 152 in the vertical direction (Z direction).

The plurality of conductive lines 290 may be formed in a first region defined by the reference spacer 152 inside the first opening H11 of the first mask pattern M11, a second region excluding a portion of the first shift mask hole H22A, which overlaps the reference spacer 152, and a third region excluding a portion of the second shift mask hole H22B, which overlaps the reference spacer 152.

FIGS. 27A to 32A are plan views of a process sequence of a method of manufacturing an IC device, according to some example embodiments. FIGS. 27B to 32B are cross-sectional views taken along lines Y1-Y1' of FIGS. 27A to 32A, respectively. A method of manufacturing the IC device 300 shown in FIG. 3, according to in some example embodiments, will be described with reference to FIGS. 27A to 32B.

Figure 27A:
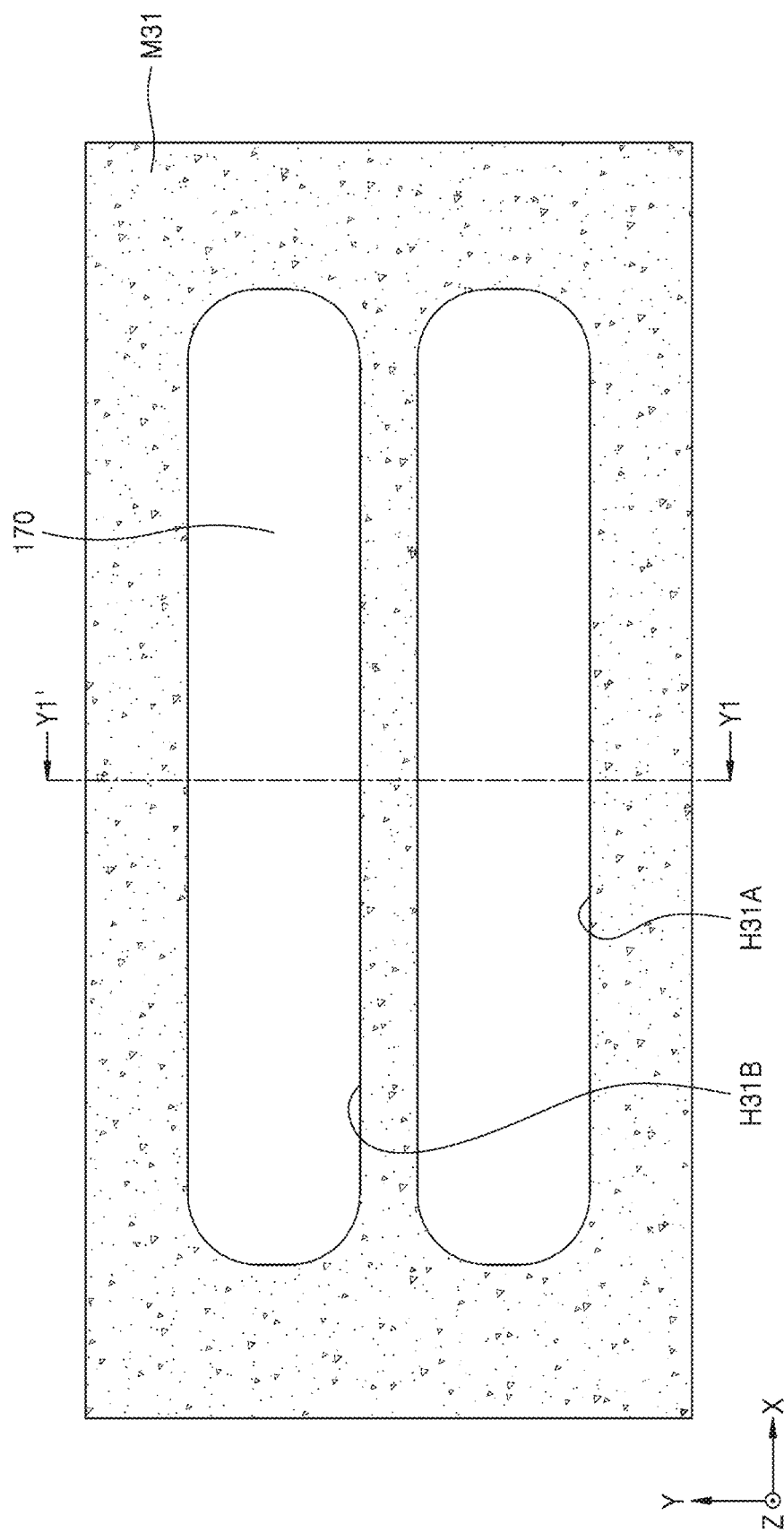
Figure 27B:
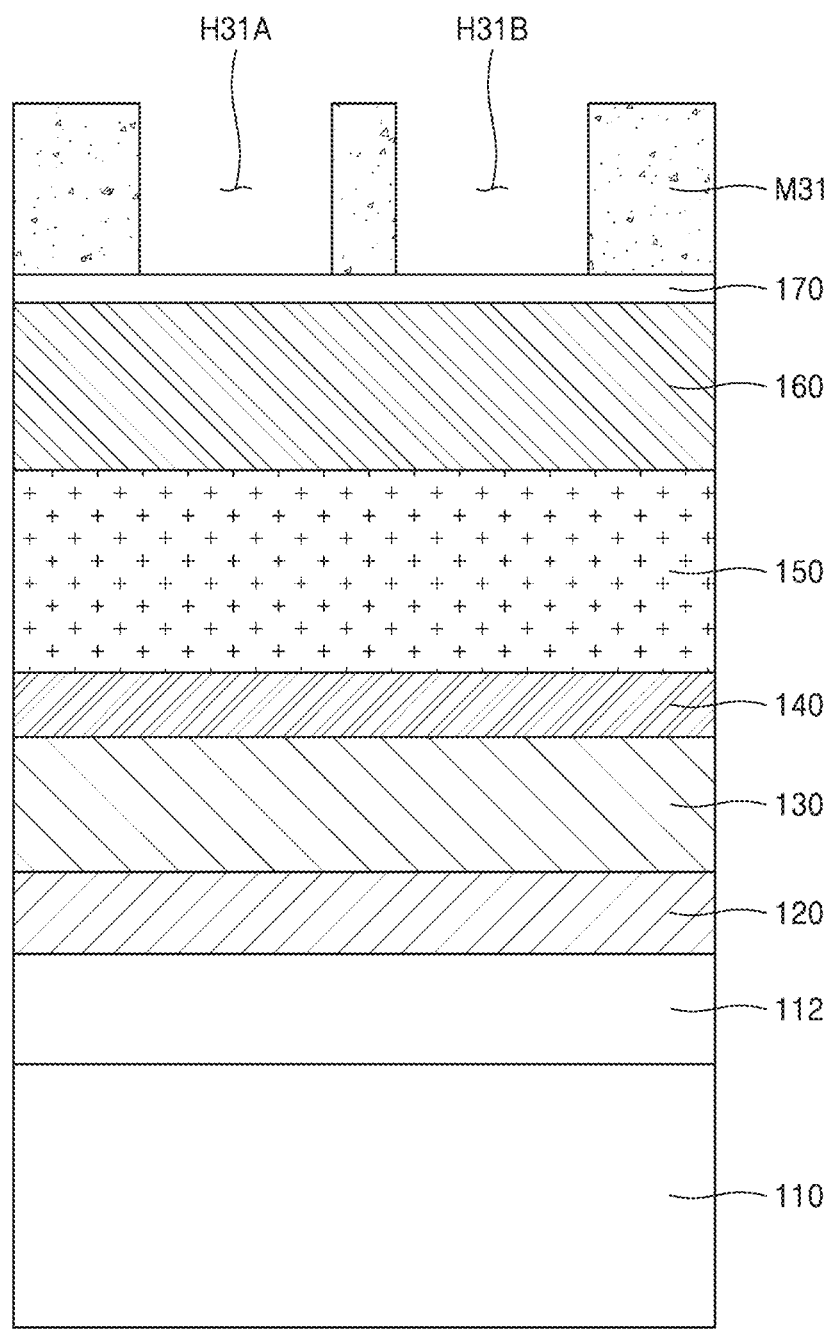
FIGS. 27B, 28B, 29B, 30B, 31B, and 32B are cross-sectional views taken along lines Y1-Y1' of FIGS. 27A to 32A, respectively.

Referring to FIGS. 27A and 27B, the process described with reference to FIGS. 13A and 13B may be performed. However, in the present embodiment, a first mask pattern M31 may be formed instead of the first mask pattern M11. The first mask pattern M31 may have the same configuration as the first mask pattern M11 described with reference to FIGS. 13A and 13B. However, the first mask pattern M31 may have a first opening H31A and a second opening H31B, which are apart from each other.

Figure 28A:
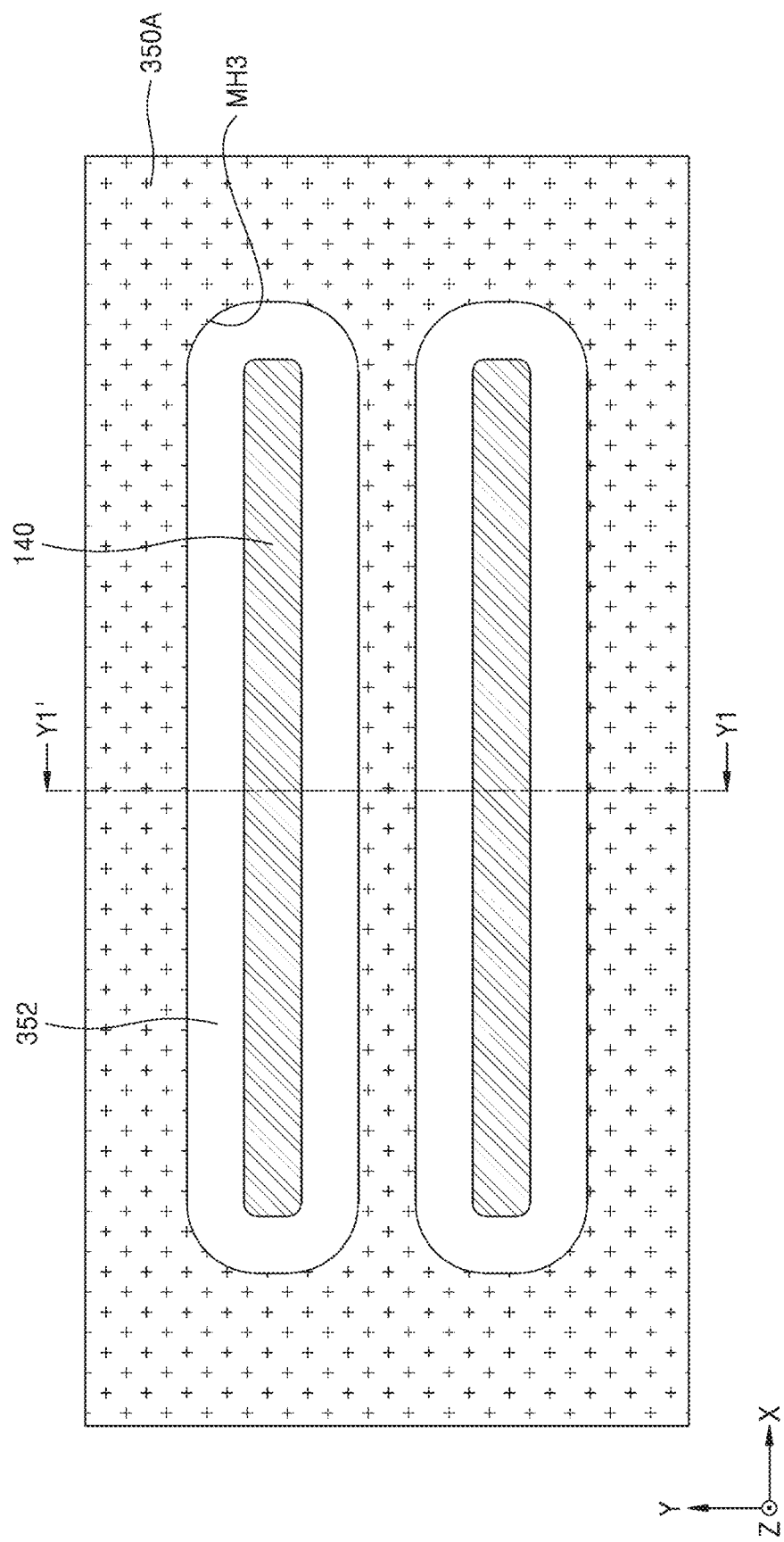
Figure 28B:
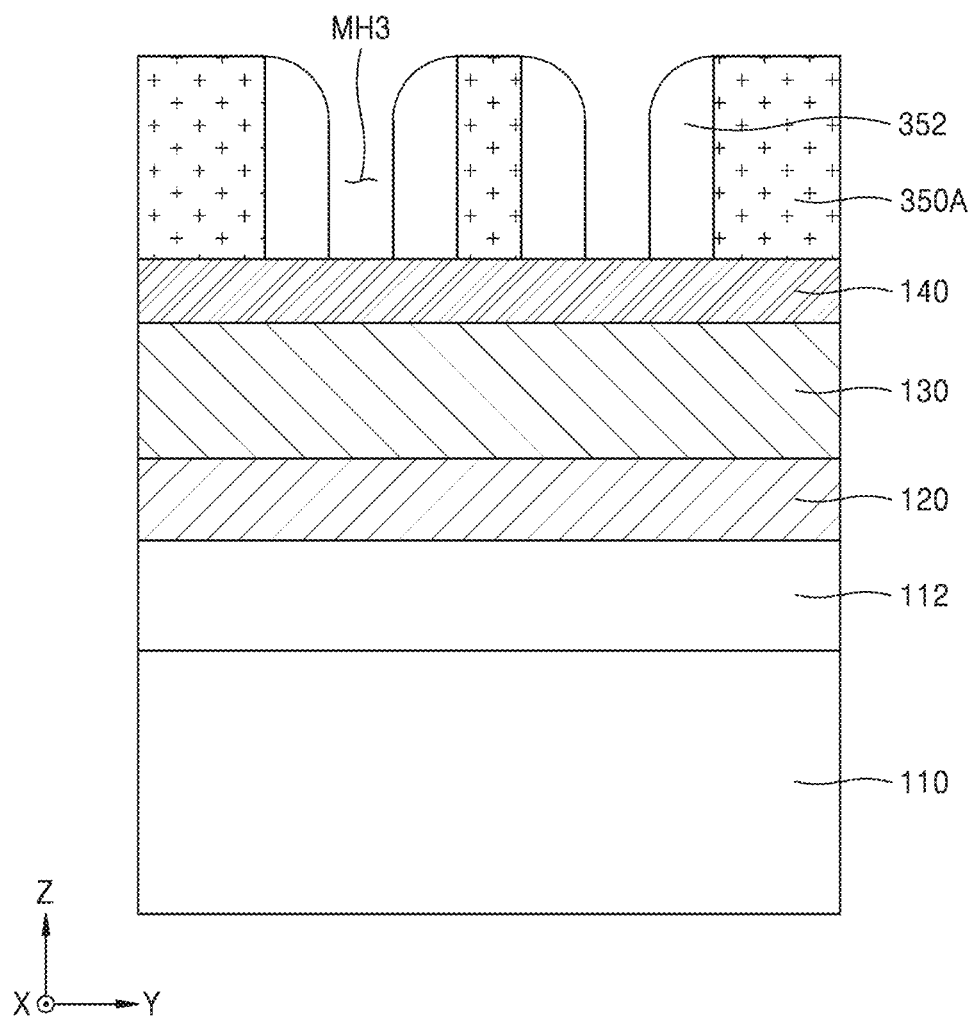

Referring to FIGS. 28A and 28B, a portion of a lower structure may be etched using the first mask pattern M31 as an etch mask by using a method that is similar to that described with reference to FIGS. 14A and 14B. Thus, a first reference pattern 350A having a pair of mandrel holes MH3 may be formed from the reference layer 150.

Afterwards, by using a method that is similar to the method of forming the reference spacer 152, which has been described with reference to FIGS. 15A and 15B, a reference spacer 352 having an inner sidewall in contact with a sidewall of the first reference pattern 350A may be formed inside each of the pair of mandrel holes MH3 of the first reference pattern 350A. A line-type space extending long in the first lateral direction may be defined by the reference spacer 352 inside each of the pair of mandrel holes MH3. The reference spacer 352 may include silicon oxide, without being limited thereto.

Thereafter, by using the same method as in the process P85 of FIGS. 11 and 12, one moving point may be selected from the first moving point, the second moving point, and the third moving point around the pair of mandrel holes MH3 in the resultant structure of FIGS. 28A and 28B.

Figure 29A:
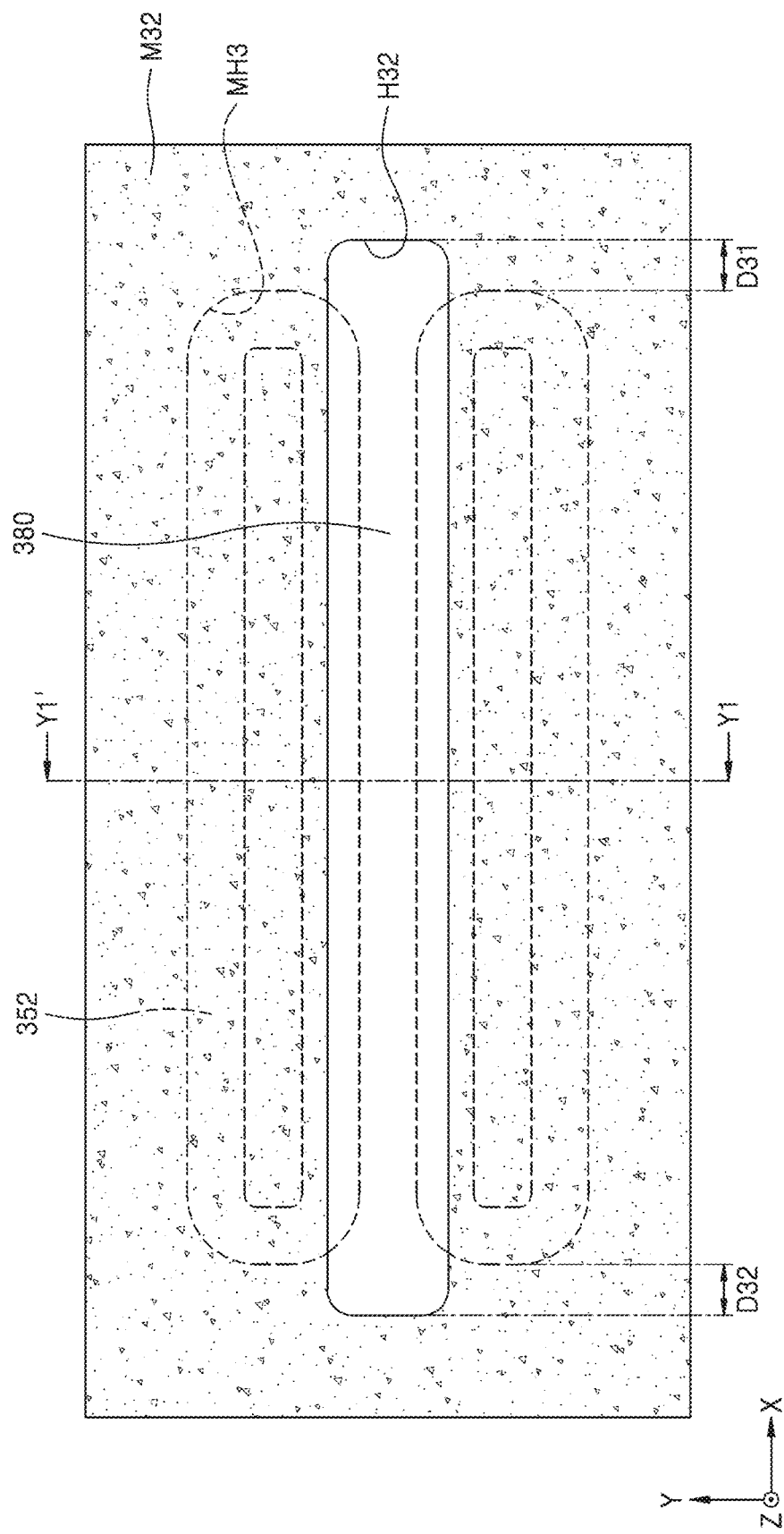
Figure 29B:
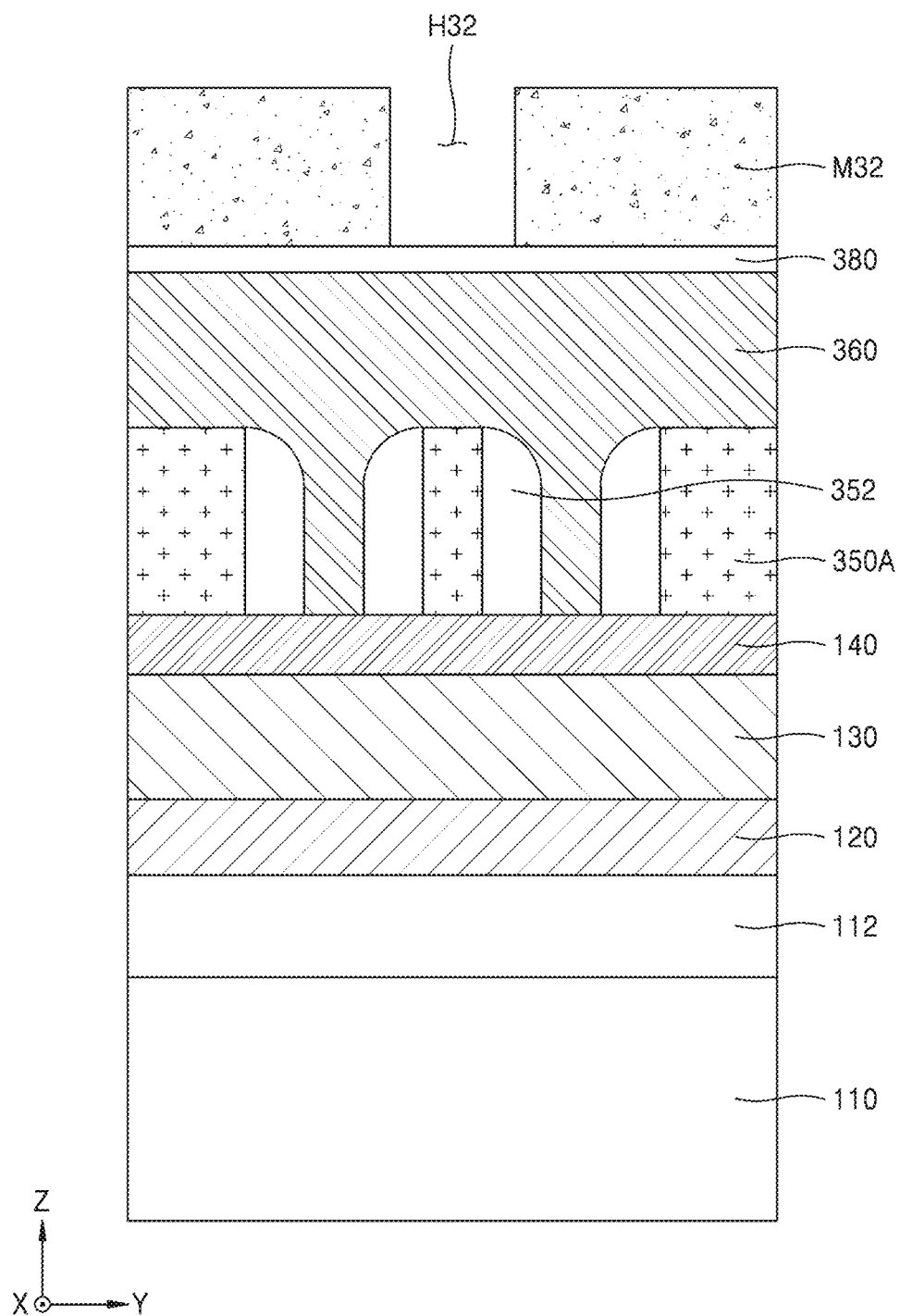

Referring to FIGS. 29A and 29B, a second upper hard mask layer 360, a second anti-reflection film 380, and a second mask pattern M32 may be sequentially formed on the resultant structure of FIGS. 28A and 28B.

The second upper hard mask layer 360, the second anti-reflection film 380, and the second mask pattern M32 may respectively have substantially the same configurations as the second upper hard mask layer 162, the second anti-reflection film 180, and the second mask pattern M12, which are described with reference to FIGS. 16A and 16B. However, the second mask pattern M32 may be formed to have a shift mask hole H32 of which a position is determined according to a moving point selected using the same method as in the process P85 of FIGS. 11 and 12. The shift mask hole H32 may overlap a portion of each of the pair of mandrel holes MH3 of the first reference pattern 350A in a vertical direction (Z direction) and overlap a portion of the first reference pattern 350A between the pair of mandrel holes MH3 in the vertical direction (Z direction).

One end of the shift mask hole H32 of the second mask pattern M32 may protrude by a first distance D31 further than one end of each of the pair of mandrel holes MH3 in a direction away from the one end of each of the pair of mandrel holes MH3. The other end of the shift mask hole H32 of the second mask pattern M32 may protrude by the second distance D32 further than the other end of each of the pair of mandrel holes MH3 in a direction away from the pair of mandrel holes MH3.

Figure 30B:
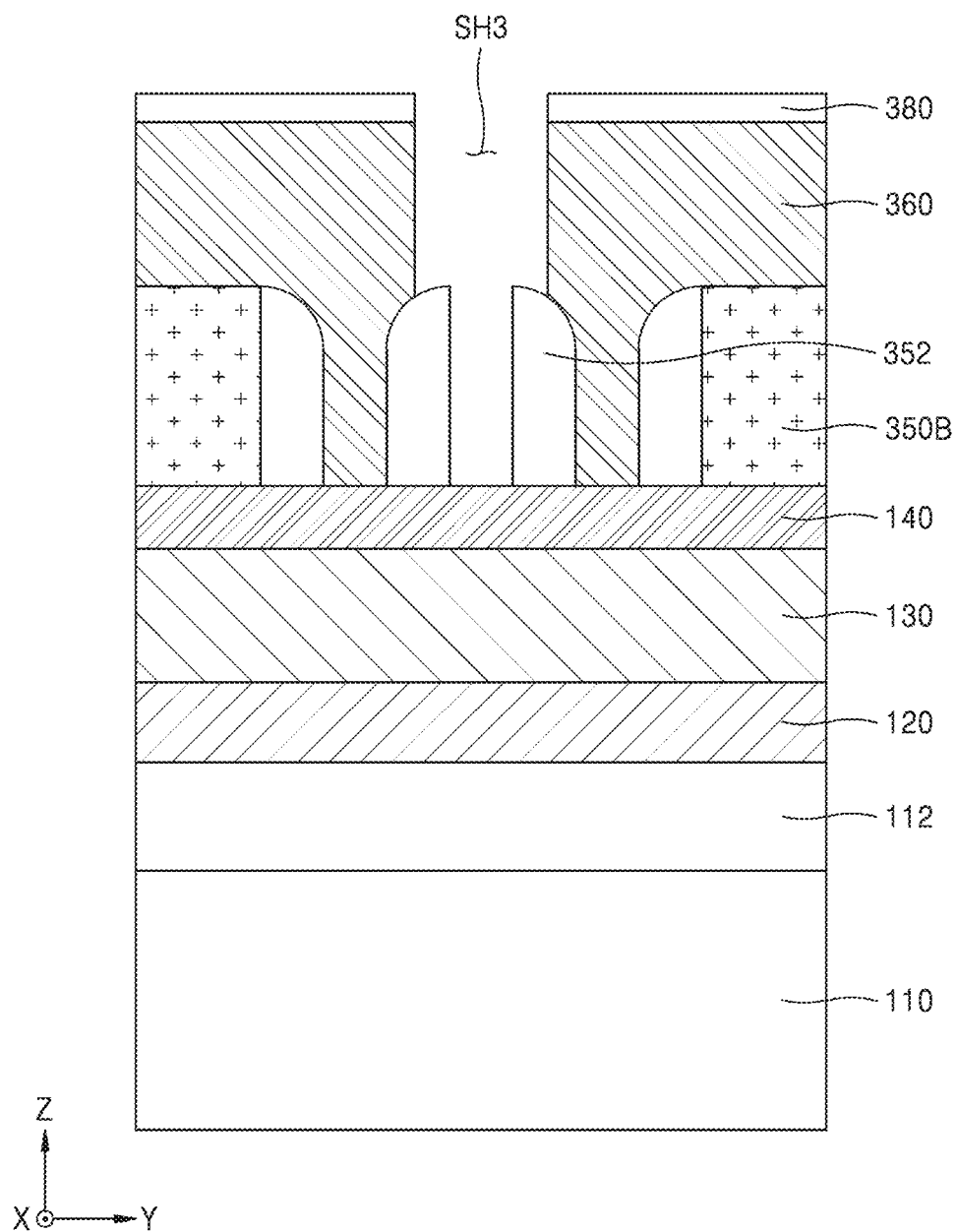

Referring to FIGS. 30A and 30B, a second reference pattern 350B having a shift hole SH3 exposing an inner sidewall of the reference spacer 352 may be formed using a method that is similar to that described with reference to FIGS. 17A and 17B. The shift hole SH3 may extend parallel to the pair of mandrel holes MH3 (refer to FIGS. 28A and 28B) in the first lateral direction (X direction).

Figure 31A:
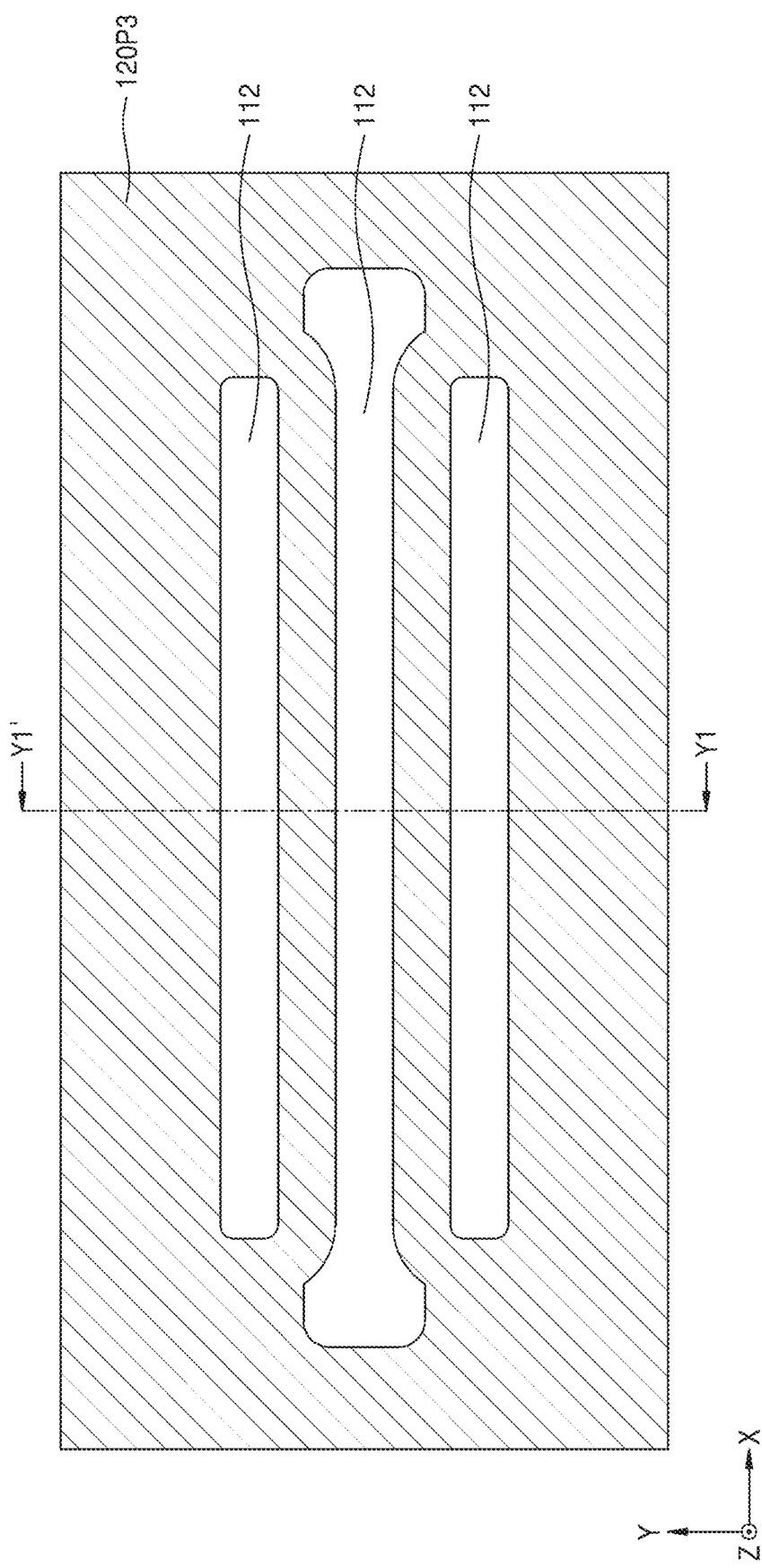
Figure 31B:
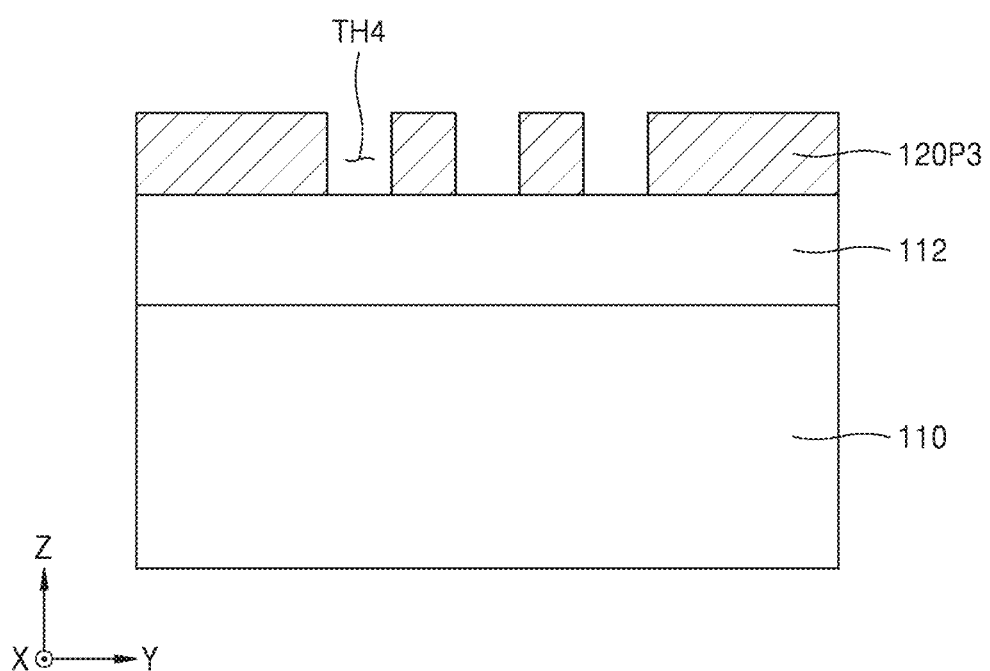

Referring to FIGS. 31A and 31B, the processes described with reference to FIGS. 18A to 21B may be performed on the resultant structure of FIGS. 30A and 30B, and thus, a target pattern 120P3 having a plurality of target openings TH3 may be formed.

Figure 32A:
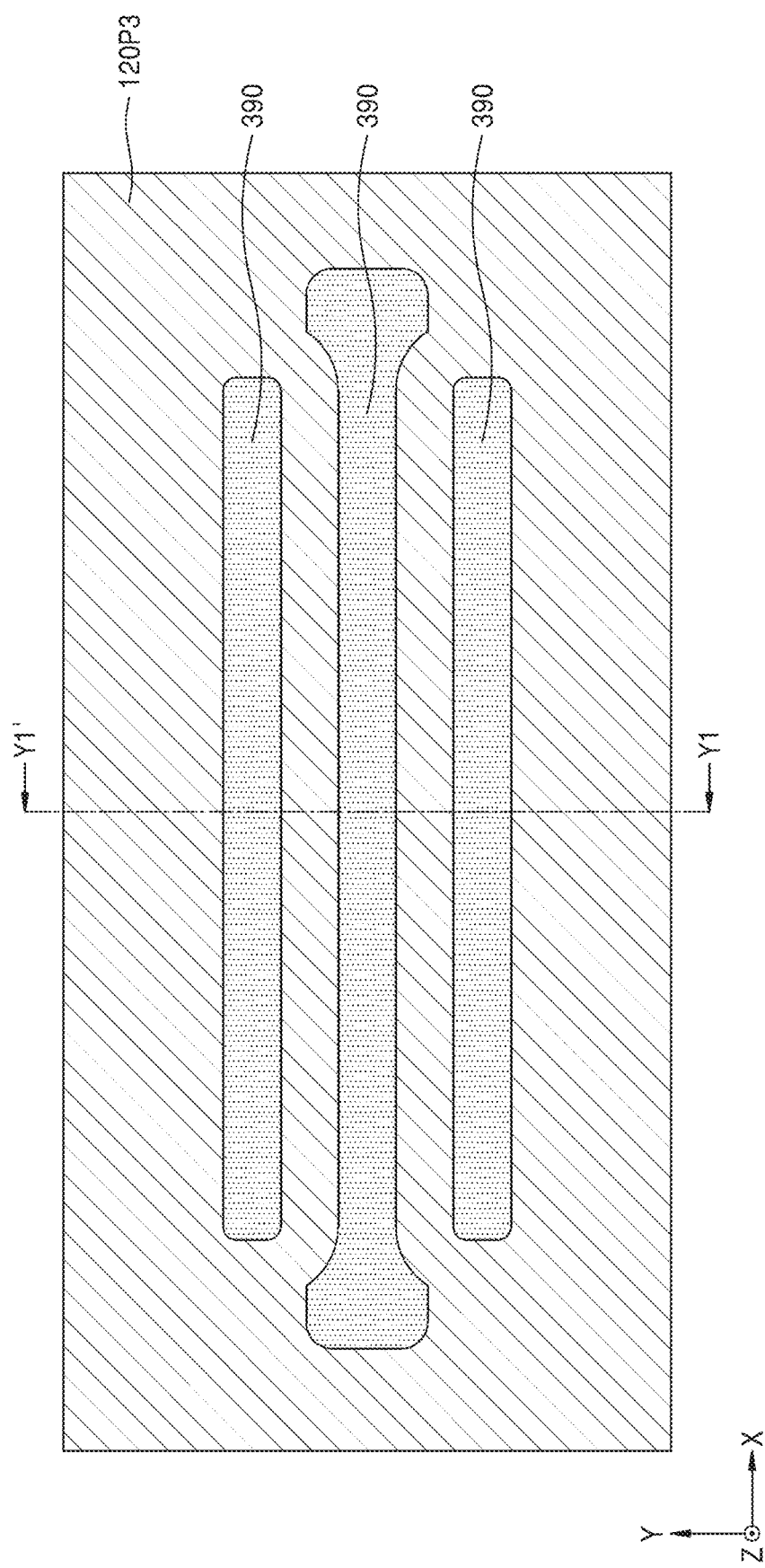
Figure 32B:
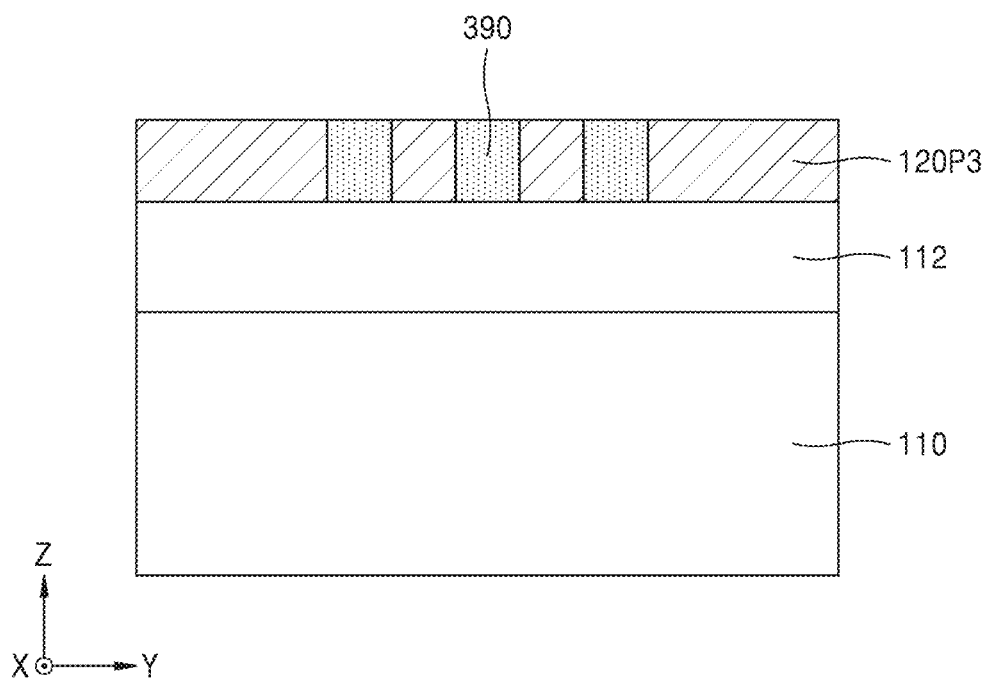

Referring to FIGS. 32A and 32B, by using a method similar to that described with reference to FIGS. 22A and 22B, a plurality of conductie lines 390 may be formed to fill the plurality of target openings TH3 of the target pattern 120P3 in the resultant structure of FIGS. 31A and 31B. The plurality of conductive lines 390 may include the first conductive line C31, the second conductive line C32, and the third conductive line C33 shown in FIG. 3.

Figure 33:
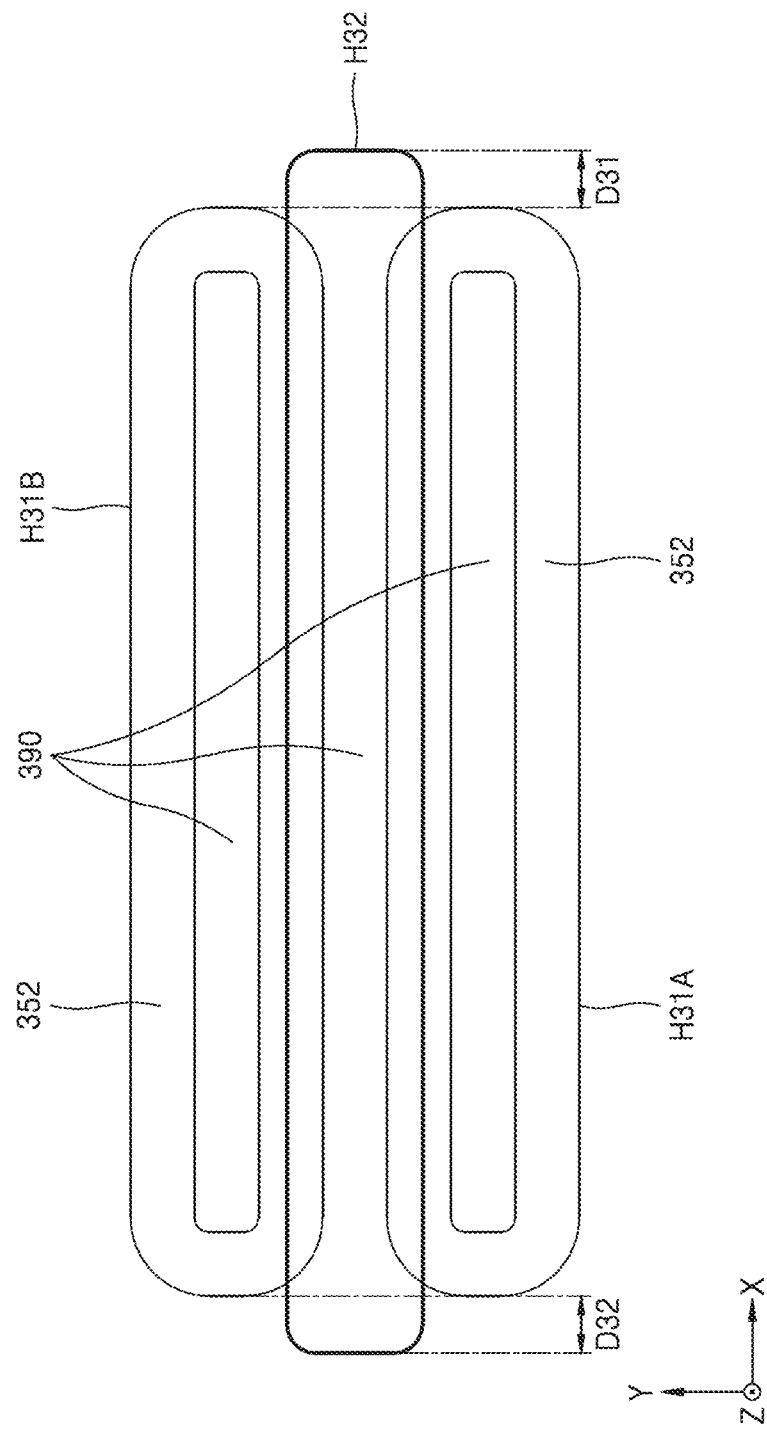
FIG. 33 is a detailed plan view of respective positions of a plurality of conductive lines obtained using the method of manufacturing the IC device, which has been described with reference to FIGS. 27A to 32B.

FIG. 33 is a plan view for explaining a relationship between respective positions of the first opening H31A and the second opening H31B of the first mask pattern M31 and the shift mask hole H32 of the second mask pattern M32 and respective positions of the plurality of conductive lines 390, which are used in the method of manufacturing the IC device 300, which has been described with reference to FIGS. 27A to 32B.

Referring to FIG. 33, one end of the shift mask hole H32 may be at a position, which is shifted by a first distance D31 from one end of each of the first opening H31A and the second opening H31B of the first mask pattern M31 forward (rightward in FIG. 33) in the first lateral direction (X direction) and overlaps a portion of the reference spacer 352 in a vertical direction (Z direction). The other end of the shift mask hole H32 may be at a position, which is shifted by a second distance D32 backward (leftward in FIG. 33) in the first lateral direction (X direction) from the other end of each of the first opening H31A and the second opening H31B of the first mask pattern M31 and overlaps a portion of the reference spacer 352 in the vertical direction (Z direction).

The plurality of conductive lines 390 may be formed in a first region defined by the reference spacer 352 inside the first opening H31A of the first mask pattern M31, a second region defined by the reference spacer 352 inside the second opening H31B of the first mask pattern M31, and a third region excluding a portion of the shift mask hole H32, which overlaps a pair of reference spacers 352.

FIGS. 34A and 35A are plan views of a process sequence of a method of manufacturing an IC device, according to some example embodiments. FIGS. 34B and 35B are cross-sectional views taken along lines Y1-Y1' of FIGS. 34A and 35A, respectively. A method of manufacturing the IC device 400 shown in FIG. 4, according to in some example embodiments, will be described with reference to FIGS. 34A to 35B.

Referring to FIGS. 34A and 34B, the processes described with reference to FIGS. 27A to 29B may be performed. However, in the present embodiment, a second mask pattern M42 may be formed instead of the second mask pattern M32.

The second mask pattern M42 may have substantially the same configuration as the second mask pattern M32 shown in FIGS. 29A and 29B. However, the second mask pattern M42 may be formed to have a shift mask hole H42 of which a position is determined according to a moving point selected using the same method as in the process P85 of FIGS. 11 and 12. The shift mask hole H42 may overlap a portion of each of a pair of mandrel holes MH3 (refer to FIGS. 28A and 28B) of the first reference pattern 350A in a vertical direction (Z direction), and overlap a portion of the first reference pattern 350A between the pair of mandrel holes MH3 in the vertical direction (Z direction).

One end of the shift mask hole H42 of the second mask pattern M42 and one end of each of the pair of mandrel holes MH3 may be on a first straight line YL41 that follows the second lateral direction (Y direction). The other end of the shift mask hole H42 of the second mask pattern M42 and the other end of each of the pair of mandrel holes MH3 may be on a second straight line YL42 that follows the second lateral direction (Y direction).

Referring to FIGS. 35A and 35B, processes that are similar to those described with reference to FIGS. 30A to 32B may be performed on the resultant structure of FIGS. 34A and 34B. Thus, a target pattern 120P4 having a plurality of target openings TH4 may be formed from the target layer 120, and a plurality of conductive lines 490 may be formed to fill the plurality of target openings TH4. The plurality of conductive lines 490 may include the first conductive line C31, the second conductive line C32, and the third conductive line C43, which are shown in FIG. 4.

FIG. 36 is a plan view for explaining a relationship between respective positions of the first opening H31A and the second opening H31B of the first mask pattern M31 and the shift mask hole H42 of the second mask pattern M42 and respective positions of the plurality of conductive lines 490, which are used in the method of manufacturing the IC device 400, which has been described with reference to FIGS. 34A to 35B.

Referring to FIG. 36, one end of the shift mask hole H42 and one end of each of the first opening H31A and the second opening H31B of the first mask pattern M31 may be on the first straight line YL41, which follows the second lateral direction (Y direction), and overlap a portion of the reference spacer 352 in the vertical direction (Z direction). One end of the shift mask hole H42 and the other end of each of the first opening H31A and the second opening H31B of the first mask pattern M31 may be on the second straight line YL42, which follows the second lateral direction (Y direction), and overlap a portion of the reference spacer 352) in the vertical direction (Z direction).

The plurality of conductive lines 490 may be formed in a first region defined by the reference spacer 352 inside the first opening H31A of the first mask pattern M31, a second region defined by the reference spacer 352 inside the second opening H31B of the first mask pattern M31, and a third region excluding a portion of the shift mask hole H42, which overlaps a pair of reference spacers 352.

FIGS. 37A and 38A are plan views of a process sequence of a method of manufacturing an IC device, according to some example embodiments. FIGS. 37B and 38B are cross-sectional views taken along lines Y1-Y1' of FIGS. 37A and 38A, respectively; A method of manufacturing the IC device 500 shown in FIG. 5, according to in some example embodiments, will be described with reference to FIGS. 37A to 38B.

Referring to FIGS. 37A and 37B, the processes described with reference to FIGS. 27A to 29B may be performed. However, in some example embodiments, a second mask pattern M52 may be formed instead of the second mask pattern M32.

The second mask pattern M52 may have substantially the same configuration as the second mask pattern M32 shown in FIGS. 29A and 29b. However, the second mask pattern M52 may be formed to have a shift mask hole H52 of which a position is determined according to a moving point selected using the same method as in the process P85 of FIGS. 11 and 12. The shift mask hole H52 may overlap a portion of each of a pair of mandrel holes MH3 (refer to FIGS. 28A and 28B) of the first reference pattern 350A in a vertical direction (Z direction), and overlaps a portion of the first reference pattern 350A between the pair of mandrel holes MH3 in the vertical direction (Z direction).

One end of the shift mask hole H52 may be at a point, which is a first distance D51 backward (leftward in FIG. 37A) in the first lateral direction (X direction) from a straight line that extends in the second lateral direction (Y direction) through one end of each of the pair of mandrel holes MH3. The other end of the shift mask hole H52 may be at a point, which is a second distance D52 forward (rightward in FIG. 37A) in the first lateral direction (X direction) from a straight line that extends in the second lateral direction (Y direction) through the other end of each of the pair of mandrel holes MH3.

Referring to FIGS. 38A and 38B, processes that are similar to those described with reference to FIGS. 30A to 32B may be performed on the resultant structure of FIGS. 37A and 37B. Thus, a target pattern 120P5 having a plurality of target openings TH5 may be formed from the target layer 120, and a plurality of conductive lines 590 may be formed to fill the plurality of target openings TH5. The plurality of conductive lines 590 may include the first conductive line C31, the second conductive line C32, and the third conductive line C53, which are shown in FIG. 5.

FIG. 39 is a plan view for explaining a relationship between respective positions of the first opening H31A and the second opening H31B of the first mask pattern M31 and the shift mask hole H52 of the second mask pattern M52 and respective positions of the plurality of conductive lines 590, which are used in the method of manufacturing the IC device 500, which has been described with reference to FIGS. 37A to 38B.

Referring to FIG. 39, one end of the shift mask hole H52 may be at a point, which is a first distance D51 backward (leftward in FIG. 39) in the first lateral direction (X direction) from a straight line that follows the second lateral direction (Y direction) through one end of each of the first opening H31A and the second opening H31B of the first mask pattern M31. The other end of the shift mask hole H52 may be at a point, which is a second distance D52 forward (rightward in FIG. 39) in the first lateral direction (X direction) from a straight line that extends in the second lateral direction (Y direction) through the other end of each of the first opening H31A and the second opening H31B of the first mask pattern M31.

FIGS. 40A and 40B are plan views of a method of manufacturing an IC device, according to some example embodiments. A method of manufacturing the IC device 600 shown in FIG. 6, according to in some example embodiments, will be described with reference to FIGS. 40A and 40B.

Referring to FIGS. 40A and 40B, processes that similar to those described with reference to FIGS. 27A to 32B may be performed, and thus, the IC device 600 shown in FIG. 6 may be manufactured. However, in the present embodiment, a first mask pattern M61 shown in FIG. 40A may be formed instead of the first mask pattern M31 in the process described with reference to FIGS. 27A and 27B, and a second mask pattern M62 shown in FIG. 40B may be formed instead of the second mask pattern M32 in the process described with reference to FIGS. 29A and 29B.

The first mask pattern M61 shown in FIG. 40A may have substantially the same configuration as the first mask pattern M31 shown in FIGS. 27A and 27B. However, the first mask pattern M61 may have a first opening H61A and a second opening H61B, which are apart from each other. The first opening H61A and the second opening H61B may be misaligned from each other in a second lateral direction (Y direction).

The second mask pattern M62 shown in FIG. 40B may have substantially the same configuration as the second mask pattern M32 described with reference to FIGS. 29A and 29B. However, the second mask pattern M62 may be formed to have a shift mask hole H62 of which a position is determined according to a moving point selected using the same method as in the process P85 of FIGS. 11 and 12.

FIG. 40C is a plan view for explaining a relationship between respective positions of the first opening H61A and the second opening H61B of the first mask pattern M61 and the shift mask hole H62 of the second mask pattern M62 and respective positions of first to third conductive lines C61, C62, and C63, which are used in the method of manufacturing the IC device 600, which has been described with reference to FIGS. 40A and 40B.

Referring to FIG. 40C, one end of the shift mask hole H62 may protrude by a first distance D61 further than one end of the second opening H61B of the first mask pattern M61 in a direction away from the second opening H61B, and may be in a region between a first straight line YL61A and a second straight line YL62A. The first straight line YL61A may pass through one end of the first opening H61A and extend in the second lateral direction (Y direction). The second straight line YL62A may pass through one end of the second opening H61B and extend in the second lateral direction (Y direction). The other end of the shift mask hole H62 may protrude by a second distance D62 further than one end of the first opening H61A of the first mask pattern M61 in a direction away from the first opening H61A, and may be in a region between a first straight line YL61B and a second straight line YL62B. The first straight line YL61B may pass through the other end of the first opening H61A and extend in the second lateral direction (Y direction). The second straight line YL62B may pass through the other end of the second opening H61B and extend in the second lateral direction (Y direction).

The first conductive line C61 may be formed in a region defined by the reference spacer 352 inside the first opening H61A of the first mask pattern M61. The second conductive line C62 may be formed in a region defined by the reference spacer 352 inside the second opening H61B of the first mask pattern M61. The third conductive line C63 may be formed in a region excluding a portion of the shift mask hole H62, which overlaps a pair of reference spacers 352.

FIG. 41 is a plan view of a method of manufacturing an IC device, according to some example embodiments. A method of manufacturing the IC device 700 shown in FIG. 7, according to in some example embodiments, will be described with reference to FIG. 41.

Referring to FIG. 41, processes that are similar to those described with reference to FIGS. 27A to 32B may be performed, and thus, the IC device 700 shown in FIG. 7 may be manufactured. However, in some example embodiments, the first mask pattern M61 shown in FIG. 40A may be formed instead of the first mask pattern M31 in the process described with reference to FIGS. 27A and 27B, and a second mask pattern having a shift mask hole H72 may be formed instead of the second mask pattern M32 in the process described with reference to FIGS. 29A and 29B.

One end of the shift mask hole H72 may be at a point, which is backward (leftward in FIG. 41) in a first lateral direction (X direction) from a straight line YL71 that extends in a second lateral direction (Y direction) through one end of the first opening H61A. Also, the one end of the shift mask hole H72 may be on a straight line YL72 that passes through one end of the second opening H61B of the first mask pattern M61 and extends in a second lateral direction (Y direction). The other end of the shift mask hole H72 may be on a straight line YL73 that passes through the other end of the first opening H61A of the first mask pattern M61 and extends in the second lateral direction (Y direction). Also, the other end of the shift mask hole H72 may be at a point, which is forward (rightward in FIG. 41) in the first lateral direction (X direction) from a straight line YL74 that extends in the second lateral direction (Y direction) through the other end of the second opening H61B.

The first conductive line C61 may be formed in a region defined by the reference spacer 352 inside the first opening H61A of the first mask pattern M61. The second conductive line C62 may be formed in a region defined by the reference spacer 352 inside the second opening H61B of the first mask pattern M61. The third conductive line C73 may be formed in a region excluding a portion of the shift mask hole H72, which overlaps a pair of reference spacers 352.

FIG. 42 is a plan view of a method of manufacturing an IC device according to some example embodiments. A method of manufacturing the IC device 800 shown in FIG. 8, according to some example embodiments, will be described with reference to FIG. 42.

Referring to FIG. 42, processes that are similar to those described with reference to FIGS. 27A to 32B may be performed, and thus, the IC device 800 shown in FIG. 8 may be manufactured. However, in some example embodiments, the first mask pattern M61 shown in FIG. 40A may be formed instead of the first mask pattern M31 in the process described with reference to FIGS. 27A and 27B, and a second mask pattern having a shift mask hole H82 may be formed instead of the second mask pattern M32 in the process described with reference to FIGS. 29A and 29B.

One end of the shift mask hole H82 may be at a point, which is a first distance D81 backward (leftward in FIG. 42) in the first lateral direction (X direction) from a straight line that extends in the second lateral direction (Y direction) through one end of the first opening H61A. Alternatively, the one end of the shift mask hole H82 may be at a point, which is a second distance D82 backward (leftward in FIG. 42) in the first lateral direction (X direction) from a straight line that extends in the second lateral direction (Y direction) through one end of the second opening H61B of the first mask pattern M61. Similar to the one end of the shift mask hole H82, the other end of the shift mask hole H82 may be at a point, which is a predetermined distance backward (leftward in FIG. 42) in the first lateral direction (X direction) from a straight line that extends in the second lateral direction (Y direction) through the other end of each of the first opening H61A and the second opening H61B.

The first conductive line C61 may be formed in a region defined by the reference spacer 352 inside the first opening H61A of the first mask pattern M61. The second conductive line C62 may be formed in a region defined by the reference spacer 352 inside the second opening H61B of the first mask pattern M61. The third conductive line C83 may be formed in a region excluding a portion of the shift mask hole H82, which overlap a pair of reference spacers 352.

FIG. 43 is a plan view of a method of manufacturing an IC device, according to some example embodiments. A method of manufacturing the IC device 900 shown in FIG. 9, according to in some example embodiments, will be described with reference to FIG. 43.

Referring to FIG. 43, processes that are similar to those described with reference to FIGS. 27A to 32B may be performed, and thus, the IC device 900 shown in FIG. 9 may be manufactured. However, in some example embodiments, a first mask pattern having a first opening H91A and a second opening H91B may be formed instead of the first mask pattern M31 in the process described with reference to FIGS. 27A and 27B, and a second mask pattern having a shift mask hole H92 may be formed instead of the second mask pattern M32 in the process described with reference to FIGS. 29A and 29B.

One end of the shift mask hole H92 may be at a point, which is a first distance D91 forward (rightward in FIG. 43) in the first lateral direction (X direction) from a straight line YL92A that extends in the second lateral direction (Y direction) through one end of the second opening H91B. Alternatively, the one end of the shift mask hole H92 may be in a region between a straight line YL91A and the straight line YL92A. The straight line YL91A may pass through one end of the first opening H91A and extend in the second lateral direction (Y direction), and the straight line YL92A may pass through one end of the second opening H91B and extend in the second lateral direction (Y direction). The other end of the shift mask hole H92 may be on a straight line YL9B that passes through the other end of each of the first opening H91A and the second opening H91B and extends in the second lateral direction (Y direction).

The first conductive line C91 may be formed in a region defined by the reference spacer 352 inside the first opening H91A. The second conductive line C92 may be formed in a region defined by the reference spacer 352 inside the second opening H91B. The third conductive line C93 may be formed in a region excluding a portion of the shift mask hole H92, which overlaps a pair of reference spacers 352.

Although example methods of manufacturing the IC devices 100, 200, 300, 400, 500, 600, 700, 800, and 900 shown in FIGS. 1 to 9 have been described with reference to FIGS. 13A to 43, it will be understood that an IC device including a plurality of conductive lines having various structures and arrangements may be manufactured by applying various modifications and changes within the scope of inventive concepts. In the method of manufacturing the IC device, according to various example embodiments, conductive lines arranged in various sizes and shapes may be more easily implemented according to designs.

While inventive concepts have been particularly shown and described with reference to example embodiments thereof, it will be understood that various changes in form and details may be made therein without departing from the spirit and scope of the following claims. Furthermore none of the example embodiments described herein are necessarily mutually exclusive with one another. For example some example embodiments may include features described with reference to one or more figures, and may also include features described with reference to one or more other figures.

What is claimed is:
1. An integrated circuit device comprising:
a first conductive line in a local area on a substrate, the first conductive line extending long along a first lateral direction in a position apart from a closed curve by an insulation distance, the closed curve defining the local area, the first conductive line comprising a first end portion and a second end portion, the first end portion and the second end portion opposite to each other in the first lateral direction; and a second conductive line outside the local area and extending parallel to the first conductive line along the first lateral direction, the second conductive line facing the first conductive line with the insulation distance between the first conductive line and the second conductive line, the insulation distance in a second lateral direction that is perpendicular to the first lateral direction, wherein the second conductive line comprises,
a linear line portion having a first sidewall extending in a straight line along the closed curve, and
a bulging end portion having a second sidewall extending in a curve along the closed curve, the bulging end portion protruding from the linear line portion toward the first end portion of the first conductive line in the second lateral direction,
wherein the bulging end portion of the second conductive line protrudes further to the outside of the local area in the first lateral direction than the first end portion of the first conductive line,
the insulation distance is constant, and
an endmost edge of the bulging end portion in the first lateral direction that is linear in the second lateral direction is flush with an endmost edge of the closed curve in the first lateral direction that is linear in the second lateral direction.

2. The integrated circuit device of claim 1, wherein the first conductive line and the second conductive line have same widths in the second lateral direction.

3. The integrated circuit device of claim 1, wherein in the local area the first conductive line continuously extends without interruption, and
each of the first end portion and the second end portion of the first conductive line is spaced the insulation distance apart from the closed curve.

4. The integrated circuit device of claim 1, wherein a first smallest distance from the linear line portion of the second conductive line to the first conductive line is equal to a second smallest distance from the bulging end portion of the second conductive line to the first conductive line.

5. The integrated circuit device of claim 1, further comprising:
a third conductive line outside the local area and opposite the second conductive line across the first conductive line,
wherein planar shapes of the second conductive line and the third conductive line are mutually point-symmetric with respect to one point on the first conductive line.

6. The integrated circuit device of claim 1, further comprising:
a third conductive line outside the local area and opposite the second conductive line across the first conductive line,
wherein an overall planar shape of the first conductive line, the second conductive line, and the third conductive line are point-symmetric with respect to one point on the first conductive line.

7. The integrated circuit device of claim 1, wherein, in the first lateral direction, an end of the bulging end portion of the second conductive line and another end of the closed curve are on a straight line that extends in the second lateral direction.

8. An integrated circuit device comprising:
a first conductive line on a substrate, the first conductive line in a first local area, the first conductive line apart by a first insulation distance from a first closed curve defining the first local area, the first conductive line extending in a first lateral direction;
a second conductive line on the substrate and in a second local area that is apart from the first local area, the second conductive line apart by a second insulation distance from a second closed curve defining the second local area, the second conductive line extending in the first lateral direction; and
a third conductive line between the first conductive line and the second conductive line,
wherein the third conductive line includes,
a linear line portion comprising a first sidewall and a second sidewall, the first sidewall extending in a straight line along the first closed curve and the second sidewall extending in a straight line along the second closed curve, and
a bulging end portion having a third sidewall extending in a curve from the linear line portion along at least one of the first closed curve and the second closed curve, the bulging end portion protruding from the linear line portion toward an end portion of at least one of the first conductive line and the second conductive line in a second lateral direction, the second lateral direction perpendicular to the first lateral direction,
wherein, in the first lateral direction, the bulging end portion of the third conductive line protrudes further than the first conductive line and the second conductive line to the outside of each of the first local area and the second local area,
the first and second insulation distances are constant, and
an endmost edge of the bulging end portion in the first lateral direction that is linear in the second lateral direction is flush with an endmost edge of the first closed curve in the first lateral direction that is linear in the second lateral direction and is flush with an endmost edge of the second closed curve in the first lateral direction that is linear with the second lateral direction.

9. The integrated circuit device of claim 8, wherein the bulging end portion protrudes further than the first closed curve and the second closed curve in a direction away from the first local area and the second local area.

10. The integrated circuit device of claim 8, wherein the bulging end portion comprises a first bulging end portion and a second bulging end portion, the first bulging end portion and the second bulging end portion protruding from the linear line portion in opposite directions to each other in the first lateral direction, and
the first bulging end portion and the second bulging end portion have a same planar shape.

11. The integrated circuit device of claim 8, wherein the bulging end portion comprises a first bulging end portion and a second bulging end portion, the first bulging end portion and the second bulging end portion protruding from the linear line portion in opposite directions to each other in the first lateral direction, and
the first bulging end portion and the second bulging end portion have different planar shapes.

12. The integrated circuit device of claim 8, wherein the third conductive line has a point-symmetric shape with respect to one point on the third conductive line.

13. The integrated circuit device of claim 8, wherein an overall planar shape of the first conductive line, the second conductive line, and the third conductive line is point-symmetric with respect to one point on the third conductive line.

14. The integrated circuit device of claim 8, wherein the first conductive line and the second conductive line have point-symmetric shapes with respect to one point on the third conductive line.

15. The integrated circuit device of claim 8, wherein the first local area and the second local area have a first same length in the first lateral direction,
the first conductive line and the second conductive line have a second same length in the first lateral direction, and
in the first lateral direction a length of the third conductive line is greater than a length of the first conductive line and of the second conductive line in the first lateral direction.

16. The integrated circuit device of claim 8, wherein the first local area and the second local area are misaligned from each other in the second lateral direction, and
the first conductive line and the second conductive line are misaligned from each other in the second lateral direction.

17. An integrated circuit device comprising:
a first conductive line on a substrate and in a local area, the first conductive line extending along a first lateral direction in a position apart by an insulation distance from a closed curve defining the local area; and
a second conductive line parallel to the first conductive line along the first lateral direction outside the local area, the second conductive line facing the first conductive line with the insulation distance between the first conductive line and the second conductive line, the insulation distance in a second lateral direction that is perpendicular to the first lateral direction,
wherein the second conductive line includes,
a linear line portion having a first sidewall extending in a straight line along the closed curve, and
a first bulging end portion and a second bulging end portion protruding in the first lateral direction in opposite directions to each other from the linear line portion,
wherein at least one of the first bulging end portion or the second bulging end portion has a second sidewall extending in a curve along the closed curve, protrudes from the linear line portion toward an end portion of the first conductive line in the second lateral direction, and protrudes further than the end portion of the first conductive line to the outside of the local area in the first lateral direction,
the insulation distance is constant, and
an endmost edge of at least one of the first bulging end portion and the second bulging end portion in the first lateral direction that is linear in the second lateral direction is flush with an endmost edge of the closed curve in the first lateral direction that is linear in the second lateral direction.

18. The integrated circuit device of claim 17, wherein the first bulging end portion and the second bulging end portion have a same planar shape and are mutually point-symmetric with respect to one point on the second conductive line.

19. The integrated circuit device of claim 18, wherein the first bulging end portion and the second bulging end portion have different planar shapes.

* * * * *